United States Patent
Seo et al.

(10) Patent No.: US 11,024,365 B1
(45) Date of Patent: Jun. 1, 2021

(54) TIME INTERLEAVED SAMPLING OF SENSE AMPLIFIER CIRCUITS, MEMORY DEVICES AND METHODS OF OPERATING MEMORY DEVICES

(71) Applicant: Samsung Electronics Co., Ltd., Suwon-si (KR)

(72) Inventors: Younghun Seo, Hwaseong-si (KR); Bokyeon Won, Namyangju-si (KR); Dongil Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/782,365

(22) Filed: Feb. 5, 2020

(51) Int. Cl.
G11C 7/00 (2006.01)
*G11C 11/4091* (2006.01)
*G11C 11/4076* (2006.01)
*G11C 11/4094* (2006.01)

(52) U.S. Cl.
CPC ...... *G11C 11/4091* (2013.01); *G11C 11/4076* (2013.01); *G11C 11/4094* (2013.01)

(58) Field of Classification Search
CPC ......... G11C 7/12; G11C 11/4094; G11C 7/22; G11C 7/1048; G11C 11/415
USPC ........................................ 365/203, 207, 206
See application file for complete search history.

(56) References Cited

U.S. PATENT DOCUMENTS

| | | | |
|---|---|---|---|
| 5,684,736 A | 11/1997 | Chan | |
| 6,005,799 A | 12/1999 | Rao | |
| 6,373,766 B1 | 4/2002 | Birk | |
| 6,819,600 B2 | 11/2004 | Sim | |
| 7,002,864 B2 * | 2/2006 | Kim | G11C 11/406 365/205 |
| 7,106,626 B2 | 9/2006 | Goldman et al. | |
| 7,567,452 B2 | 7/2009 | Song et al. | |
| 8,050,073 B2 | 11/2011 | Lee | |
| 8,773,925 B2 | 7/2014 | Koya et al. | |
| 9,202,531 B2 | 12/2015 | Seo | |
| 9,478,277 B1 | 10/2016 | Liu | |
| 9,704,571 B2 | 7/2017 | Kim et al. | |
| 9,767,887 B2 | 9/2017 | Son et al. | |
| 2008/0043546 A1 | 2/2008 | Barth et al. | |
| 2011/0304382 A1 | 12/2011 | Kajigaya | |
| 2018/0182449 A1 | 6/2018 | Kim et al. | |

* cited by examiner

*Primary Examiner* — Son T Dinh

(74) *Attorney, Agent, or Firm* — Myers Bigel, P.A.

(57) ABSTRACT

Provided are a time interleaved sampling sense amplifier and a memory device including the same. The sense amplifier senses a voltage stored in the memory cell as 1-bit data or a most significant bit (MSB) and a least significant bit (LSB) of 2-bit data and latches the same to a sensing bit line and a complementary sensing bit line. The sense amplifier includes a first sense amplifier that samples a voltage change of a first bit line when the odd equalizing signal is disabled and a second sense amplifier that samples a voltage change of a second bit line when the even equalizing signal is disabled. The first sense amplifier and the second sense amplifier are alternately arranged, and the odd equalizing signal and the even equalizing signal are disabled with a certain time difference.

20 Claims, 35 Drawing Sheets

TIME INTERLEAVED SAMPLING OF SENSE AMPLIFIER CIRCUITS, MEMORY DEVICES AND METHODS OF OPERATING MEMORY DEVICES

BACKGROUND

The inventive concept relates to a semiconductor memory device and, more particularly, to a sense amplifier for sensing a cell voltage stored in a memory cell with zero or negligible coupling noise between adjacent bit lines, and a memory device including the sense amplifier.

A dynamic random-access memory (DRAM) operates as data is written and read by charges stored in a cell capacitor of a memory cell. In a DRAM, a memory cell array is connected to bit lines and complementary bit lines. When a read operation or a refresh operation is performed, a sense amplifier senses and amplifies a voltage difference between a bit line and a complementary bit line. Semiconductor devices constituting the sense amplifier may have different characteristics (e.g., threshold voltages) due to factors including process variation, voltage fluctuations and temperature (PVT). As a result, offset noise of the sense amplifier may be induced. Coupling noise can also occur due to coupling between adjacent bit lines. Offset noise and coupling noise may reduce a sensing margin of a sense amplifier and deteriorate the performance of a DRAM.

SUMMARY

The inventive concept provides a sense amplifier for sensing a cell voltage stored in a memory cell as single bit data or multi bit data without (or with negligible) offset noise and coupling noise and a memory device including the sense amplifier.

A sense amplifier according to embodiments of the inventive concept senses 1-bit data corresponding to a cell voltage stored in a memory cell. The sense amplifier includes a sense amplifying circuit, which is connected between a bit line and a complementary bit line. This sense amplifying circuit is configured to induce an offset voltage difference between the bit line and the complementary bit line, sample and sense a voltage change of the bit line according to first and second sensing drive signals, and adjust voltages of a sensing bit line and a complementary sensing bit line based on a sensed voltage change. An equalizing circuit is provided, which is configured to equalize the sensing bit line and the complementary sensing bit line to a pre-charge voltage in response to an equalizing signal, an even equalizing signal, and an odd equalizing signal. The sense amplifier includes a first sense amplifier that samples a voltage change of a first bit line when the odd equalizing signal is disabled and a second sense amplifier that samples a voltage change of a second bit line when the even equalizing signal is disabled. The first sense amplifier and the second sense amplifier may be alternately arranged. An odd equalizing signal and an even equalizing signal are disabled with a certain time difference therebetween.

A sense amplifier according to embodiments of the inventive concept senses a most significant bit (MSB) and a least significant bit (LSB) of 2-bit data corresponding to a cell voltage stored in a memory cell. The sense amplifier includes a first sense amplifying circuit, which is connected between a bit line and a complementary bit line and is configured to sense a voltage change of the bit line according to first and second sensing drive signals, senses the LSB by sampling voltages of a first sensing bit line and a first complementary sensing bit line, and latches the LSB to the first sensing bit line. The sense amplifier also includes a second sense amplifying circuit, which is selectively connected between the first sensing bit line and the first complementary sensing bit line and is configured to sense a voltage change of a first sensing bit line pair (the first sensing bit line and the first complementary sensing bit line) according to third and fourth sensing drive signals, sense the MSB based on a detected voltage change, and latch the MSB to a second sensing bit line. An equalizing circuit is provided, which is configured to equalize the first sensing bit line and the first complementary sensing bit line to a pre-charge voltage in response to an equalizing signal, an even equalizing signal, and an odd equalizing signal. The sense amplifier includes a first sense amplifier that samples voltage changes of the first sensing bit line and the first complementary sensing bit line that are connected to a first bit line when the odd equalizing signal is disabled and a second sense amplifier that samples voltage changes of the first sensing bit line and the first complementary bit line that are connected to a second bit line when the even equalizing signal is disabled, the first sense amplifier and the second sense amplifier are alternately arranged, and the odd equalizing signal and the even equalizing signal are disabled with a certain time difference therebetween.

A memory device according to additional embodiments of the inventive concept includes first and second memory cell blocks comprising a plurality of memory cells configured to store cell voltage; a plurality of sense amplifiers, which are connected to the first and second memory cell blocks in an open bit line structure, are connected to a bit line and a complementary bit line, induce an offset voltage difference between the bit line and the complementary bit line, and are configured to sample and sense a voltage change of the bit line and adjust voltages of a sensing bit line and a complementary bit line based on a sensed voltage change. A plurality of equalizing circuits are provided, which are respectively connected to the sense amplifiers and are configured to equalize the sensing bit line and the complementary sensing bit line to a pre-charge voltage in response to an equalizing signal, an even equalizing signal, and an odd equalizing signal. The sense amplifiers include a first sense amplifier that samples a voltage change of a first bit line when the odd equalizing signal is disabled and a second sense amplifier that samples a voltage change of a second bit line when the even equalizing signal is disabled. The first sense amplifier and the second sense amplifier are alternately arranged. An odd equalizing signal and an even equalizing signal are disabled with a certain time difference therebetween.

A memory device according to further embodiments of the inventive concept includes a first sense amplifier, which is connected to a first bit line and is configured to sense a voltage of the first bit line and output the voltage to a first sensing bit line when an odd equalizing signal is disabled, and a second sense amplifier, which is connected to a second bit line arranged adjacent to the first bit line and is configured to sense a voltage of the second bit line and output the voltage to a second sensing bit line when an even equalizing signal is disabled. A first equalizing circuit is provided, which includes a first transistor and a second transistor connected to the first sense amplifier, wherein the first transistor includes a first active pattern and a first gate pattern connected to a conductive line of the odd equalizing signal and includes, in a source region of the first transistor of the first active pattern, a first contact pattern connected to a conductive line of the first sensing bit line and, in a drain region of the first transistor, a second contact pattern connected to a conductive line of a first complementary sensing bit line. A second equalizing circuit is provided, which includes a third transistor and a fourth transistor connected to the second sense amplifier, wherein the fourth transistor includes a second active pattern and a second gate pattern connected to a conductive line of the even equalizing signal and includes, in a source region of the fourth transistor of the second active pattern, a third contact pattern connected to a conductive line of the second sensing bit line and, in a drain region of the fourth transistor, a fourth contact pattern connected to a conductive line of a second complementary sensing bit line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
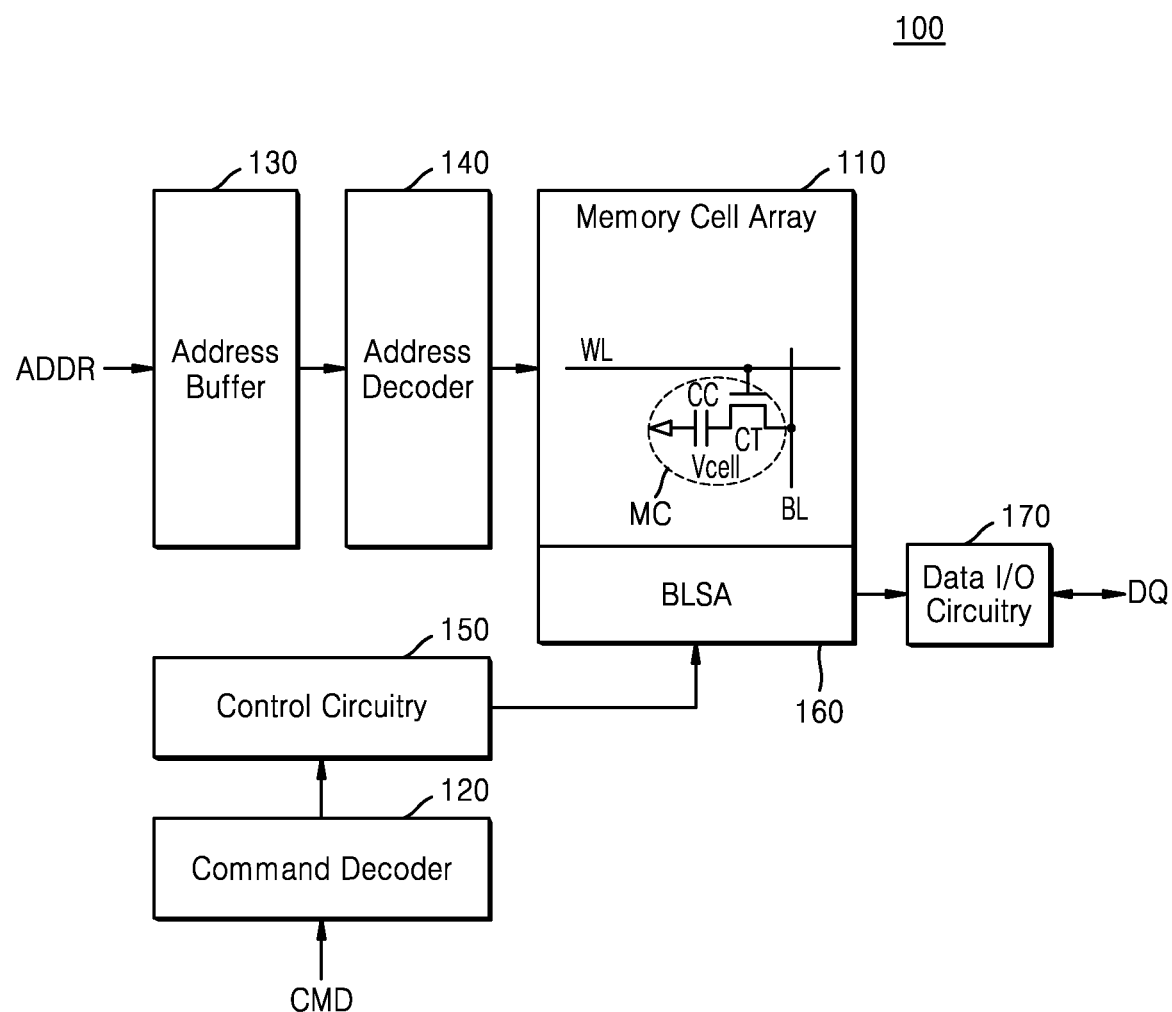
FIG. 1 is a diagram for describing the concept of a memory device according to embodiments of the inventive concept.

FIG. 1 is a diagram for describing the concept of a memory device according to embodiments of the inventive concept. Referring to FIG. 1, a memory device 100 may be implemented as a DRAM for sensing a cell voltage Vcell stored in a memory cell MC as single bit data or multi bit data. For example, the memory device 100 may be implemented as a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3. SDRAM, a DDR4 SDRAM, etc.

The memory device 100 may input/output data DQ in response to a command CMD and an address ADDR received from an external device, e.g., a central processing unit (CPU) or a memory controller. The memory device 100 may include a memory cell array 110, a command decoder 120, an address buffer 130, an address decoder 140, a control circuit 150, a sense amplifier 160, and a data input/output circuit 170.

The memory cell array 110 includes a plurality of memory cells MC provided in the form of a 2-dimensional matrix arranged in rows and columns. The memory cell array 110 includes a plurality of word lines WL and a plurality of bit lines BL connected to the memory cells MC. Each of the memory cells MC includes a cell transistor CT and a cell capacitor CC. A gate of the cell transistor CT is connected to one of the word lines WL arranged in the row direction of the memory cell array 110. A first end of the cell transistor CT is connected to one of the bit lines BL arranged in the column direction of the memory cell array 110. A second end of the cell transistor CT is connected to the cell capacitor CC. The cell capacitor CC may store charges of an amount corresponding to single bit data or multi bit data. Also, the cell capacitor CC may be restored to a charge amount corresponding to an amount of each of the single bit data and the multi bit data, that is, the cell voltage Vcell.

A memory cell MC may store the cell voltage Vcell having a magnitude specifying 1-bit data in the cell capacitor CC. Alternatively, the memory cell MC may store the cell voltage Vcell having a magnitude specifying 2-bit data in the cell capacitor CC. In this case, the cell voltage Vcell may be represented by 2-bit data including a most significant bit (MSB) and a least significant bit (LSB). In some embodiments, the memory cell MC may store multi-bit data of n or more bits, where n is a number greater than 2.

The command decoder 120 may determine an input command CMD by referring to control signals applied from an external device. The command decoder 120 may be configured to perform internal operations corresponding to the command CMD. The command CMD may include an active command, read command, a write command, a precharge command, etc.

The address buffer 130 receives an address ADDR applied by an external device. The address ADDR includes a row address addressing a row of the memory cell array 110 and a column address addressing a column of the memory cell array 110. The address buffer 130 may transmit the row address and the column address to the address decoder 140.

The address decoder 140 may include a row decoder and a column decoder for selecting a word line WL and a bit line BL of a memory cell MC to be accessed in response to the received address ADDR. The row decoder may enable a word line WL of the memory cell MC corresponding to a row address by decoding the row address. The column decoder may provide a column selection signal for selecting a bit line BL of the memory cell MC corresponding to a column address by decoding the column address.

The control circuit 150 may generate internal control signals and control the sense amplifier 160 according to the command CMD of the command decoder 120. The control circuit 150 may control the operation of the sense amplifier 160 when the sense amplifier 160 senses the cell voltage Vcell of the memory cell MC. When the sense amplifier 160 senses charges stored in the memory cell MC as 1-bit data, the control circuit 150 may control the sense amplifier 160 to perform a pre-charge operation, an offset canceling operation, a charge-sharing operation, and a pre-sensing operation sequentially. According to the operation of the sense amplifier 160, the control circuit 150 may control operations of components of the sense amplifier 160, that is, an operation of an even sense amplifying circuit BLSA_E and an operation of an odd sense amplifying circuit BSLA_O with a time difference. Hereinafter, operations of the even sense amplifying circuit BLSA_E and the odd sense amplifying circuit BLSA_O performed with a time difference will be referred to as a time interleaved sampling operation.

When the sense amplifier 160 senses charges stored in the memory cell MC as 2-bit data including an MSB and an LSB, the control circuit 150 may control the sense amplifier 160 to perform a pre-charge operation, an offset canceling operation, an MSB sensing operation, an LSB sensing operation, and a restore operation sequentially. According to the operation of the sense amplifier 160, the control circuit 150 may control the components of the sense amplifier 160, that is, an even sense amplifying circuit BLSA_E_11 and an odd sense amplifying circuit BSLA_O_11 to perform a time interleaved sampling operation.

The sense amplifier 160 may sense charges stored in the memory cell MC as 1-bit data or 2-bit data and transmit sensed 1-bit data or 2-bit data to the data input/output circuit 170 to output the sensed 1-bit data or 2-bit data to the outside through data DQ pad(s).

The data input/output circuit 170 may receive data DQ to be written to the memory cells MC from the outside and transmit the data DQ to the memory cell array 110. The data input/output circuit 170 may output 1-bit data or 2-bit data sensed by the sense amplifier 160 to the outside through the data DQ pad(s) as read data. Hereinafter, configurations and operations of the sense amplifier 160 will be described in detail with reference to various embodiments.

Figure 2:
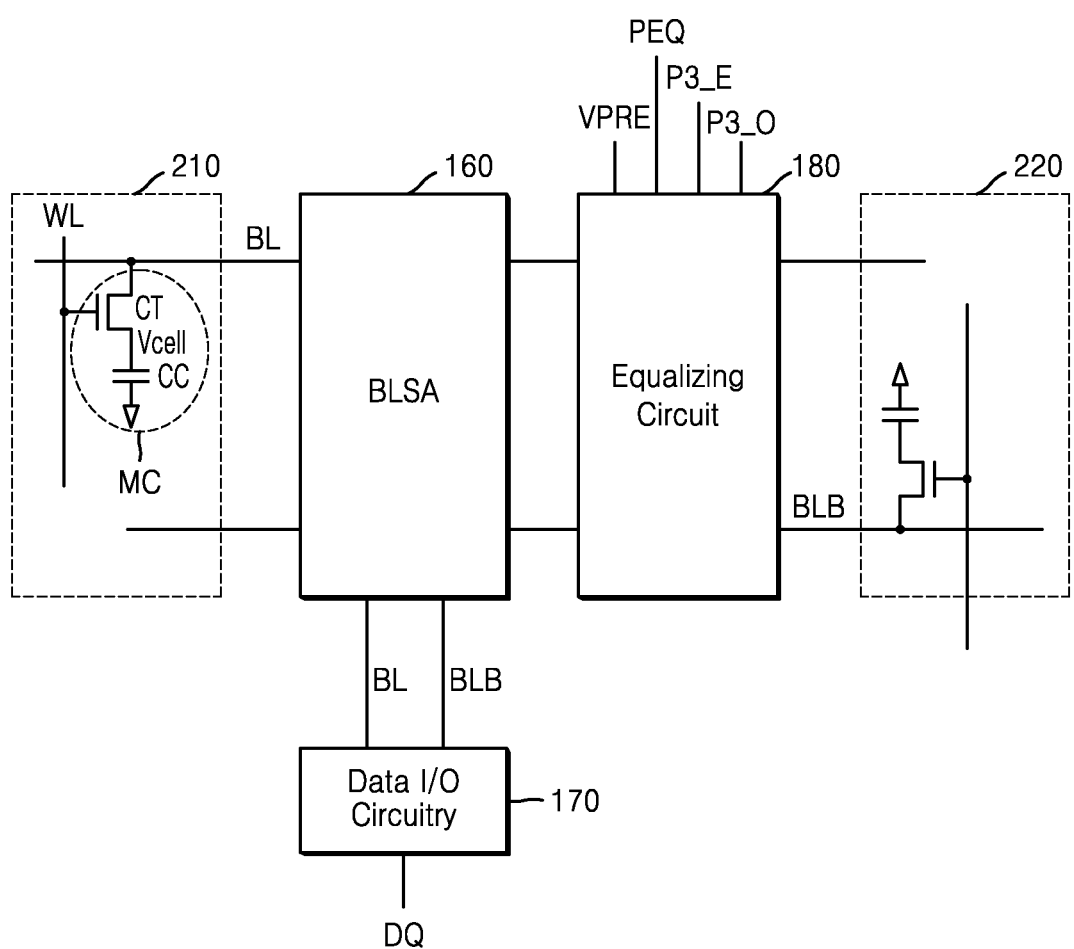
FIG. 2 is a diagram for describing a memory cell of FIG. 1 and a sense amplifier having an open bit line structure.

FIG. 2 is a diagram for describing a memory cell of FIG. 1 and a sense amplifier having an open bit line structure. Referring to FIG. 2, the sense amplifier 160 may be connected to the memory cell MC and an equalizing circuit 180 through a bit line pair BL and BLB. The equalizing circuit 180 may equalize a sensing bit line pair SBL and SBLB connected to an even bit line pair BLe and BLBe (FIG. 7) and a sensing bit line pair SBL and SBLB connected to an odd bit line pair BLo and BLBo (FIG. 7) to a pre-charge voltage VPRE in response to an equalizing signal PEQ, an even equalizing signal P3_E, and an odd equalizing signal P3_O.

The precharging/equalizing signal PEQ, the even equalizing signal P3_E, and the odd equalizing signal P3_O may be provided from the control circuit 150. The equalizing signal PEQ may be configured to equalize both the sensing bit line pair SBL and SBLB connected to the even bit line pair BLe and BLBe and the sensing bit line pair SBL and SBLB connected to the odd bit line pair BLo and BLBo to the pre-charge voltage VPRE.

The even equalizing signal P3_E may be configured to equalize the sensing bit line pair SBL and SBLB connected to the even bit line pair BLe and BLBe to the pre-charge voltage VPRE before a sensing operation for the even bit line pair BLe and BLBe is performed. When the even equalizing signal P3_E is enabled, the sensing bit line pair SBL and SBLB connected to the even bit line pair BLe and BLBe may be equalized to the pre-charge voltage VPRE level. When the even equalizing signal P3_E is disabled, the sensing bit line pair SBL and SBLB connected to even bit line pair BLe and BLBe may be sensed by the sense amplifier 160.

The odd equalizing signal P3_O may be configured to equalize the sensing bit line pair SBL and SBLB connected to the odd bit line pair BLo and BLBo to the pre-charge voltage VPRE before a sensing operation for the odd bit line pair BLo and BLBo is performed. When the odd equalizing signal P3_O is enabled, the sensing bit line pair SBL and SBLB connected to the odd bit line pair BLo and BLBo may be equalized to the pre-charge voltage VPRE level. When the odd equalizing signal P3_O is disabled, the sensing bit line pair SBL and SBLB connected to odd bit line pair BLo and BLBo may be sensed by the sense amplifier 160.

The pre-charge voltage VPRE may be set to a level corresponding to half of the level of a power voltage VINTA for driving the sense amplifier 160. For example, when the power voltage VINTA is 1.0 V, the pre-charge voltage VPRE may be set to about 0.5 V.

The sense amplifier 160 has an open bit line structure and is connected to the memory cell MC. The open bit line structure is a structure in which bit lines of the bit line pair BL and BLB are separately located in different memory cell blocks 210 and 220 adjacent to each other. In the open bit line structure, when a word line WL of a selected memory cell MC is enabled, data of the memory cell MC may be read or written through a selected bit line BL. At this time, while data of the memory cell MC is accessed through the selected bit line BL, there is no selected memory cell for a complementary bit line BLB, the pre-charge voltage VPRE level may be maintained as a reference voltage level. Accordingly, the sense amplifier 160 may sense the cell voltage Vcell of the memory cell MC by using charges that are charge-shared through the selected bit line BL.

The sense amplifier 160 may sense 1-bit data corresponding to the cell voltage Vcell stored in the memory cell MC. Alternatively, the sense amplifier 160 may sense an MSB and an LSB of 2-bit data corresponding to the cell voltage Vcell stored in the memory cell (MC). The sense amplifier 160 may be connected between the bit line BL and the complementary bit line BLB and induces an offset voltage difference between the bit line BL and the complementary bit line BLB to cancel offset noise. The sense amplifier 160 may include a sense amplifying circuit configured to sample and sense a voltage change of the bit line BL according to first and second sensing drive signals and adjust the voltages of a sensing bit line and a complementary sensing bit line based on a sensed voltage change.

Figure 3:
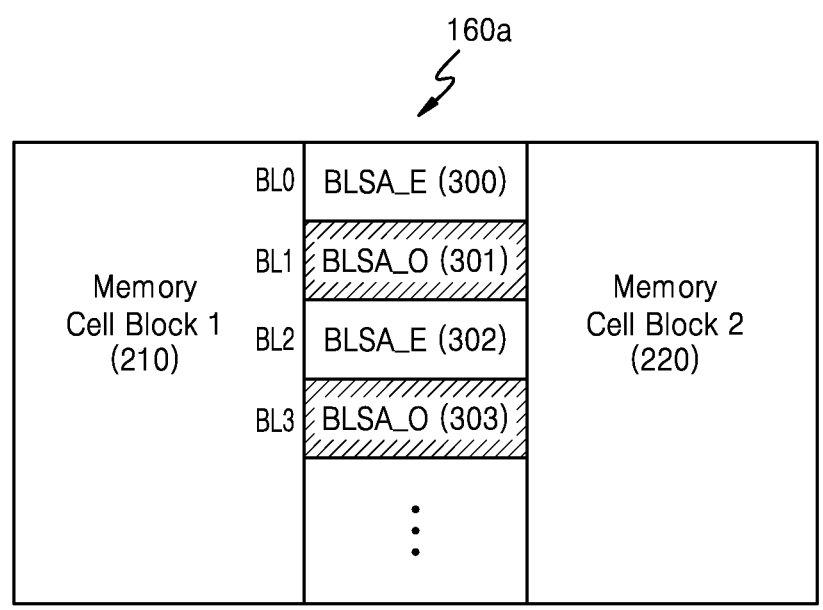
FIGS. 3 to 5 are diagrams showing an arrangement of a sense amplifier according to embodiments of the inventive concept.
Figure 4:
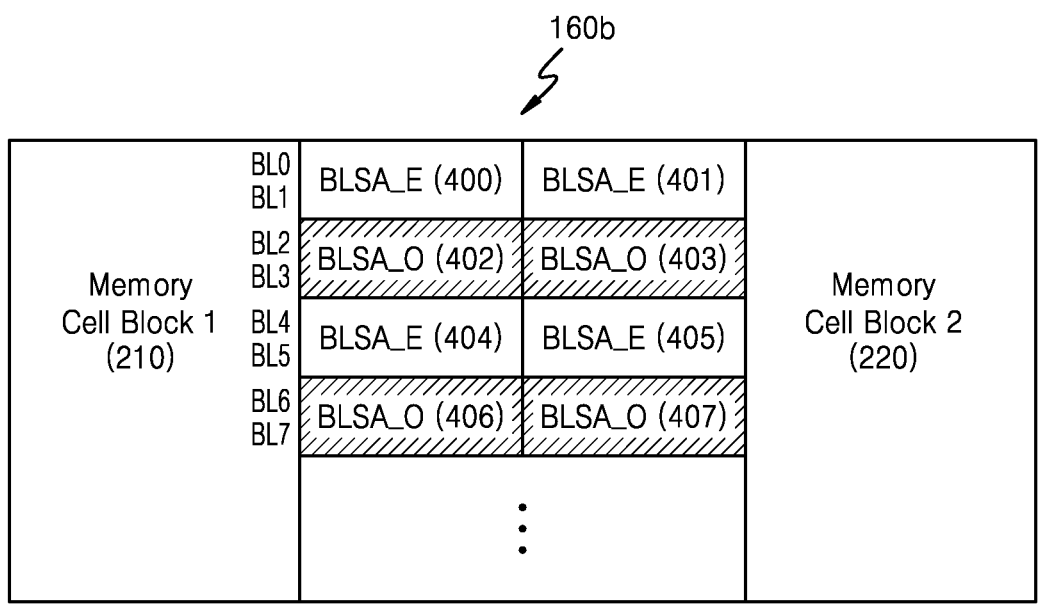
Figure 5:
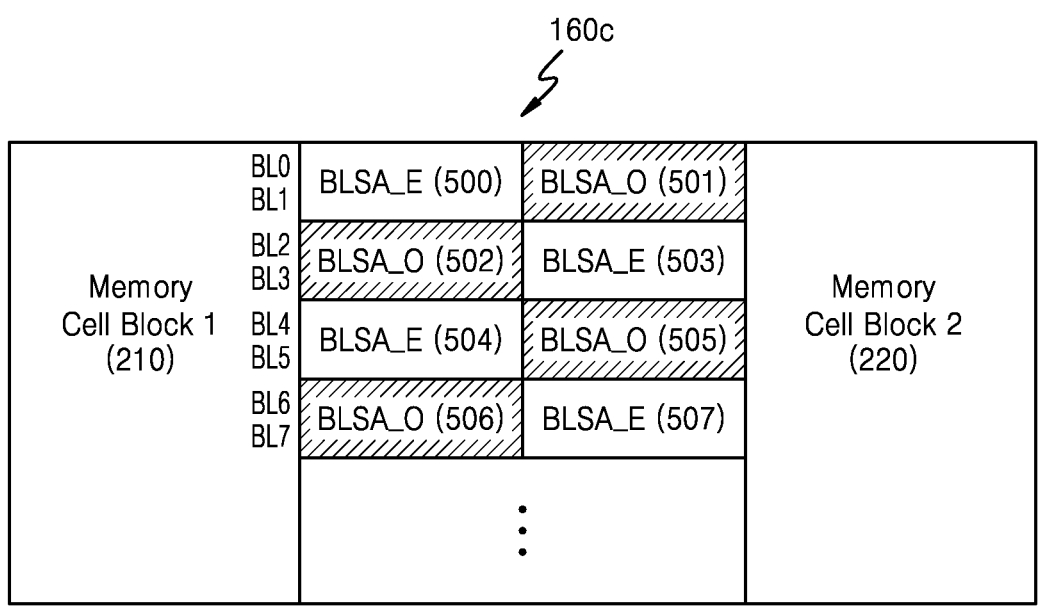

FIGS. 3 to 5 are diagrams showing an arrangement of a sense amplifier according to embodiments of the inventive concept. FIGS. 3 to 5 exemplify a sense amplifier that senses bit lines BL connected to memory cells of a first memory cell block 210 as a part of the sense amplifier 160 that senses the memory cells of the first memory cell block 210 of FIG. 2. A second memory cell block 220 may provide complementary bit lines BLB at the level of the pre-charge voltage VPRE to the sense amplifier 160.

Referring to FIG. 3, a sense amplifier 160a may include an even sense amplifier BLSA_E and an odd sense amplifier BLSA_O. Even sense amplifiers BLSA_E 300 and 302 and odd sense amplifiers BLSA_O 301 and 303 may be alternately arranged. A bit line BL0 of a first memory cell block 210 may be connected to a first even sense amplifier 300, a bit line BL1 may be connected to a first odd sense amplifier 301, a bit line BL2 may be connected to a second even sense amplifier 302, and a bit line BL3 may be connected to a second odd sense amplifier 303. According to embodiments, bit lines BL0 and BL2 may be referred to as even bit lines BLe, whereas bit lines BL1 and BL3 may be referred to as odd bit lines BLo.

The even sense amplifiers BLSA_E 300 and 302 may perform sensing operations on the bit lines BL0 and BL2 in association with the even equalizing signal P3_E. The even sense amplifiers BLSA_E 300 and 302 may sense the bit lines BL0 and BL2 when the even equalizing signal P3_E is switched from an enabled state to a disabled state.

The odd sense amplifiers BLSA_O 301 and 303 may perform sensing operations on the bit lines BL1 and BL3 in association with the one equalizing signal P3_O. The odd sense amplifiers BLSA_O 301 and 303 may sense the bit lines BL1 and BL3 when the odd equalizing signal P3_O is switched from an enabled state to a disabled state.

A time point at which the even equalizing signal P3_E is switched from the enabled state to the disabled state and a time point at which the odd equalizing signal P3_O is switched from the enabled state to the disabled state may be set differently. In other words, the even equalizing signal P3_E and the odd equalizing signal P3_O may be disabled with a certain time difference therebetween.

For example, when the even equalizing signal P3_E is first disabled and the odd equalizing signal P3_O is disabled later, the sensing operations of the even sense amplifiers BLSA_E 300 and 302 occur first, and the sensing operations of the odd sense amplifiers BLSA_O 301 and 303 occur later. A sampling operation (FIG. 9), which is the initial stage of sensing operations of the even sense amplifiers BLSA_E 300 and 302 for the bit lines BL0 and BL2, is not coupling-influenced by the bit lines BL1 and BL3, because the bit lines BL1 and BL3 adjacent thereto are captured at the level of the pre-charge voltage VPRE due to the odd equalizing signal P3_O. Accordingly, the sampling operation of the even sense amplifiers BLSA_E 300 and 302 for the bit lines BL0 and BL2 may be performed without (or with negligible) coupling noise.

Conversely, when the odd equalizing signal P3_O is first disabled and the even equalizing signal P3_E is disabled later, the sensing operations of the odd sense amplifiers BLSA_O 301 and 303 occur first, and the sensing operations of the even sense amplifiers BLSA_E 300 and 302 occur later. A sampling operation (FIG. 10), which is the initial stage of sensing operations of the odd sense amplifiers BLSA_O 301 and 303 for the bit lines BL1 and BL3, is not coupling-influenced by the bit lines BL0 and BL2, because the bit lines BL0 and BL2 adjacent thereto are captured at the level of the pre-charge voltage VPRE due to the even equalizing signal P3_E. Accordingly, the sampling operation of the odd sense amplifiers BLSA_O 301 and 303 for the bit lines BL1 and BL3 may be performed without (or with negligible) coupling noise.

Referring to FIG. 4, a sense amplifier 160*b* may be configured, such that the even sense amplifier BLSA_E is arranged at one side of the even sense amplifier BLSA_E and the odd sense amplifier BLSA_O is arranged at one side of the odd sense amplifier BLSA_O. A pair of the even sense amplifiers BLSA_E or a pair of the odd sense amplifiers BLSA_O may be arranged. Pairs of even sense amplifiers BLSA_E 400 and 401 and 404 and 405 and pairs of odd sense amplifiers BLSA_O 402 and 403 and 406 and 407 may be alternately arranged. A bit line BL0 of the first memory cell block 210 may be connected to a first even sense amplifier 400, a bit line BL1 may be connected to a second even sense amplifier 401, a bit line BL2 may be connected to a first odd sense amplifier 402, a bit line BL3 may be connected to a second odd sense amplifier 403, a bit line BL4 may be connected to a third even sense amplifier 404, a bit line BL5 may be connected to a fourth even sense amplifier 405, a bit line BL6 may be connected to a third odd sense amplifier 406, and a bit line BL7 may be connected to a fourth odd sense amplifier 407.

The even sense amplifiers BLSA_E 400, 401, 404, and 405 may perform sensing operations on bit lines BL0, BL1, BL4, and BL5 in association with the even equalizing signal P3_E. The even sense amplifiers BLSA_E 400, 401, 404, and 405 may sense the bit lines BL0, BL1, BL4, and BL5 when the even equalizing signal P3_E is switched from the enabled state to the disabled state.

The odd sense amplifiers BLSA_O 402, 403, 406, and 407 may perform sensing operations on bit lines BL2, BL3, BL6, and BL7 in association with the odd equalizing signal P3_O. The odd sense amplifiers BLSA_E 402, 403, 406, and 407 may sense the bit lines BL2, BL3, BL6, and BL7 when the odd equalizing signal P3_O is switched from the enabled state to the disabled state.

A time point at which the even equalizing signal P3_E is switched from the enabled state to the disabled state and a time point at which the odd equalizing signal P3_O is switched from the enabled state to the disabled state may be set differently. In other words, the even equalizing signal P3_E and the odd equalizing signal P3_O may be disabled with a certain time difference therebetween.

For example, when the even equalizing signal P3_E is first disabled and the odd equalizing signal P3_O is disabled later, the sensing operations of the even sense amplifiers BLSA_E 400, 401, 404, and 405 occur first, and the sensing operations of the odd sense amplifiers BLSA_O 402, 403, 406, and 407 occur later. Sampling operations of the even sense amplifiers BLSA_E 400, 401, 404, and 405 for the bit lines BL0, BL1, BL4, and BL5 are not materially coupling-influenced by the bit lines BL2, BL3, BL6, and BL7, because the bit lines BL2, BL3, BL6, and BL7 adjacent thereto are captured at the level of the pre-charge voltage VPRE due to the odd equalizing signal P3_O. Accordingly, the sampling operation of the even sense amplifiers BLSA_E 400, 401, 404, and 405 for the bit lines BL0, BL1, BL4, and BL5 may be performed without (or with negligible) coupling noise.

Conversely, when the odd equalizing signal P3_O is first disabled and the even equalizing signal P3_E is disabled later, the sensing operations of the odd sense amplifiers BLSA_O 402, 403, 406, and 407 occur first, and the sensing operations of the even sense amplifiers BLSA_E 400, 401, 404, and 405 occur later. Sampling operations of the odd sense amplifiers BLSA_O 402, 403, 406, and 407 for the bit lines BL2, BL3, BL6, and BL7 are not materially coupling-influenced by the bit lines BL0, BL1, BL4, and BL5, because the bit lines BL0, BL1, BL4, and BL5 adjacent thereto are captured at the level of the pre-charge voltage VPRE due to the even equalizing signal P3_E. Accordingly, the sampling operation of the odd sense amplifiers BLSA_O 402, 403, 406, and 407 for the bit lines BL2, BL3, BL6, and BL7 may be performed without (or with negligible) coupling noise.

Referring to FIG. 5, a sense amplifier 160*c* may be configured, such that the odd sense amplifier BLSA_O is arranged at one side of the even sense amplifier BLSA_E and the even sense amplifier BLSA_E is arranged at one side of the odd sense amplifier BLSA_O. The even sense amplifier BLSA_E and the odd sense amplifier BLSA_O may be arranged in pair. Pairs of even and odd sense amplifiers BLSA_E and BLSA_O 500 and 501 and 504 and 505 and pairs of odd and even sense amplifiers BLSA_O and BLSA_E 502 and 503 and 506 and 507 may be alternately arranged. The bit line BL0 of the first memory cell block 210 may be connected to a first even sense amplifier 500, the bit line BL1 may be connected to a first odd sense amplifier 501, the bit line BL2 may be connected to a second odd sense amplifier 502, the bit line BL3 may be connected to a second even sense amplifier 503, the bit line BL4 may be connected to a third even sense amplifier 504, the bit line BL5 may be connected to a third odd sense amplifier 505, the bit line BL6 may be connected to a fourth odd sense amplifier 506, and the bit line BL7 may be connected to a fourth even sense amplifier 507.

Even sense amplifiers BLSA_E 500, 503, 504, and 507 may perform sensing operations for bit lines BL0, BL3, BL4, and BL7 in association with the even equalizing signal P3_E. The even sense amplifiers BLSA_E 500, 503, 504, and 507 may sense the bit lines BL0, BL3, BL4, and BL7 when the even equalizing signal P3_E is switched from the enabled state to the disabled state.

Odd sense amplifiers BLSA_O 501, 502, 505, and 506 may perform sensing operations on bit lines BL1, BL2, BL5, and BL6 in association with the odd equalizing signal P3_O. The odd sense amplifiers BLSA_O 501, 502, 505, and 506 may sense the bit lines BL1, BL2, BL5, and BL6 when the odd equalizing signal P3_O is switched from the enabled state to the disabled state.

A time point at which the even equalizing signal P3_E is switched from the enabled state to the disabled state and a time point at which the odd equalizing signal P3_O is switched from the enabled state to the disabled state may be set differently. In other words, the even equalizing signal P3_E and the odd equalizing signal P3_O may be disabled with a certain time difference therebetween.

For example, when the even equalizing signal P3_E is first disabled and the odd equalizing signal P3_O is disabled later, the sensing operations of the even sense amplifiers BLSA_E 500, 503, 504, and 507 occur first, and the sensing operations of the odd sense amplifiers BLSA_O 501, 502, 505, and 506 occur later. Sampling operations of the even sense amplifiers BLSA_E 500, 503, 504, and 507 for the bit lines BL0, BL3, BL4, and BL7 are not materially coupling-influenced by the bit lines BL1, BL2, BL5, and BL6, because the bit lines BL1, BL2, BL5, and BL6 adjacent thereto are captured at the level of the pre-charge voltage VPRE due to the odd equalizing signal P3_O. Accordingly, the sampling operation of the even sense amplifiers BLSA_E 500, 503, 504, and 507 for the bit lines BL0, BL3, BL4, and BL7 may be performed without (or with negligible) coupling noise.

Conversely, when the odd equalizing signal P3_O is first disabled and the even equalizing signal P3_E is disabled later, the sensing operations of the odd sense amplifiers BLSA_O 501, 502, 505, and 506 occur first, and the sensing operations of the even sense amplifiers BLSA_E 500, 503, 504, and 507 occur later. Sampling operations of the odd sense amplifiers BLSA_O 501, 502, 505, and 506 for the bit lines BL1, BL2, BL5, and BL6 are not materially coupling-influenced by the bit lines BL0, BL3, BL4, and BL7, because the bit lines BL0, BL3, BL4, and BL7 adjacent thereto are captured at the level of the pre-charge voltage VPRE due to the even equalizing signal P3_E. Accordingly, the sampling operation of the odd sense amplifiers BLSA_O 501, 502, 505, and 506 for the bit lines BL1, BL2, BL5, and BL6 may be performed without (or with negligible) coupling noise.

Figure 6A:
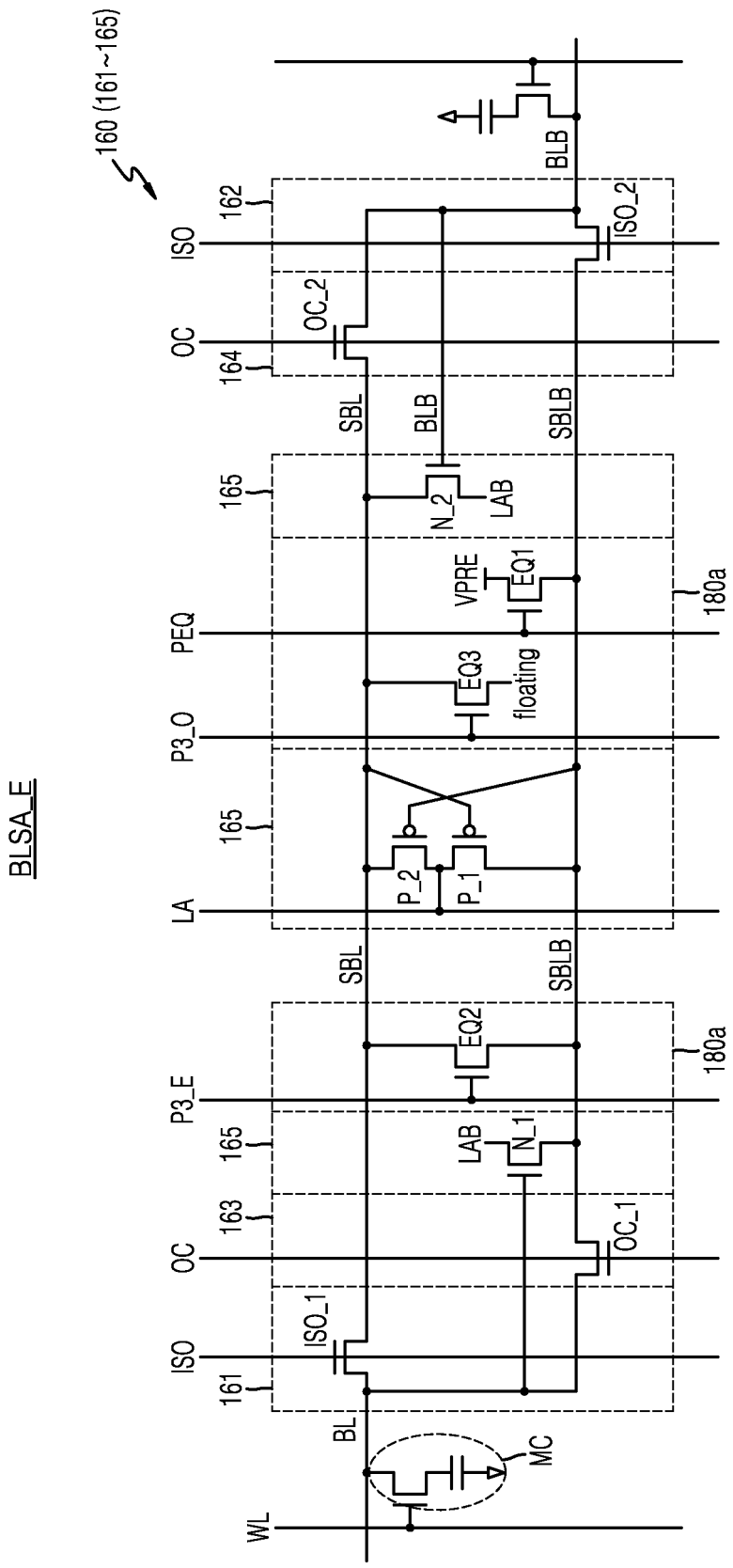
FIGS. 6A and 6B are circuit diagrams for describing an even sense amplifier and an odd sense amplifier included in a sense amplifier for sensing a memory cell voltage as single bit data according to an embodiment of the inventive concept.
Figure 6B:
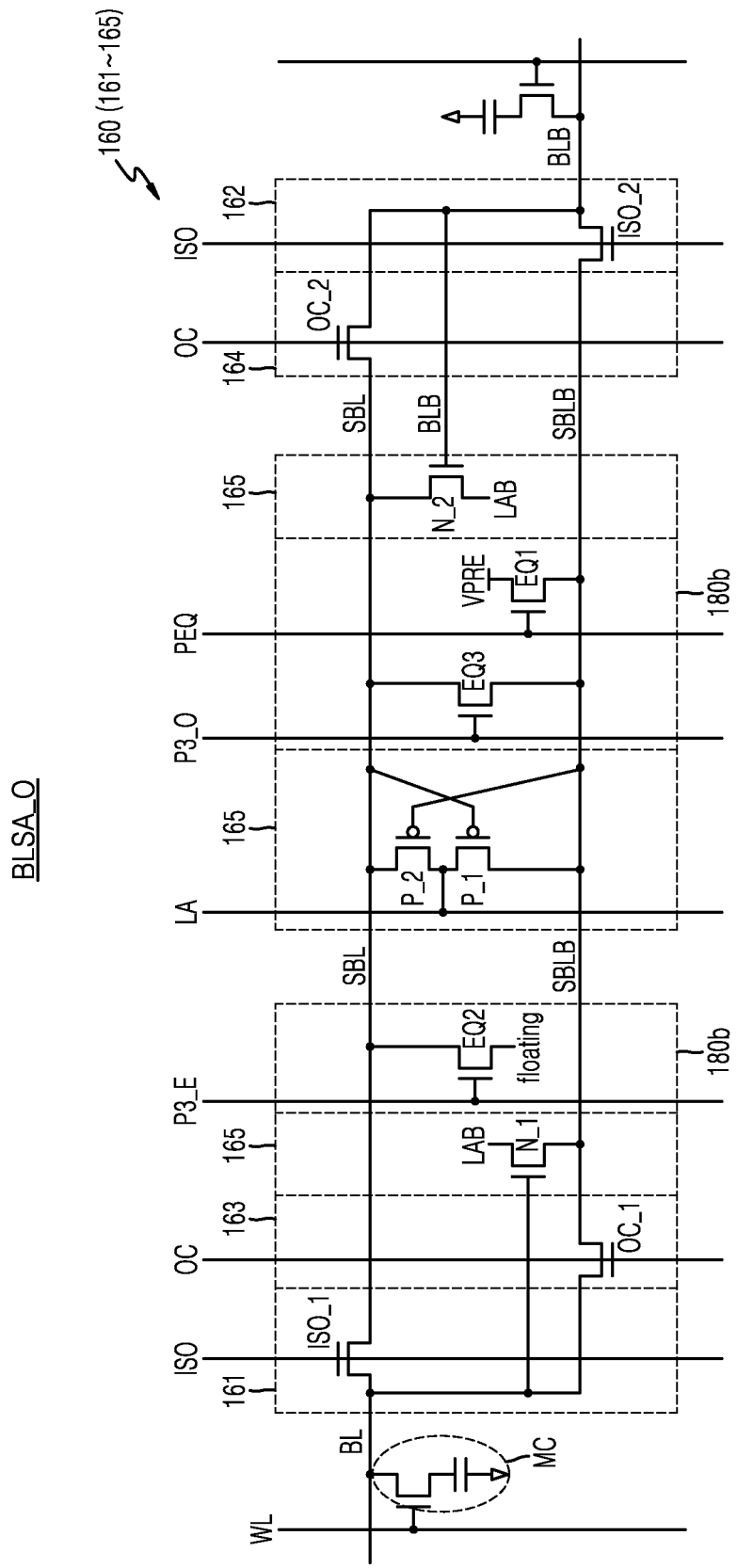

FIGS. 6A and 6B are circuit diagrams for describing the even sense amplifier BLSA_E and the odd sense amplifier BLSA_O included in the sense amplifier 160 for sensing a memory cell voltage as single bit data according to an embodiment of the inventive concept. In FIGS. 6A and 6B, the even sense amplifier BLSA_E, the odd sense amplifier BLSA_O, and equalizing circuits 180*a* and 180*b* indicate that components of the sense amplifier 160 may be functionally and logically separated from one another, and the components need not to be physical components separate from one another.

The even sense amplifier BLSA_E of FIG. 6A and the odd sense amplifier BLSA_O of FIG. 6B may each include first and second isolation units 161 and 162, first and second offset cancelers 163 and 164, and a sense amplifying circuit 165.

In FIGS. 6A and 6B, a first isolation unit 161 may be connected between the bit line BL and a sensing bit line SBL, and a second isolation unit 162 may be connected between the complementary bit line BLB and a complementary sensing bit line SBLB. The first isolation unit 161 and the second isolation unit 162 operate in response to an isolation signal ISO. The first isolation unit 161 may include a first isolation transistor ISO_1 that connects or disconnects between the bit line BL and the sensing bit line SBL in response to the isolation signal ISO. A first end of the first isolation transistor ISO_1 is connected to the bit line BL, a second end of the first isolation transistor ISO_1 is connected to the sensing bit line SBL, and a gate of the first isolation transistor ISO_1 is responsive to the isolation signal ISO.

The second isolation unit 162 may include a second isolation transistor ISO_2 that connects or disconnects between the complementary bit line BLB and the complementary sensing bit line SBLB in response to the isolation signal ISO. A first end of the second isolation transistor ISO_2 is connected to the complementary bit line BLB, a second end of the second isolation transistor ISO_2 is connected to the complementary sensing bit line SBLB, and a gate of the second isolation transistor ISO_2 is responsive to the isolation signal ISO.

A first offset canceler 163 may be connected between the bit line BL and the complementary sensing bit line SBLB, and a second offset canceler 164 may be connected between the complementary bit line BLB and the sensing bit line SBL. The first offset canceler 163 and the second offset canceler 164 operate in response to an offset cancelation signal OC. The first offset canceler 163 may include a first offset cancelation transistor OC_1 that connects or disconnects between the bit line BL and the complementary sensing bit line SBLB in response to the offset cancelation signal OC. A first end of the first offset cancelation transistor OC_1 is connected to the bit line BL, a second end of the first offset cancelation transistor OC_1 is connected to the complementary sensing bit line SBLB, and a gate of the first offset cancelation transistor OC_1 is connected to the offset cancelation signal OC.

The second offset canceler 164 may include a second offset cancelation transistor OC_2 that connects or disconnects between the complementary bit line BLB and the sensing bit line SBL in response to the offset cancelation signal OC. A first end of the second offset cancelation transistor OC_2 is connected to the complementary bit line BLB, a second end of the second offset cancelation transistor OC_2 is connected to the sensing bit line SBL, and a gate of the second offset cancelation transistor OC_2 is connected to the offset cancelation signal OC.

The sense amplifying circuit 165 may be connected between the sensing bit line SBL and the complementary sensing bit line SBLB and may sense and amplify a voltage difference between the bit line BL and the complementary bit line BLB according to first and second sensing drive signals LA and LAB. The sense amplifying circuit 165 may include a first PMOS transistor P_1, a second PMOS transistor P_2, a first NMOS transistor N_1, and a second NMOS transistor N_2.

A first end of the first PMOS transistor P_1 is connected to the complementary sensing bit line SBLB, a second end of the first PMOS transistor P_1 is connected to a line of a first sensing drive signal LA, and a gate of the first PMOS transistor P_1 is connected to the sensing bit line SBL. A first end of the second PMOS transistor P_2 is connected to the sensing bit line SBL, a second end of the second PMOS transistor P_2 is connected to the line of the first sensing drive signal LA, and a gate of the second PMOS transistor P_2 is connected to the complementary sensing bit line SBLB.

A first end of the first NMOS transistor N_1 is connected to the complementary sensing bit line SBLB, a second end of the first NMOS transistor N_1 is connected to a line of a second sensing drive signal LAB, and a gate of the first NMOS transistor N_1 is connected to the bit line BL. A first end of the second NMOS transistor N_2 is connected to the sensing bit line SBL, a second end of the second NMOS transistor N_2 is connected to the line of the second sensing drive signal LAB, and a gate of the second NMOS transistor N_2 is connected to the complementary bit line BLB.

The even sense amplifier BLSA_E of FIG. 6A and the odd sense amplifier BLSA_O of FIG. 6B may be commonly connected to the equalizing circuits 180a and 180b. The equalizing circuits 180a and 180b are connected between the sensing bit line SBL and the complementary sensing bit line SBLB and, in response to the equalizing signal PEQ, the even equalizing signal P3_E, and the odd equalizing signal P3_O, may selectively equalize the sensing bit line SBL and the complementary sensing bit line SBLB. The equalizing circuit 180 may include a first equalizing transistor EQ1, a second equalizing transistor EQ2, and a third equalizing transistor EQ3.

The internal connection relationship of an equalizing circuit 180a connected to the even sense amplifier BLSA_E of FIG. 6A and the internal connection relationship of an equalizing circuit 180b connected to the odd sense amplifier BLSA_O of FIG. 6B may be implemented differently.

In both the equalizing circuit 180a connected to the even sense amplifier BLSA_E of FIG. 6A and the equalizing circuit 180b connected to the odd sense amplifier BLSA_O of FIG. 6B, a first end of the first equalizing transistor EQ1 may be connected to a line of the pre-charge voltage VPRE, a second end of the first equalizing transistor EQ1 may be connected to the complementary sensing bit line SBLB, and a gate of the first equalizing transistor EQ1 may be connected to the equalizing signal PEQ.

However, in the equalizing circuit 180a connected to the even sense amplifier BLSA_E of FIG. 6A, a first end of the second equalizing transistor EQ2 is connected to the sensing bit line SBL, a second end of the second equalizing transistor EQ2 is connected to the complementary sensing bit line SBLB, and a gate of the second equalizing transistor EQ2 is connected to the even equalizing signal P3_E. Also, a first end of the third equalizing transistor EQ3 is connected to the sensing bit line SBL, a second end of the third equalizing transistor EQ3 is floated, and a gate of the third equalizing transistor EQ3 is connected to the odd equalizing signal P3_O.

In the equalizing circuit 180b connected to the odd sense amplifier BLSA_O of FIG. 6B, the first end of the second equalizing transistor EQ2 is connected to the sensing bit line SBL, the second end of the second equalizing transistor EQ2 is floated, and the gate of the second equalizing transistor EQ2 is connected to the even equalizing signal P3_E. Also, the first end of the third equalizing transistor EQ3 is connected to the sensing bit line SBL, the second end of the third equalizing transistor EQ3 is connected to the complementary sensing bit line SBLB, and the gate of the third equalizing transistor EQ3 is connected to the odd equalizing signal P3_O.

Figure 7:
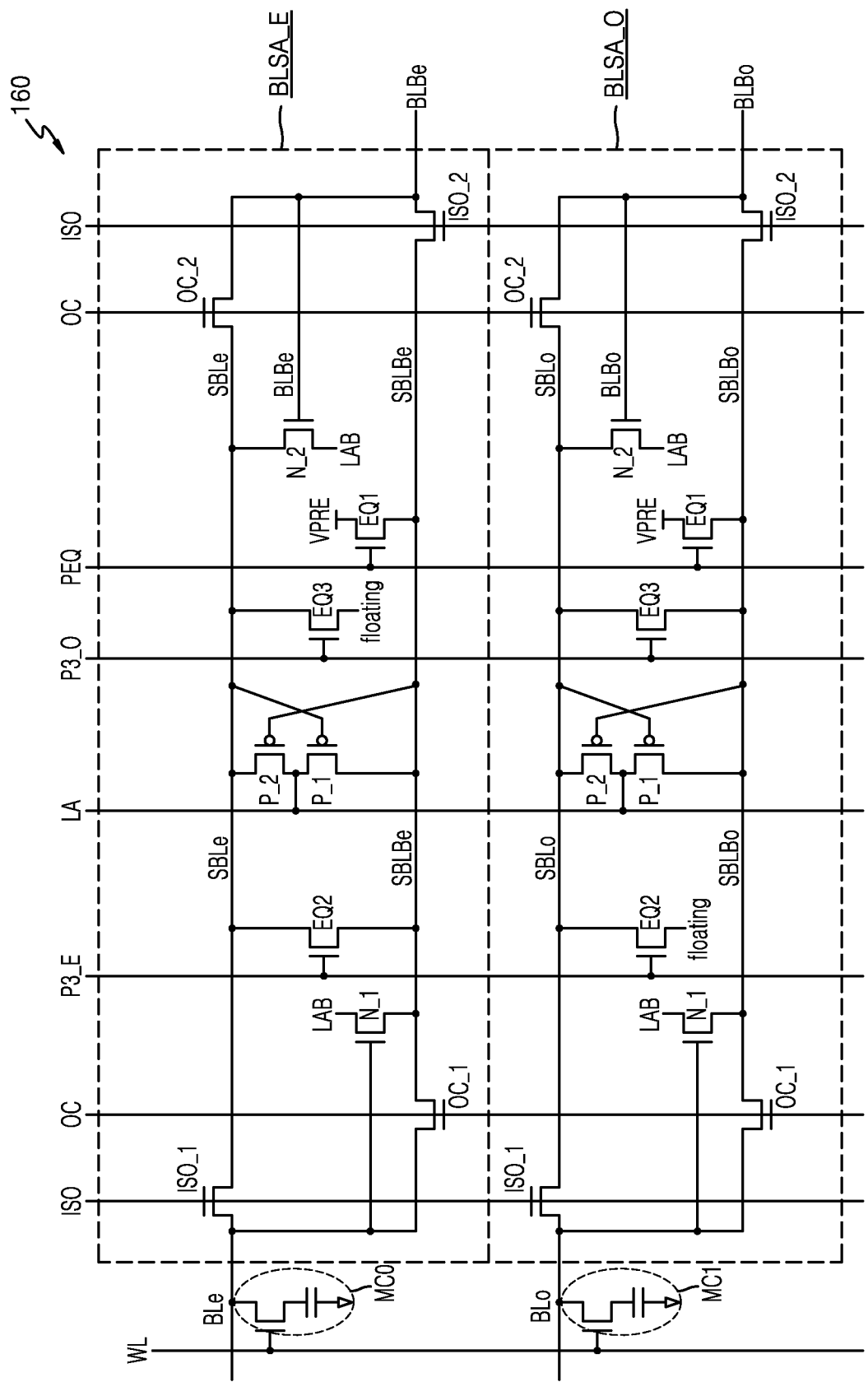
FIGS. 7 and 8A to 8C are circuit diagrams for describing the operations of the even sense amplifier of FIG. 6A and the odd sense amplifier of FIG. 6B.
Figure 9:
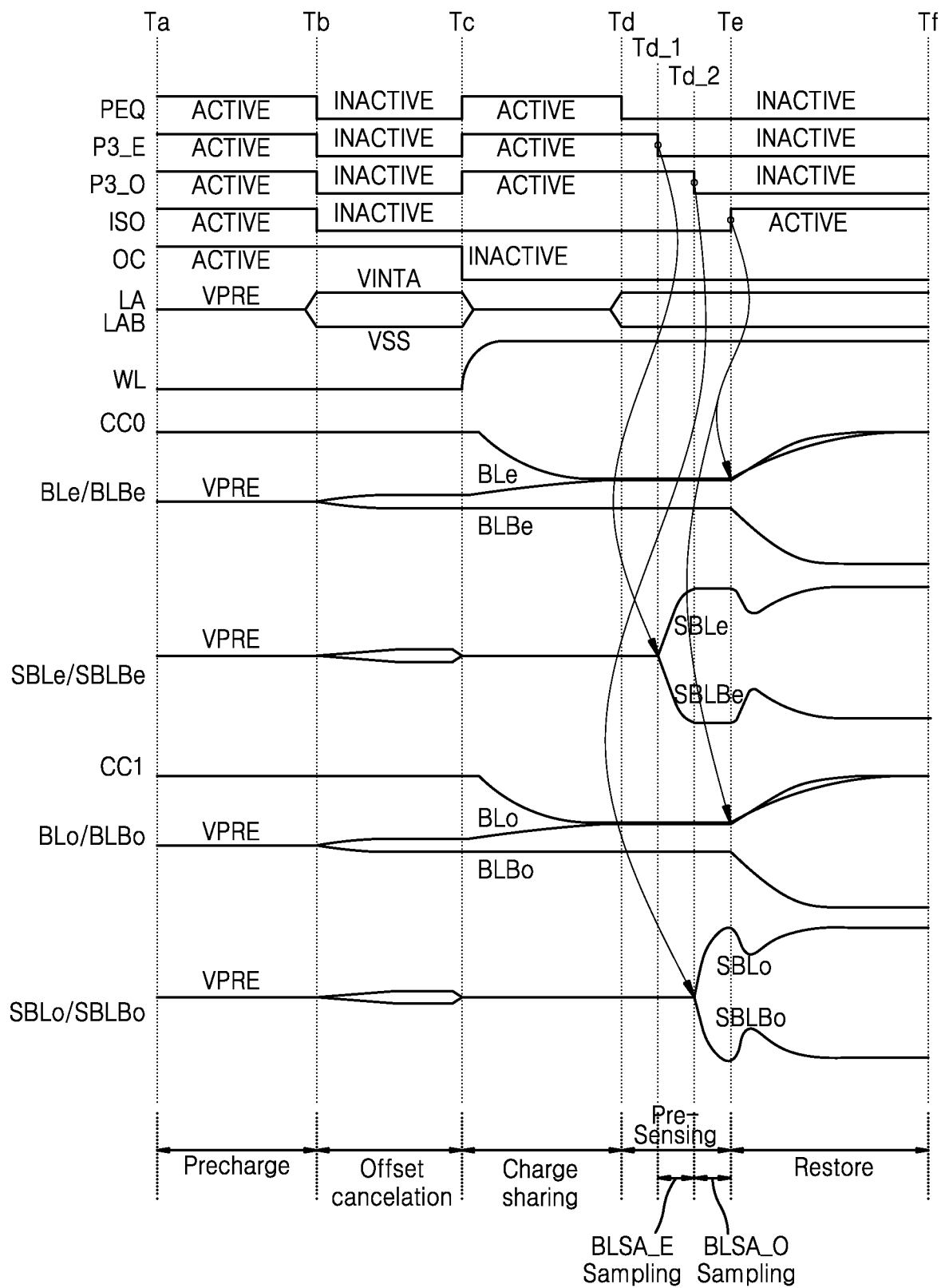
FIGS. 9 and 10 are timing diagrams for describing the operations of the even sense amplifier and the odd sense amplifier of FIGS. 7 and 8A.
Figure 10:
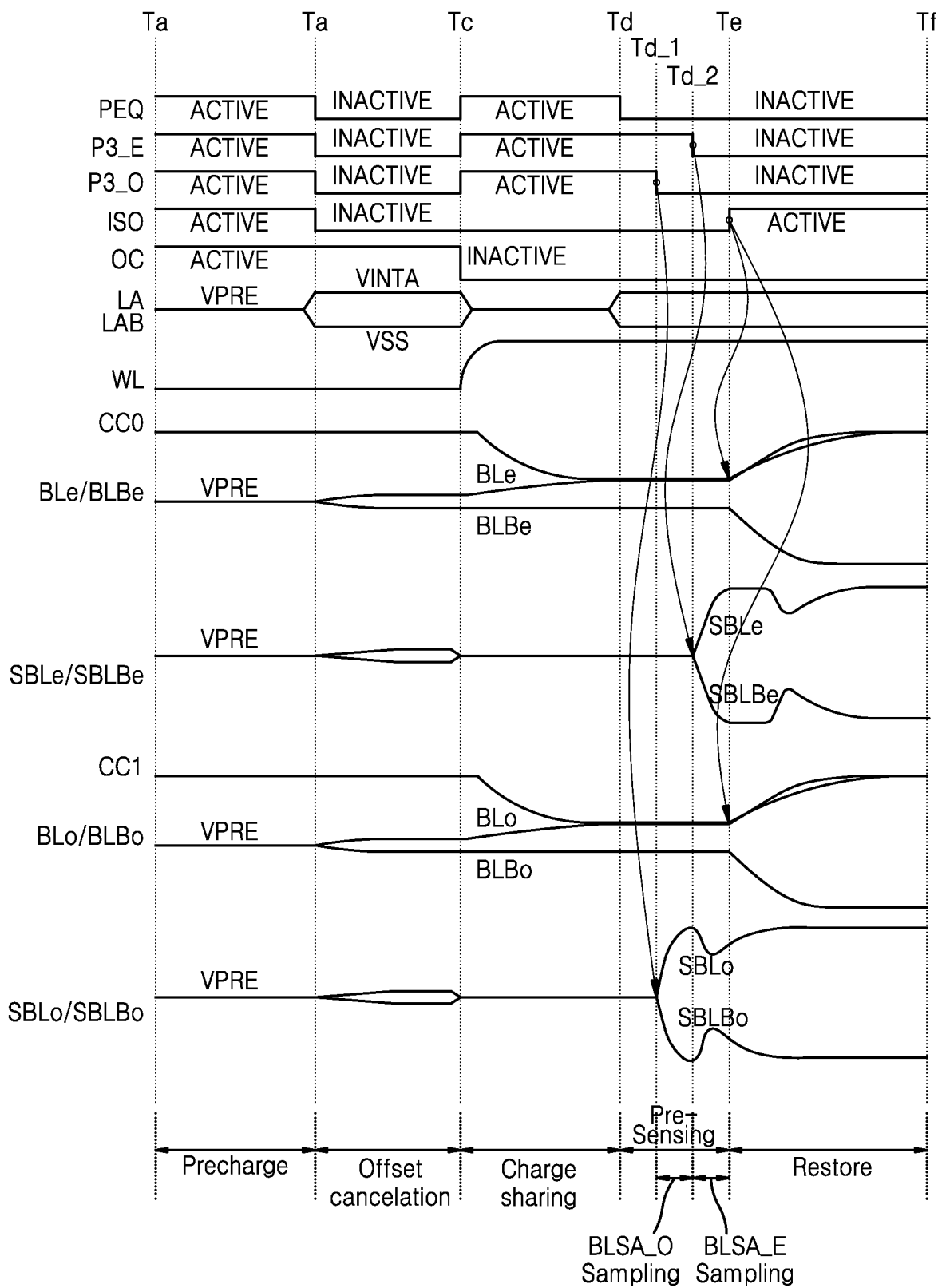

FIGS. 7 and 8A to 8C are circuit diagrams for describing the operations of the even sense amplifier BLSA_E of FIG. 6A and the odd sense amplifier BLSA_O of FIG. 6B. FIGS. 9 and 10 are timing diagrams for describing the operations of the even sense amplifier BLSA_E and the odd sense amplifier BLSA_O of FIGS. 7 and 8. FIG. 7 is a circuit diagram of a combination of the even sense amplifier BLSA_E 300 and the odd sense amplifier BLSA_O 301 of the sense amplifier 160a shown in FIGS. 6A and 6B.

Referring to FIG. 7, the even sense amplifier BLSA_E may be connected to even bit lines BLe, and the odd sense amplifier BLSA_O may be connected to odd bit lines BLo. In the present embodiment, the even bit lines BLe refer to the bit lines BL0 and BL2 shown in FIG. 3, and the odd bit lines BLo refer to the bit lines BL1 and BL3. The even sense amplifier BLSA_E is the same as the even sense amplifier BLSA_E of FIG. 6A, and the odd sense amplifier BLSA_O is the same as the odd sense amplifier BLSA_O of FIG. 6B.

Figure 8A:
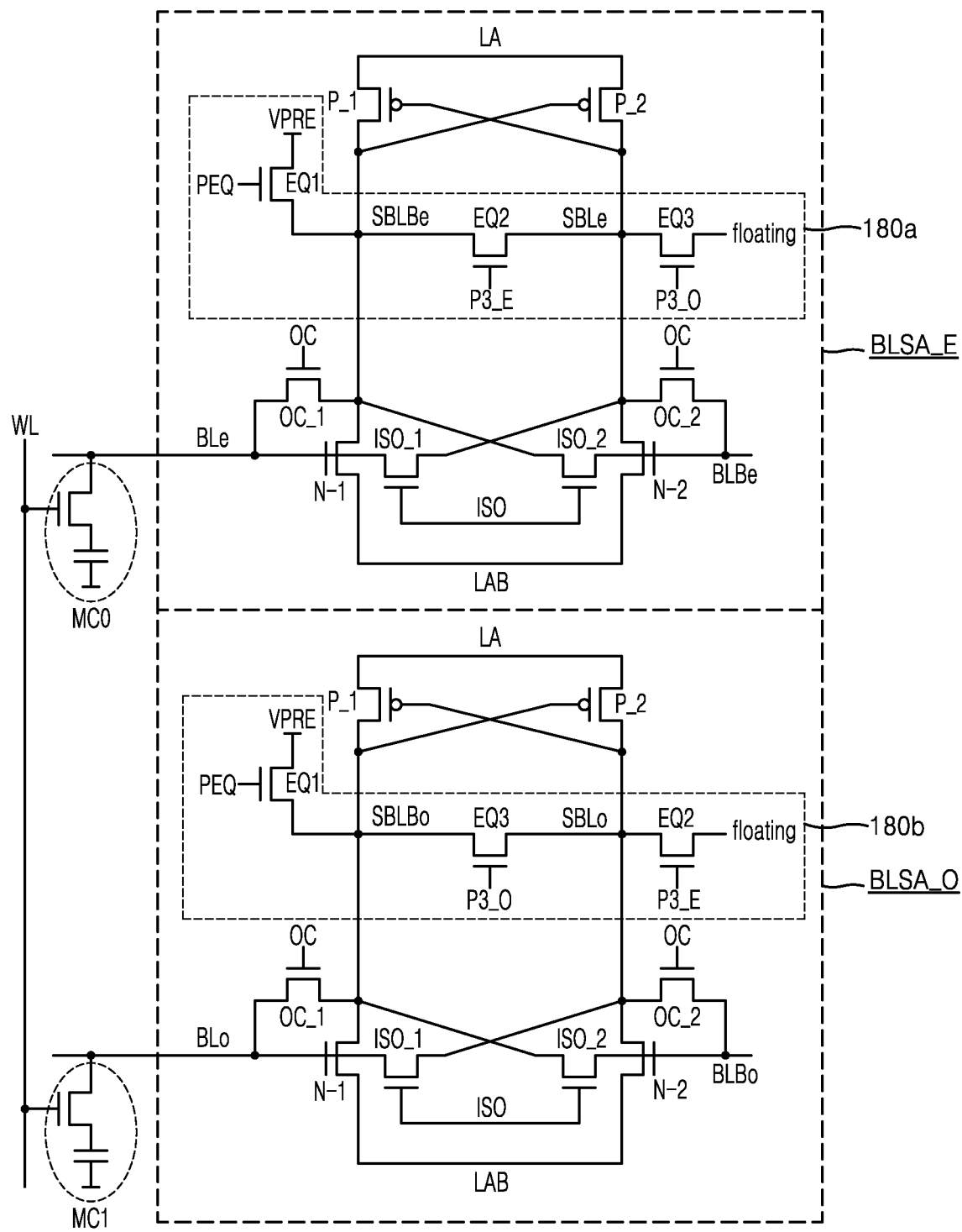

FIG. 8A is an equivalent circuit diagram of the even sense amplifier BLSA_E and the odd sense amplifier BLSA_O of FIG. 7, wherein, in the equalizing circuits 180a and 180b of the even sense amplifier BLSA_E and the odd sense amplifier BLSA_O, the first equalizing transistors EQ1 are connected between a line of the pre-charge voltage VPRE and complementary sensing bit lines SBLBe and SBLBo as shown in FIG. 7. Compared to the circuit diagram of FIG. 8A, in FIG. 8B, the first equalizing transistors EQ1 of the equalizing circuit 180a of the even sense amplifier BLSA_E and the odd sense amplifier BLSA_O are connected between the line of the pre-charge voltage VPRE and sensing bit lines SBLe and SBLo. Compared to the circuit diagram of FIG. 8A, in FIG. 8C, the first equalizing transistor EQ1 of the equalizing circuit 180b of the odd sense amplifier BLSA_O is connected between the line of the pre-charge voltage VPRE and a sensing bit line SBLo.

Figure 8B:
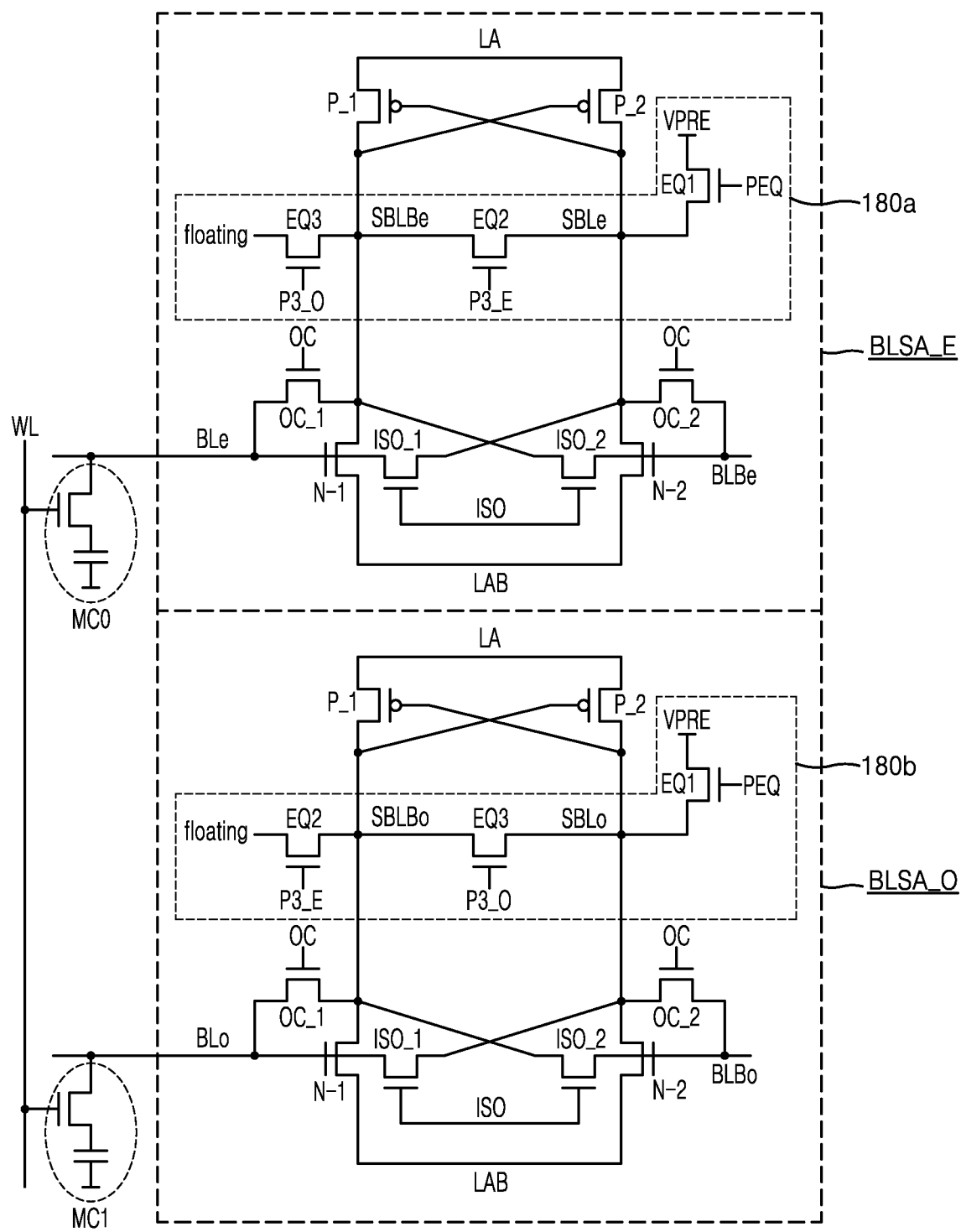
Figure 8C:
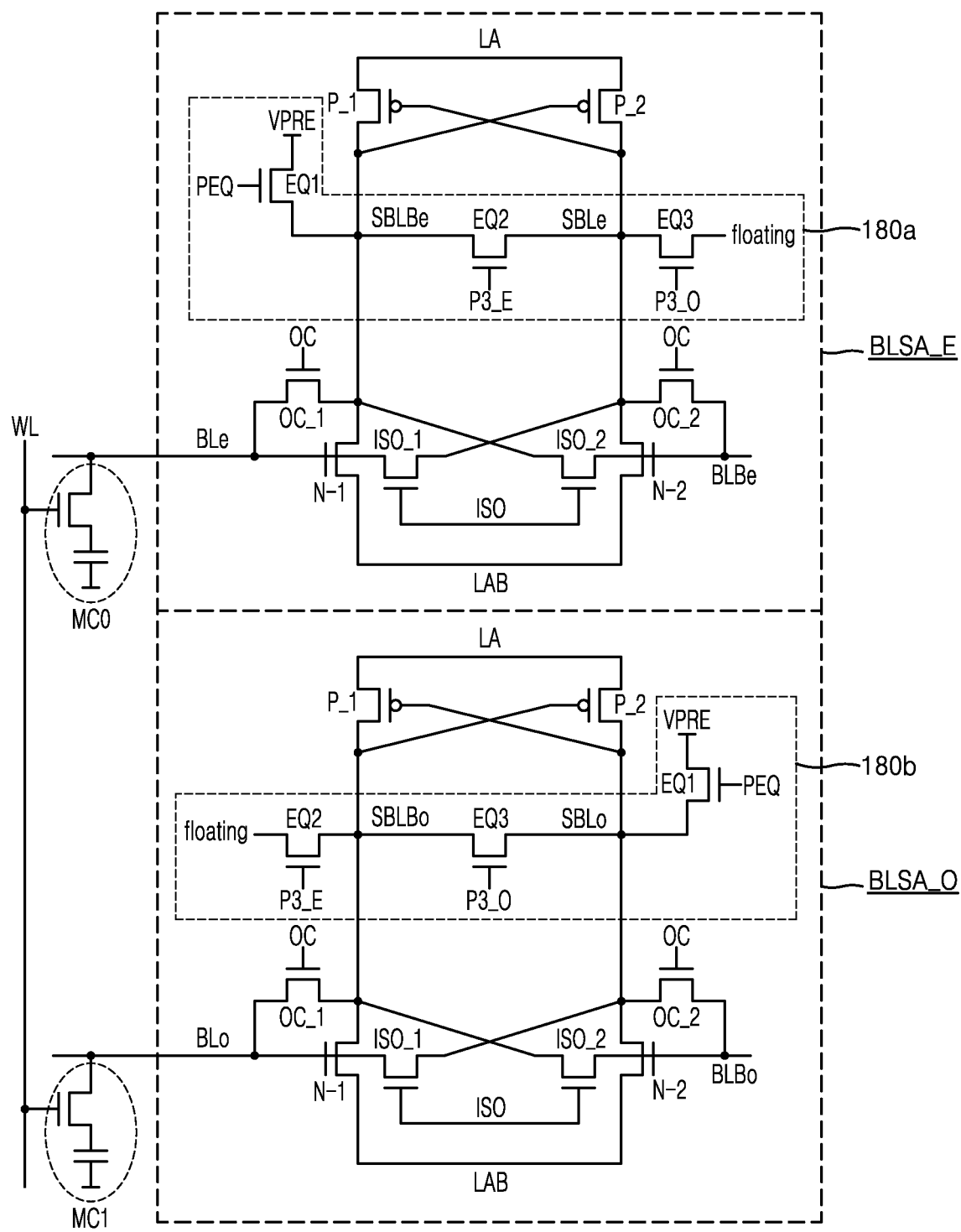

In FIGS. 8A to 8C, even when the connections of the first equalizing transistors EQ1 are different from one another, the operations of the equalizing circuits 180a and 180b of the even sense amplifier BLSA_E and the odd sense amplifier BLSA_O, that is, operations in which an even sensing bit line pair SBLe and SBLBe and an odd sensing bit line pair SBLo and SBLBo are pre-charged to the pre-charge voltage VPRE when the equalizing signal PEQ, the even equalizing signal P3_E, and the odd equalizing signal P3_O are logic high H may be the same.

Referring to FIGS. 8A to 8C and 9, the even sense amplifier BLSA_E and the odd sense amplifier BLSA_O sequentially perform a pre-charge operation, an offset cancelation operation, a charge sharing operation, a pre-sensing operation, and a re-storing operation.

In a first period Ta-Tb, the even sense amplifier BLSA_E and the odd sense amplifier BLSA_O perform a pre-charge operation. At this time, the equalizing signal PEQ, the even equalizing signal P3_E, the odd equalizing signal P3_O, the isolation signal ISO, and the offset cancelation signal OC are logic high H, the first sensing drive signal LA and the second sensing drive signal LAB are at the level of the pre-charge voltage VPRE, and the even bit line pair BLe and BLBe, the even sensing bit line pair SBLe and SBLBe, the odd bit line pair BLo and BLBo, and the odd sensing bit line pair SBLo and SBLBo are pre-charged to the pre-charge voltage VPRE.

In a second period Tb-Tc, the even sense amplifier BLSA_E and the odd sense amplifier BLSA_O perform an offset cancelation operation. At this time, the equalizing signal PEQ, the even equalizing signal P3_E, the odd equalizing signal P3_O, and the isolation signal ISO become logic low L. The first sensing drive signal LA increases from the level of the pre-charge voltage VPRE to the level of an internal power voltage VINTA, and the second sensing drive signal LAB decreases from the level of the pre-charge voltage VPRE to the level of a ground voltage VSS.

Due to the even sense amplifier BLSA_E, the voltage level of the even complementary bit line BLBe rises or drops to a certain level as compared to the even bit line BLe, and thus the even bit line BLe and the even complementary bit line BLBe have a certain voltage difference. Also, the even sensing bit line SBLe and the even sensing complementary bit line SBLBe also have a certain voltage difference. Such a voltage difference may be interpreted as an offset voltage according to offset noise. In other words, as charges are stored between the even bit line BLe and the even complementary bit line BLBe and between the even sensing bit line SBLe and the even sensing complementary bit line SBLBe to have a difference as much as an offset voltage, offset noise of the even sense amplifier BLSA_E is removed. In other words, the even sense amplifier BLSA_E may compensate for an offset through an offset cancelation operation.

Due to the odd sense amplifier BLSA_O, the voltage level of the odd complementary bit line BLBo rises or drops to a certain level as compared to the odd bit line BLo, and thus the odd bit line BLo and the odd complementary bit line BLBo have a certain voltage difference. Also, the odd sensing bit line SBLo and the odd sensing complementary bit line SBLBo also have a certain voltage difference. As charges are stored between the odd bit line BLo and the odd complementary bit line BLBo and between the odd sensing bit line SBLo and the odd sensing complementary bit line SBLBo to have a difference as much as an offset voltage, the odd sense amplifier BLSA_O may compensate for an offset through an offset cancelation operation.

In a third period Tc-Td, the even sense amplifier BLSA_E and the odd sense amplifier BLSA_O perform a charge sharing operation. At this time, the equalizing signal PEQ, the even equalizing signal P3_E, and the odd equalizing signal P3_0 become logic high H, the first sensing drive signal LA and the second sensing drive signal LAB become the level of the pre-charge voltage VPRE, and the even sensing bit line pair SBLe and SBLBe and the odd sensing bit line pair SBLo and SBLBo are pre-charged to the pre-charge voltage VPRE. At this time, a word line WL connected to the memory cell MC is activated.

Charge sharing occurs between charges stored in a cell capacitor CC0 of a memory cell MC0 and charges stored in the even bit line BLe, and charge sharing occurs between charges stored in a cell capacitor CC1 of a memory cell MC1 and charges stored in the odd bit line BLo. When data '1' is stored in memory cells MC0 and MC1, the voltage levels of the even bit line BLe and the odd bit line BLo will rise by a certain level during a charge sharing operation. In another embodiment, when data '0' is stored in the memory cell MC, the voltage level of the bit line BL may decrease by a certain level during a charge sharing operation.

In a fourth period Td-Te, the even sense amplifier BLSA_E and the odd sense amplifier BLSA_O perform a pre-sensing operation. At this time, the first sensing drive signal LA increases from the level of the pre-charge voltage VPRE to the level of the internal power voltage VINTA, and the second sensing drive signal LAB decreases from the level of the pre-charge voltage VPRE to the level of the ground voltage VSS. Also, the equalizing signal PEQ, the even equalizing signal P3_E, and the odd equalizing signal P3_O may be disabled to the logic low L with certain time differences. For example, the equalizing signal PEQ may be disabled to the logic low L at a time point Td, the even equalizing signal P3_E may be disabled to the logic low L at a time point Td_1, and the odd equalizing signal P3_O may be disabled to the logic low L at a time point Td_2.

In the even sense amplifier BLSA_E, at the time point Td_1 at which the even equalizing signal P3_E is disabled to the logic low L, based on a voltage difference between the even bit line BLe and the even complementary bit line BLBe, the voltage level of the even sensing bit line SBLe may rise to the level of the internal power voltage VINTA and the voltage level of the even complementary sensing bit line SBLBe may drop to the level of the ground voltage VSS. The time point Td_1 may be referred to as a sampling time point of a sensing operation of the even sense amplifier BLSA_E. A sampling operation of the even sense amplifier BLSA_E is not coupling-influenced by the odd sensing bit line SBLo and the odd complementary sensing bit line SBLBo of the odd sense amplifier BLSA_O adjacent thereto.

In the odd sense amplifier BLSA_O, at the time point Td_2 at which the odd equalizing signal P3_O is disabled to the logic low L, based on a voltage difference between the odd bit line BLo and the odd complementary bit line BLBo, the voltage level of the odd sensing bit line SBLo may rise to the level of the internal power voltage VINTA and the voltage level of the odd complementary sensing bit line SBLBo may drop to the level of the ground voltage VSS. The time point Td_2 may be referred to as a sampling time point of a sensing operation of the odd sense amplifier BLSA_O.

In a fifth period Te-Tf, the even sense amplifier BLSA_E and the odd sense amplifier BLSA_O perform a re-storing operation. At this time, the isolation signal ISO becomes the logic high H, and thus the first isolation transistor ISO_1 and the second isolation transistor ISO_2 are turned on.

The even bit line pair BLe and BLBe and the even sensing bit line pair SBLe and SBLBe are connected to each other, the voltage level of the even bit line BLe rises to the voltage level of the even sensing bit line SBLe, and charges may be restored to the cell capacitor CC0 of the memory cell MC0 to a charge amount corresponding to the voltage level of the even bit line pair BLe. The odd bit line pair BLo and BLBo and the odd sensing bit line pair SBLo and SBLBo are connected to each other, the voltage level of the odd bit line BLo rises to the voltage level of the odd sensing bit line SBLo, and charges may be restored to the cell capacitor CC1 of the memory cell MC1 to a charge amount corresponding to the voltage level of the odd bit line pair BLo.

Referring to FIG. 10, as compared to the timing diagram of FIG. 9, the odd equalizing signal P3_O is disabled to the logic low L at the time point Td_1 of the fourth period Td-Te, and the even equalizing signal P3_E is disabled to the logic low L at the time point Td_2. In other words, the odd equalizing signal P3_O is disabled first, and the even equalizing signal P3_E is disabled later.

In the odd sense amplifier BLSA_O, at the time point Td_1 at which the odd equalizing signal P3_O is disabled to the logic low L, based on a voltage difference between the odd bit line BLo and the odd complementary bit line BLBo, the voltage level of the odd sensing bit line SBLo may rise to the level of the internal power voltage VINTA and the voltage level of the odd complementary sensing bit line SBLBo may drop to the level of the ground voltage VSS. The time point Td_1 becomes a sampling time point of a sensing operation of the odd sense amplifier BLSA_O. A sampling operation of the odd sense amplifier BLSA_O is not coupling-influenced by the even sensing bit line SBLe and the even complementary sensing bit line SBLBe of the even sense amplifier BLSA_E adjacent thereto.

In the even sense amplifier BLSA_E, at the time point Td_2 at which the even equalizing signal P3_E is disabled to the logic low L, based on a voltage difference between the even bit line BLe and the even complementary bit line BLBe, the voltage level of the even sensing bit line SBLe may rise to the level of the internal power voltage VINTA and the voltage level of the even complementary sensing bit line SBLBe may drop to the level of the ground voltage VSS. The time point Td_2 becomes a sampling time point of a sensing operation of the even sense amplifier BLSA_E.

Accordingly, as described hereinabove with respect to the circuits of FIGS. 6-8 and the timing diagrams of FIGS. 9-10, additional embodiments of the invention include methods of operating memory devices having even and odd bit line sense amplifying circuits, such as those described hereinabove. According to some of these embodiments of the invention, operations are performed to read first and second data from respective first and second memory cells (e.g., MC0, MC1) onto respective first and second bit lines (e.g., BLe, BLo), in-sync with an inactive-to-active transition (e.g., 0-to-1) of a signal on a word line (e.g., WL) electrically coupled to the first and second memory cells. An operation is also performed to equilibrate a voltage across a first pair of sense bit lines (e.g., SBLe, SBLBe) associated with the first memory cell and a voltage across a second pair of sense bit lines (e.g., SBLo, SBLBo) associated with a second memory cell during a equilibrating time interval (e.g., Tc-Td+ (e.g., Td_1, Td_2)).

In addition to equilibrating, an operation is also performed to differentially drive the first pair of sense bit lines to respective voltages that at least partially reflect a value of the first data in the first memory cell (e.g., SBLe, SBLBe during Td_1-Te), while continuing to equilibrate the voltage on the second pair of sense bit lines (e.g., SBLo, SBLBo during Td_1 to Td_2). Then, an operation is performed to differentially drive the second pair of sense bit lines to respective voltages that at least partially reflect a value of the second data in the second memory cell (e.g., SBLo, SBLBo during Td_2-Te), but without the bit line coupling effects that might otherwise have occurred during the time interval from Td_1 to Td_2.

Figure 11A:
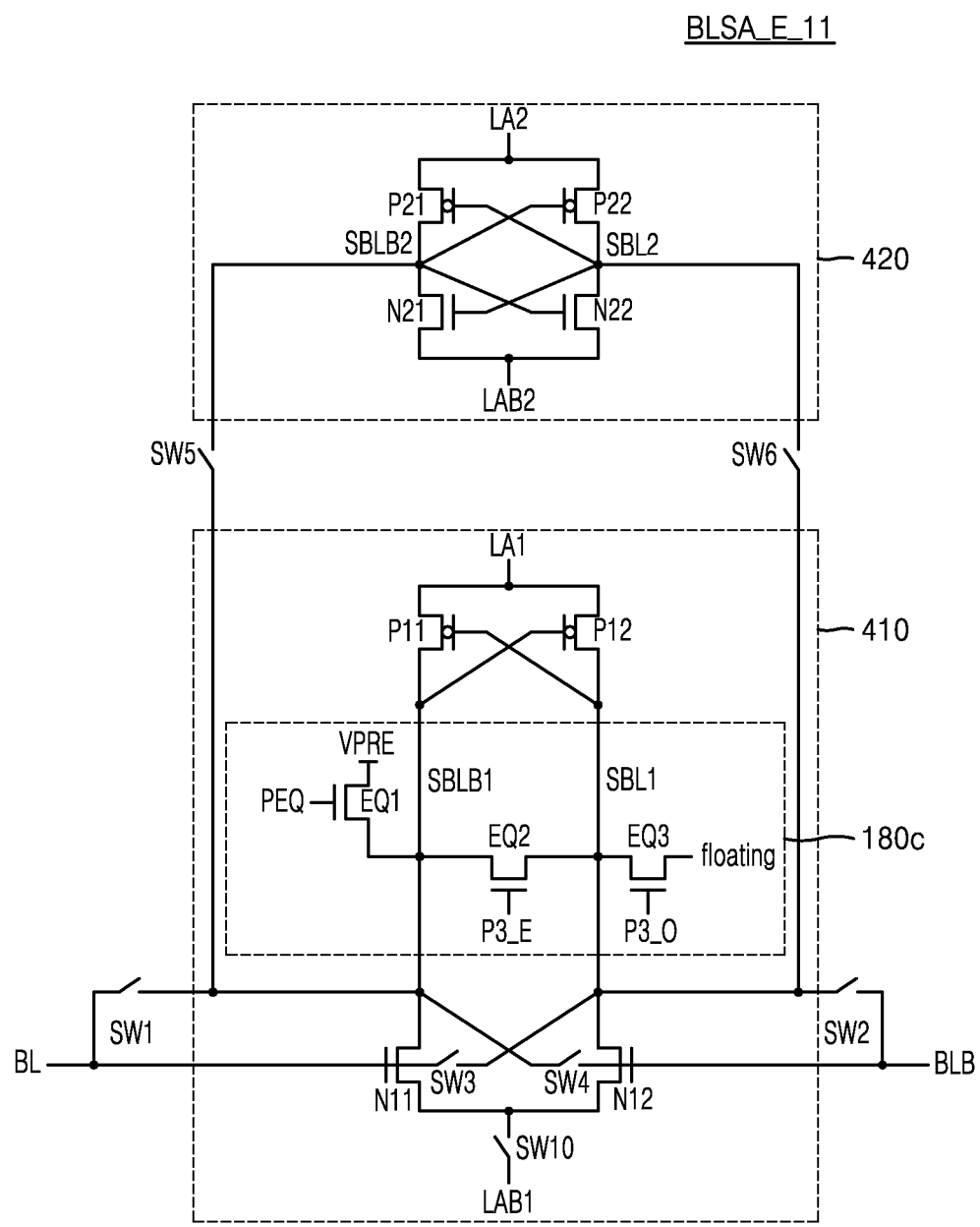
FIGS. 11A and 11B are circuit diagrams for describing an even sense amplifier and an odd sense amplifier included in a sense amplifier for sensing a memory cell voltage as multi bit data according to an embodiment of the inventive concept.
Figure 11B:
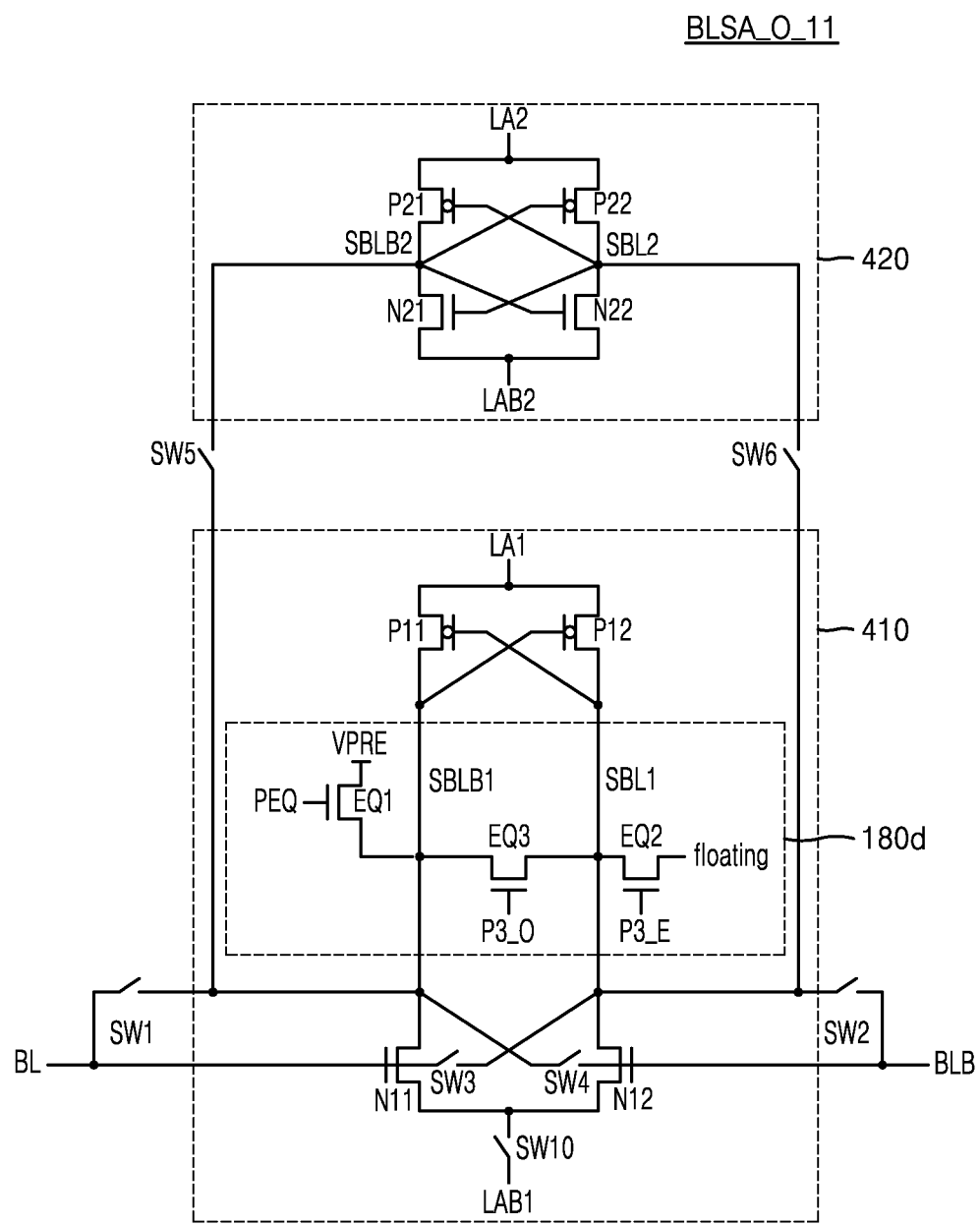

FIGS. 11A and 11B are circuit diagrams for describing an even sense amplifier BLSA_E_11 and an odd sense amplifier BLSA_O_11 included in the sense amplifier 160 for sensing a memory cell voltage as multi bit data according to an embodiment of the inventive concept. In FIGS. 11A and 11B, the even sense amplifier BLSA_E_11, the odd sense amplifier BLSA_O_11, and equalizing circuits 180c and 180d indicate that components of the sense amplifier 160 may be functionally and logically separated from one another, and the components need not to be physical components separate from one another.

The even sense amplifier BLSA_E_11 of FIG. 11A corresponds to the even sense amplifier BLSA_E described in the arrangements of the sense amplifier 160 of FIGS. 3 to 5, and the odd sense amplifier BLSA_O_11 of FIG. 11B corresponds to the odd sense amplifier BLSA_O described in the arrangements of sense amplifier 160 in FIGS. 3 to 5. The even sense amplifier BLSA_E_11 of FIG. 11A and the odd sense amplifier BLSA_O_11 of FIG. 11B each includes a first sense amplifying circuit 410, a second sense amplifying circuit 420, and a switching circuit including a power switch SW10 and a first to sixth switches SW1 to SW6.

In FIGS. 11A and 11B, the first sense amplifying circuit 410 is connected to a first sensing drive signal LA1 and a second sensing drive signal LAB1 and includes a first PMOS transistor P11, a second PMOS transistor P12, a first NMOS transistor N11, and a second NMOS transistor N12. The power voltage VINTA, the ground voltage VSS, or the pre-charge voltage VPRE may be applied to each of the first sensing drive signal LA1 and the second sensing drive signal LAB1 under the control of the control circuit 150 (FIG. 1).

A first end of the first PMOS transistor P11 is connected to a line of the first sensing drive signal LA1, a second end of the first PMOS transistor P11 is connected to a first complementary sensing bit line SBLB1, and a gate of the first PMOS transistor P11 is connected to a first sensing bit line SBL1. A first end of the second PMOS transistor P12 is connected to the line of the first sensing drive signal LA1, a second end of the second PMOS transistor P12 is connected to the first sensing bit line SBL1, and a gate of the second PMOS transistor P12 is connected to the first complementary sensing bit line SBLB1.

A first end of the first NMOS transistor N11 is connected to the power switch SW10, a second end of the first NMOS transistor N11 is connected to the first complementary sensing bit line SBLB1, and a gate of the first NMOS transistor N11 is connected to the bit line BL. A first end of the second NMOS transistor N12 is connected to the power switch SW10, a second end of the second NMOS transistor N12 is connected to the first sensing bit line SBL1, and a gate of the second NMOS transistor N12 is connected to the complementary bit line BLB.

A first switch SW1 is connected between the bit line BL and the first complementary sensing bit line SBLB1 and is turned on or off under the control of the control circuit 150. A second switch SW2 is connected between the complementary bit line BLB and the first sensing bit line SBL1 and is turned on or off under the control of the control circuit 150. A third switch SW3 is connected between the bit line BL and the first sensing bit line SBL1 and is turned on or off under the control of the control circuit 150. A fourth switch SW4 is connected between the complementary bit line BLB and the first complementary sensing bit line SBLB1 and is turned on or off under the control of the control circuit 150.

The second sense amplifying circuit 420 is connected to a third sensing drive signal LA2 and a fourth sensing drive signal LAB2 and includes a third PMOS transistor P21, a fourth PMOS transistor P22, a third NMOS transistor N21, and a fourth NMOS transistor N22.

A first end of the third PMOS transistor P21 is connected to the line of the third sensing drive signal LA2, a second end of the third PMOS transistor P21 is connected to a second complementary sensing bit line SBLB2, and a gate of the third PMOS transistor P21 is connected to a second sensing bit line SBL2. A first end of the fourth PMOS transistor P22 is connected to the line of the third sensing drive signal LA2, a second end of the fourth PMOS transistor P22 is connected to the second sensing bit line SBL2, and a gate of the fourth PMOS transistor P22 is connected to the second complementary sensing bit line SBLB2.

A first end of the third NMOS transistor N21 is connected to the line of the fourth sensing drive signal LAB2, a second end of the third NMOS transistor N21 is connected to the second complementary sensing bit line SBLB2, and a gate of the third NMOS transistor N21 is connected to the second sensing bit line SBL2. A first end of the fourth NMOS transistor N22 is connected to the line of the fourth sensing drive signal LAB2, a second end of the fourth NMOS transistor N22 is connected to the second sensing bit line SBL2, and a gate of the fourth NMOS transistor N22 is connected to the second complementary sensing bit line SBLB2.

A fifth switch SW5 is connected between the first complementary sensing bit line SBLB1 and the second complementary sensing bit line SBLB2 and is turned on or off under the control of the control circuit 150. A sixth switch SW6 is connected between the first sensing bit line SBL1 and the second sensing bit line SBL2 and is turned on or off under the control of the control circuit 150.

The even sense amplifier BLSA_E_11 of FIG. 11A and the odd sense amplifier BLSA_O_11 of FIG. 11B may be commonly connected to the equalizing circuits 180c and 180d. The equalizing circuits 180a and 180b are connected between the first sensing bit line SBL1 and the first complementary sensing bit line SBLB1 and may include the first equalizing transistor EQ1, the second equalizing transistor EQ2, and the third equalizing transistor EQ3 that selectively equalize the first sensing bit line SBL1 and the first complementary sensing bit line SBLB1 in response to the equalizing signal PEQ, the even equalizing signal P3_E, and the odd equalizing signal P3_0. The internal connection relationship of an equalizing circuit 180c connected to the even sense amplifier BLSA_E_11 of FIG. 11A and the internal connection relationship of an equalizing circuit 180d connected to the odd sense amplifier BLSA_O_11 of FIG. 11B may be implemented differently than illustrated herein.

In both the equalizing circuit 180c connected to the even sense amplifier BLSA_E_11 of FIG. 11A and the equalizing circuit 180d connected to the odd sense amplifier BLSA_O_11 of FIG. 11B, a first end of the first equalizing transistor EQ1 may be connected to a line of the pre-charge voltage VPRE, a second end of the first equalizing transistor EQ1 may be connected to the first complementary sensing bit line SBLB1, and a gate of the first equalizing transistor EQ1 may be connected to the equalizing signal PEQ.

However, in the equalizing circuit 180c connected to the even sense amplifier BLSA_E_11 of FIG. 11A, a first end of the second equalizing transistor EQ2 is connected to the first complementary sensing bit line SBLB1, a second end of the second equalizing transistor EQ2 is connected to the first sensing bit line SBL1, and a gate of the second equalizing transistor EQ2 is connected to the even equalizing signal P3_E. Also, a first end of the third equalizing transistor EQ3 is connected to the first sensing bit line SBL1, a second end of the third equalizing transistor EQ3 is floated, and a gate of the third equalizing transistor EQ3 is connected to the odd equalizing signal P3_O.

In the equalizing circuit 180d connected to the odd sense amplifier BLSA_O_11 of FIG. 11B, the first end of the second equalizing transistor EQ2 is connected to the first sensing bit line SBL1, the second end of the second equalizing transistor EQ2 is floated, and the gate of the second equalizing transistor EQ2 is connected to the even equalizing signal P3_E. Also, the first end of the third equalizing transistor EQ3 is connected to the first sensing bit line SBL1, the second end of the third equalizing transistor EQ3 is connected to the first complementary sensing bit line SBLB1, and the gate of the third equalizing transistor EQ3 is connected to the odd equalizing signal P3_O.

Figure 12A:
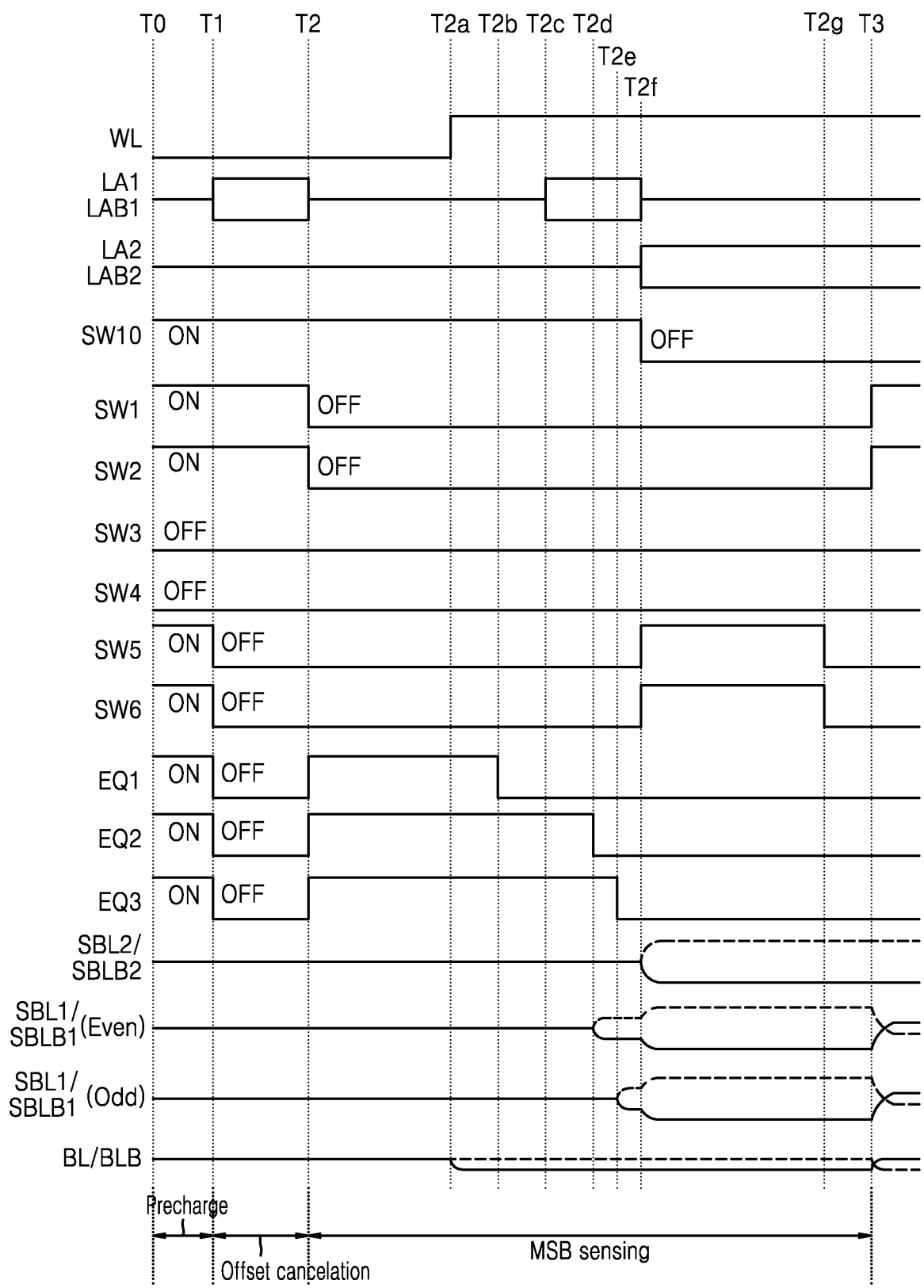
FIGS. 12A and 12B are timing diagrams for describing the operation of a sense amplifier including the even sense amplifier of FIG. 11A and the odd sense amplifier of FIG. 11B.
Figure 12B:
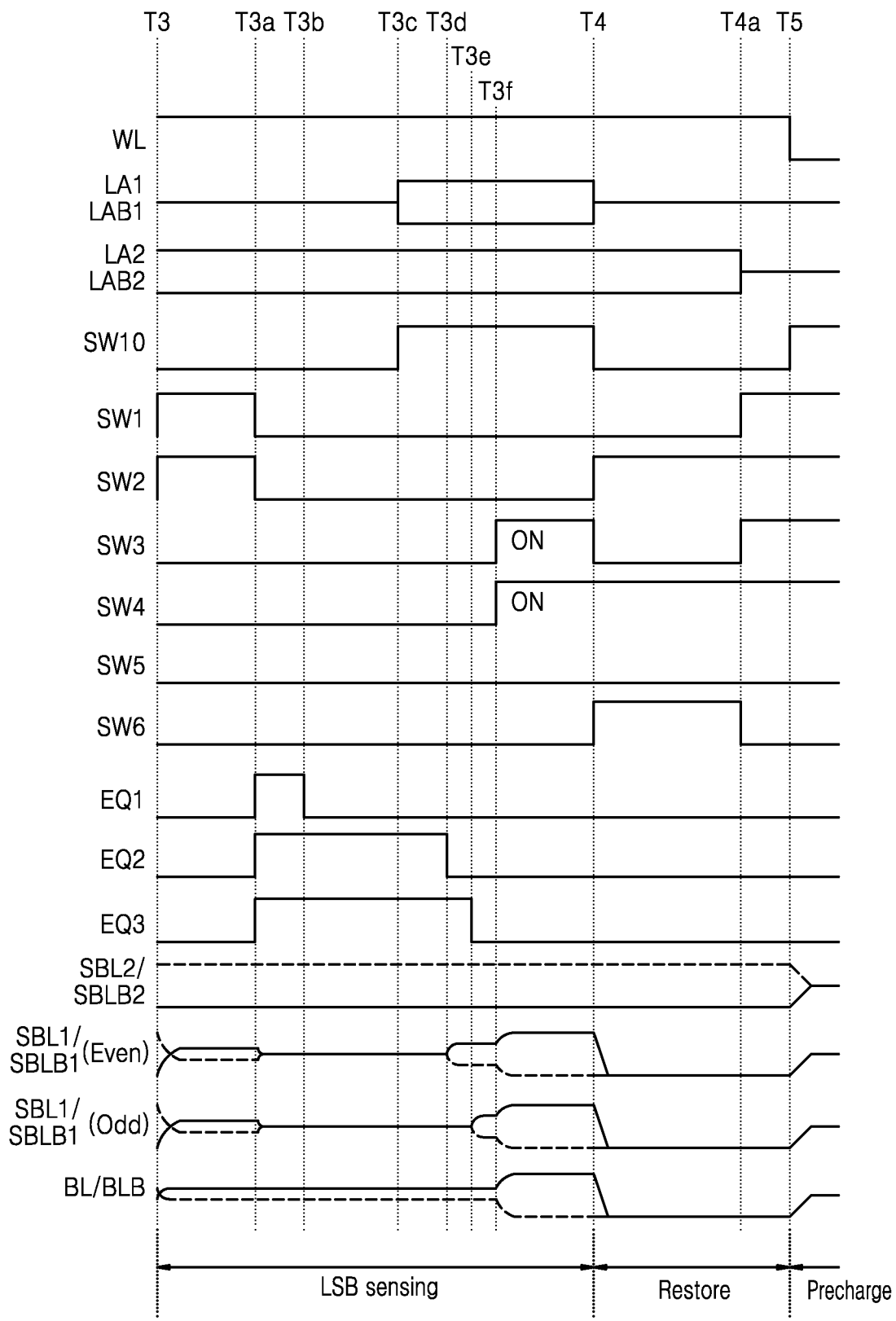

FIGS. 12A and 12B are timing diagrams for describing the operation of the sense amplifier 160 including the even sense amplifier BLSA_E_11 of FIG. 11A and the odd sense amplifier BLSA_O_11 of FIG. 11B. FIGS. 12A and 12B show a pre-charge operation, an offset cancelation operation, an MSB sensing operation, an LSB sensing operation, and a restore operation according to the operations of the sense amplifier 160 for sensing the cell voltage Vcell of the memory cell MC as an MSB and an LSB of 2-bit data.

Referring to FIG. 12A, in a pre-charge operation period between a time point T0 and a time point T1, in the even sense amplifier BLSA_E_11 and the odd sense amplifier BLSA_O_11, the pre-charge voltage VPRE is applied to lines of the first sensing drive signal LA1, the second sensing drive signal LAB1, the third sensing drive signal LA2, and the fourth sensing drive signal LAB2, the power switch SW10 is turned on, the first switch SW1 and the second switch SW2 are turned on, the fifth switch SW5 and the sixth switch SW6 are turned on, and the first equalizing transistor EQ1, the second equalizing transistor EQ2, and the third equalizing transistor EQ3 are turned on, and thus the bit line BL, the complementary bit line BLB, the first sensing bit line SBL1, the first complementary sensing bit line SBLB1, the second sensing bit line SBL2, and the second complementary sensing bit line SBLB2 may be pre-charged to the pre-charge voltage VPRE.

In an offset cancelation operation period between the time point T1 and a time point T2, in the even sense amplifier BLSA_E_11 and the odd sense amplifier BLSA_O_11, the power voltage VINTA is applied to the line of the first sensing drive signal LA1, the ground voltage VSS is applied to the line of the second sensing drive signal LAB1, the fifth switch SW5 and the sixth switch SW6 are turned off, and the first equalizing transistor EQ1, the second equalizing transistor EQ, and the third equalizing transistor EQ3 are turned on, such that there are differences corresponding to an offset voltage between the bit line BL and the complementary bit line BLB and between the first sensing bit line SBL1 and the first complementary bit line SBLB1 to cancel offset noises of the even sense amplifier BLSA_E_11 and the odd sense amplifier BLSA_O_11.

In an MSB sensing period between the time point T2 and a time point T3, the even sense amplifier BLSA_E_11 and the odd sense amplifier BLSA_O_11 may perform a first charge sharing operation, an MSB sensing operation, a first MSB latch operation, and a second MSB latch operation.

Between the time point T2 and a time point T2a, the pre-charge voltage VPRE is applied to the first sensing drive signal LA1 and the second sensing drive signals LAB1, thereby turning off the first sense amplifying circuit 410, turning off the first switch SW1 and the second switch SW2, and turning on the first equalizing transistor EQ1, the second equalizing transistor EQ2, and the third equalizing transistor EQ3. Accordingly, the first sensing bit line SBL1 and the first complementary sensing bit line SBLB1 of the even sense amplifier BLSA_E_11 and the odd sense amplifier BLSA_O_11 may be pre-charged to the level of the pre-charge voltage VPRE.

At the time point T2a, the word line WL connected to the memory cell MC is enabled, and a first charge sharing occurs between charges stored in the capacitor of the memory cell MC and charges stored in the bit line BL and the complementary bit line BLB. During a first charge sharing operation, the voltage level of the bit line BL may rise or drop by a certain level from the level of the pre-charge voltage VPRE.

At a time point T2b, the first equalizing transistor EQ1 is turned off in response to the equalizing signal PEQ.

At a time point T2c, the power voltage VINTA is applied to the first sensing drive signal LA1 and the ground voltage VSS is applied to the second sensing drive signal LAB1, thereby turning on the first sense amplifying circuit 410.

At a time point T2d, the second equalizing transistor EQ2 is turned off in response to an even equalizing signal P13_E. The first sensing bit line SBL1 and the first complementary sensing bit line SBLB1 of the even sense amplifier BLSA_E_11 may perform a sampling operation for sensing an MSB. At this time, the first sensing bit line SBL1 and the first complementary sensing bit line SBLB1 of the odd sense amplifier BLSA_O_11 are captured at the level of the pre-charge voltage VPRE. The sampling operation of the even sense amplifier BLSA_E_11 for sensing an MSB is not coupling-influenced by the first sensing bit line SBL1 and the first complementary sensing bit line SBLB1 of the odd sense amplifier BLSA_O_11 adjacent thereto.

At a time point T2e, the third equalizing transistor EQ3 is turned off in response to an odd equalizing signal P13_0. The first sensing bit line SBL1 and the first complementary sensing bit line SBLB1 of the odd sense amplifier BLSA_O_11 may perform a sampling operation for sensing an MSB.

At a time point T2f, the even sense amplifier BLSA_E_11 and the odd sense amplifier BLSA_O_11 perform a first MSB latch operation for latching an MSB. In the even sense amplifier BLSA_E_11 and the odd sense amplifier BLSA_O_11, the first sense amplifying circuit 410 is turned off as the pre-charge voltage VPRE is applied to the first sensing drive signal LA1 and the second sensing drive signal LAB1, and, as the power voltage VINTA is applied to the third sensing drive signal LA2 and the ground voltage VSS is applied to the fourth sensing drive signal LAB2, the second sense amplifying circuit 420 is turned on, the power switch SW10 is turned off, and the fifth switch SW5 and the sixth switch SW6 are turned on, and thus a first MSB latch operation is performed. The first complementary sensing bit line SBLB1 and the second complementary sensing bit line SBLB2 are connected to each other by the fifth switch SW5, and the first sensing bit line SBL1 and the second sensing bit line SBL2 are connected to each other by the sixth switch SW6. The power switch SW10 is turned off to cut off a leakage current path that interferes with the operation of the second sense amplifying circuit 420 in an on state.

The second sense amplifying circuit 420 may sense a voltage difference between the second sensing bit line SBL2 and the second complementary sensing bit line SBLB2, thereby increasing or decreasing the voltage of the second sensing bit line SBL2 and increasing or decreasing the voltage of the second complementary sensing bit line SBLB2. The voltage of the first sensing bit line SBL1 connected to the second sensing bit line SBL2 may also rise or drop, and the voltage of the first complementary sensing bit line SBLB1 connected to the second complementary sensing bit line SBLB2 may also rise or drop.

In the present embodiment, in an MSB sensing period between the time point T2 and the time point T3, after the first equalizing transistor EQ1 is turned off at the time point T2b, the second equalizing transistor EQ2 may be first turned off at the time point T2d and the third equalizing transistor EQ3 may be later turned off at the time point T2e. In another embodiment, after the first equalizing transistor EQ1 is turned off at the time point T2b, the third equalizing transistor EQ3 may be first turned off at the time point T2d and the second equalizing transistor EQ2 may be later turned off at the time point T2e.

At a time point T2g, the even sense amplifier BLSA_E_11 and the odd sense amplifier BLSA_O_11 perform a second MSB latch operation for latching an MSB. The even sense amplifier BLSA_E_11 and the odd sense amplifier BLSA_O_11 turn off the fifth switch SW5 and the sixth switch SW6 to perform a second MSB latch operation for latching an MSB.

The second sensing bit line SBL2 may maintain a logic level "0" or "1", the second complementary sensing bit line SBLB2 may maintain a logic level "1" or "0", the first sensing bit line SBL1 may maintain a logic level "0" or "1", and the first complementary sensing bit line SBLB1 may maintain a logic level "1" or "0".

Referring to FIGS. 12A and 12B, in an LSB sensing period between a time point T3 and a time point T4, the even sense amplifier BLSA_E_11 and the odd sense amplifier BLSA_O_11 may perform a second charge sharing operation and an LSB sensing operation.

Between the time point T3 and a time point T3a, the even sense amplifier BLSA_E_11 and the odd sense amplifier BLSA_O_11 turn on the first switch SW1 and the second switch SW2, thereby performing second charge sharing operations between the first sensing bit line SBL1 and the complementary bit line BLB and between the first complementary sensing bit line SBLB1 and the bit line BL. Due to the second charge sharing operation, the voltage of the bit line BL and the first complementary sensing bit line SBLB1, the voltage of the complementary bit line BLB, and the voltage of the first sensing bit line SBL1 may increase or decrease by a certain level.

At the time point T3a, the even sense amplifier BLSA_E_11 and the odd sense amplifier BLSA_O_11 turn off the first switch SW1 and the second switch SW2 and turn on the first equalizing transistor EQ1, the second equalizing transistor EQ2, and the third equalizing transistor EQ3. Accordingly, the first sensing bit line SBL1 and the first complementary sensing bit line SBLB1 of the even sense amplifier BLSA_E_11 and the odd sense amplifier BLSA_O_11 may be pre-charged to the level of the pre-charge voltage VPRE.

At a time point T3b, the first equalizing transistor EQ1 is turned off in response to the equalizing signal PEQ.

At a time point T3c, the power voltage VINTA is applied to the first sensing drive signal LA1 and the ground voltage VSS is applied to the second sensing drive signal LAB1, thereby turning on the first sense amplifying circuit 410 and turning on the power switch SW10.

At a time point T3d, the second equalizing transistor EQ2 is turned off in response to an even equalizing signal P13_E. The first sensing bit line SBL1 and the first complementary sensing bit line SBLB1 of the even sense amplifier BLSA_E_11 may perform a sampling operation for sensing an LSB. At this time, the first sensing bit line SBL1 and the first complementary sensing bit line SBLB1 of the odd sense amplifier BLSA_O_11 are captured at the level of the pre-charge voltage VPRE. The sampling operation of the even sense amplifier BLSA_E_11 for sensing an LSB is not coupling-influenced by the first sensing bit line SBL1 and the first complementary sensing bit line SBLB1 of the odd sense amplifier BLSA_O_11 adjacent thereto.

At a time point T3*e*, the third equalizing transistor EQ3 is turned off in response to an odd equalizing signal P13_O. The first sensing bit line SBL1 and the first complementary sensing bit line SBLB1 of the odd sense amplifier BLSA_O_11 may perform a sampling operation for sensing an LSB.

At a time point T3*f*, the even sense amplifier BLSA_E_11 and the odd sense amplifier BLSA_O_11 turn on the third switch SW3 and the fourth switch SW4 to sense an LSB. The even sense amplifier BLSA_E_11 and the odd sense amplifier BLSA_O_11 may sense a voltage difference between the voltage of the bit line BL applied to gates of the first PMOS transistor P11 and the first NMOS transistor N11 and the voltage of the complementary bit line BLB applied to gates of the second PMOS transistor P12 and the second NMOS transistor N12, thereby increasing or decreasing the voltage level of the first sensing bit line SBL1 and increasing or decreasing the voltage level of the first complementary sensing bit line SBLB1.

The voltage level of the bit line BL connected to the first sensing bit line SBL1 may also rise or drop, and the voltage level of the complementary bit line BLB connected to the first complementary sensing bit line SBLB1 may also rise or drop. In the bit line BL of the even sense amplifier BLSA_E_11 and the odd sense amplifier BLSA_O_11, a logic level "0" or "1" may be latched as LSB data of the memory cell MC.

In the present embodiment, in an LSB sensing period between the time point T3 and the time point T4, after the first equalizing transistor EQ1 is turned off at the time point T2*b*, the second equalizing transistor EQ2 may be first turned off at the time point T3*d* and the third equalizing transistor EQ3 may be later turned off at the time point T3*e*. In another embodiment, after the first equalizing transistor EQ1 is turned off at the time point T3*b*, the third equalizing transistor EQ3 may be first turned off at the time point T3*d* and the second equalizing transistor EQ2 may be later turned off at the time point T3*e*.

In a restore period between the time point T4 and a time point T5, the even sense amplifier BLSA_E_11 and the odd sense amplifier BLSA_O_11 may perform an MSB and LSB combining operation and a third charge sharing operation.

Between the time point T4 and a time point T4*a*, the even sense amplifier BLSA_E_11 and the odd sense amplifier BLSA_O_11 may perform an operation for combining sensed MSB data and sensed LSB data. In the even sense amplifier BLSA_E_11 and the odd sense amplifier BLSA_O_11, the pre-charge voltage VPRE is applied to the lines of the first sensing drive signal LA1 and the second sensing drive signal LAB1 to turn off the first sense amplifying circuit 410, turn off the power switch SW10, turn on the second switch SW2, turn off the third switch SW3, and turn on the sixth switch SW6, and thus sensed MSB data and sensed LSB data may be combined.

The second sensing bit line SBL2 of the second sense amplifying circuit 420 latches MSB data at a logic level "0" or "1", and the first sensing bit line SBL1 of the first sense amplifying circuit 410 latches LSB data at a logic level "0" or "1". The second sensing bit line SBL2, the first sensing bit line pair SBL1 and SBLB1, and the bit line BL are connected by the second switch SW2, the fourth switch SW4, and the sixth switch SW6, and thus MSB data and LSB data may be combined. At this time, the bit line BL may have a voltage level corresponding to combined MSB and LSB data.

Between the time point T4*a* and the time point T5, the even sense amplifier BLSA_E_11 and the odd sense ampli- fier BLSA_O_11 perform a third charge sharing operation between the first sensing bit line pair SBL1 and SBLB1 and the bit line pair BL and BLB. In the even sense amplifier BLSA_E_11 and the odd sense amplifier BLSA_O_11, the pre-charge voltage VPRE is applied to the third sensing drive signal LA2 and the fourth sensing drive signal LAB2 to turn off the second sense amplifying circuit 420, turn on the first switch SW1 and the third switch SW3, and turn off the sixth switch SW6, and thus the third charge sharing operation may be performed. The bit line pair BL and BLB and the first sensing bit line pair SBL1 and SBLB1 may be connected by the first switch SW1, the second switch SW2, the third switch SW3, and the fourth switch SW4.

The even sense amplifiers BLSA_E_11 and the odd sense amplifiers BLSA_O_11 may perform the third charge sharing operation by using the cell capacitance of the memory cell MC, the bit line capacitances of the bit line pair BL and BLB, the bit line capacitances of the first sensing bit line pair SBL1 and SBLB1, and changes of those capacitances. Due to the third charge sharing operation, the bit line pair BL and BLB and the first sensing bit line pair SBL1 and SBLB1 have certain voltage levels, and the voltage of the bit line BL is restored to the memory cell MC as the cell voltage Vcell.

The period after the time point T5 is a pre-charge period and will be the same as the pre-charge period between the time point T0 and the time point T1 as described above.

Figure 13:
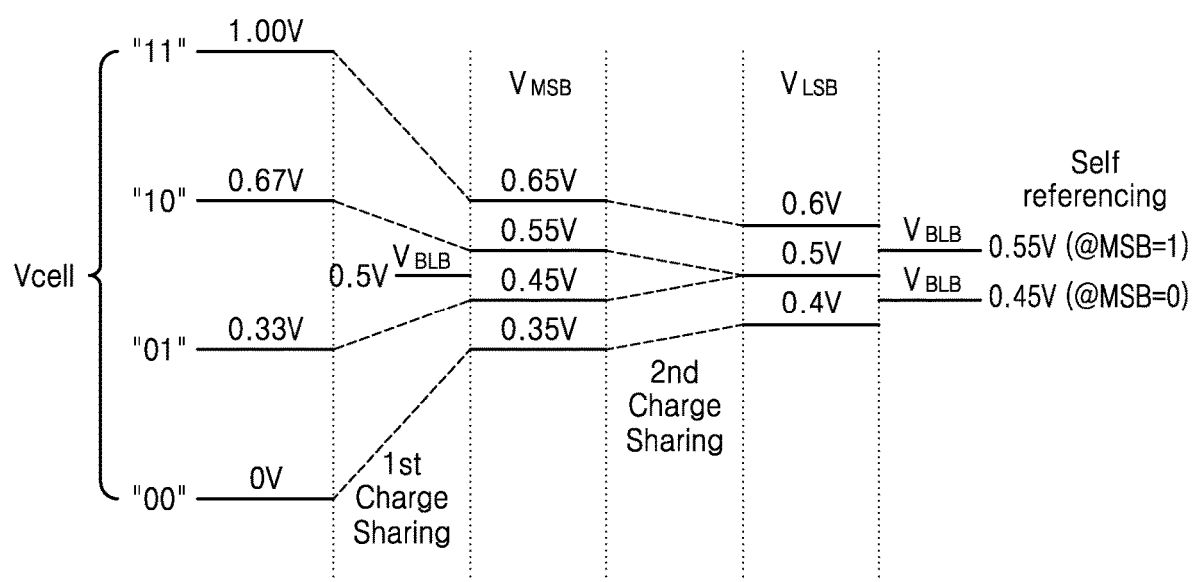
FIG. 13 is a diagram for describing multi-bit data of a memory cell sensed by the even sense amplifier of FIG. 11A and the odd sense amplifier of FIG. 11B.

FIG. 13 is a diagram for describing multi-bit data of a memory cell sensed by the even sense amplifier BLSA_E_11 of FIG. 11A and the odd sense amplifier BLSA_O_11 of FIG. 11B. Referring to FIG. 13, the cell voltage Vcell of the memory cell MC may be represented by an MSB and an LSB of 2-bit data. Thus, the cell voltage Vcell may be represented by a combination of bits "00", "01", "10", and "11". For example, when the power voltage VINTA is 1 V, bit combinations may be set to have voltage differences therebetween from about 330 mV to about 340 mV. In other words, the cell voltage Vcell of 0 V may represent a bit combination "00", the cell voltage Vcell of 0.33 V may represent a bit combination "01", the cell voltage Vcell of 0.67 V may represent a bit combination "10", and the cell voltage Vcell of 1.0 V may represent a bit combination "11".

In the even sense amplifier BLSA_E_11 and the odd sense amplifier BLSA_O_11 for sensing MSB data of the memory cell MC, when a first charge sharing operation is performed between charges stored in the cell capacitor CC and charges stored in the bit line BL, the bit line BL is captured at a certain MSB voltage $V_{MSB}$. The bit line BL may transit from the level of the pre-charge voltage VPRE, i.e., 0.5 V, to the level of the MSB voltage $V_{MSB}$. At this time, the complementary bit line BLB may maintain the level of the pre-charge voltage VPRE.

For example, due to the first charge sharing operation for the cell voltage Vcell of 0 V of the bit combination "00", the voltage level of the bit line BL may be captured to the level of the MSB voltage $V_{MSB}$ of about 0.35 V. Due to the first charge sharing operation for the cell voltage Vcell of 0.33 V of the bit combination "01", the voltage level of the bit line BL may be captured to the level of the MSB voltage $V_{MSB}$ of about 0.45 V. Due to the first charge sharing operation for the cell voltage Vcell of 0.67 V of the bit combination "10", the voltage level of the bit line BL may be captured to the level of the MSB voltage $V_{MSB}$ of about 0.55 V. Due to the first charge sharing operation for the cell voltage Vcell of 1.0 V of the bit combination "11", the voltage level of the bit line BL may be captured to the level of the MSB voltage $V_{MSB}$ of about 0.65 V.

Due to the first charge sharing operation, the voltage levels of the bit line BL corresponding to bit combinations "00", "01", "10", and "11" are set to MSB voltages $V_{MSB}$ of about 0.35 V, 0.45 V, 0.55 V, and 0.65 V, respectively. At this time, the complementary bit line BLB will maintain the level of the pre-charge voltage VPRE of 0.5 V. The MSB voltages $V_{MSB}$ of the bit line BL corresponding to the bit combinations "00", "01", "10", and "11" have certain voltage differences with respect to a complementary bit line voltage $V_{BLB}$ of 0.5 V, that is, −150 mV, −50 mV, 50 mV, and 150 mV, respectively.

In the even sense amplifier BLSA_E_11 and the odd sense amplifier BLSA_O_11 for sensing LSB data of the memory cell MC, when a second charge sharing operation including charge sharing occurring between charges stored in the complementary bit line BLB and charges stored in the first sensing bit line SBL1 and charging sharing occurring between charges stored in the bit line BL and charges stored in the first complementary sensing bit line SBLB1 is performed, a selected bit line BL is captured to a certain LSB voltage $V_{LSB}$. The selected bit line BL may transit from the MSB voltage $V_{MSB}$ to the LSB voltage $V_{MSB}$.

For example, the voltage level of the bit line BL having the MSB voltage $V_{MSB}$ of 0.35 V of the bit combination "00" may be captured to the LSB voltage $V_{LSB}$ of about 0.4 V due to the second charge sharing operation. At this time, the voltage level of the complementary bit line BLB may be captured to the complementary bit line voltage $V_{BLB}$ of about 0.45 V. The voltage level of the bit line BL having the MSB voltage $V_{MSB}$ of 0.45 V of the bit combination "01" may be captured to the LSB voltage $V_{LSB}$ of about 0.5 V due to the second charge sharing operation, and the complementary bit line voltage $V_{BLB}$ may be captured to about 0.45 V. The voltage level of the bit line BL having the MSB voltage $V_{MSB}$ of 0.55 V of the bit combination "10" may be captured to the LSB voltage $V_{LSB}$ of about 0.5 V due to the second charge sharing operation, and the complementary bit line voltage $V_{BLB}$ may be captured to about 0.55 V. The voltage level of the bit line BL having the MSB voltage $V_{MSB}$ of 0.65 V of the bit combination "11" may be captured to the LSB voltage $V_{LSB}$ of about 0.6 V due to the second charge sharing operation, and the complementary bit line voltage $V_{BLB}$ may be captured to about 0.55 V.

The voltage levels of the bit line BL of the bit combinations "00" and "01" due to the second charge sharing operation are respectively captured to LSB voltages $V_{LSB}$ of about 0.4 V and 0.5 V, and the level of the complementary bit line voltage $V_{BLB}$ is captured to about 0.45 V. Also, the voltage levels of the bit line BL of the bit combinations "10" and "11" due to the second charge sharing operation are respectively captured to LSB voltages $V_{LSB}$ of about 0.5 V and 0.6 V, and the level of the complementary bit line voltage $V_{BLB}$ is captured to about 0.55 V. The LSB voltages $V_{LSB}$ of the bit line BL corresponding to the bit combinations "00", "01", "10", and "11" have certain voltage differences with respect to the complementary bit line voltage $V_{BLB}$, that is, −50 mV, 50 mV, −50 mV, and 50 mV, respectively. In other words, LSB voltages $V_{LSB}$ respectively corresponding to the bit combinations "00", "01", "10", and "11" serve as self-references that do not need a separate reference voltage for sensing the LSB voltage $V_{LSB}$.

FIGS. 14A to 21B are diagrams for describing layouts of a sense amplifier and layout methods according to example embodiments of the inventive concept. FIGS. 14A to 21B show some of layouts of the arrangement of the sense amplifier 160a shown in FIG. 3. In FIGS. 14A to 21B, the even sense amplifiers BLSA_E 300 and 302 and the odd sense amplifiers BLSA_O 301 and 303 may be alternately arranged in the sense amplifier 160a. In the even sense amplifier BLSA_E and the odd sense amplifier BLSA_O of FIGS. 14A to 21B, a pair of PMOS transistors including the first PMOS transistor P_1 and the second PMOS transistor P_2 of the sense amplifier 160, a pair of NMOS transistors including the first NMOS transistor N_1 and the second NMOS transistor N_2, the first isolation transistor ISO_1, the second isolation transistor ISO_2, the first offset cancelation transistor OC_1, the second offset cancelation transistor OC_2, the first equalizing transistor EQ1, the second equalizing transistor EQ2, and the third equalizing transistor EQ3 shown in FIG. 7 are arranged.

Figure 14A:
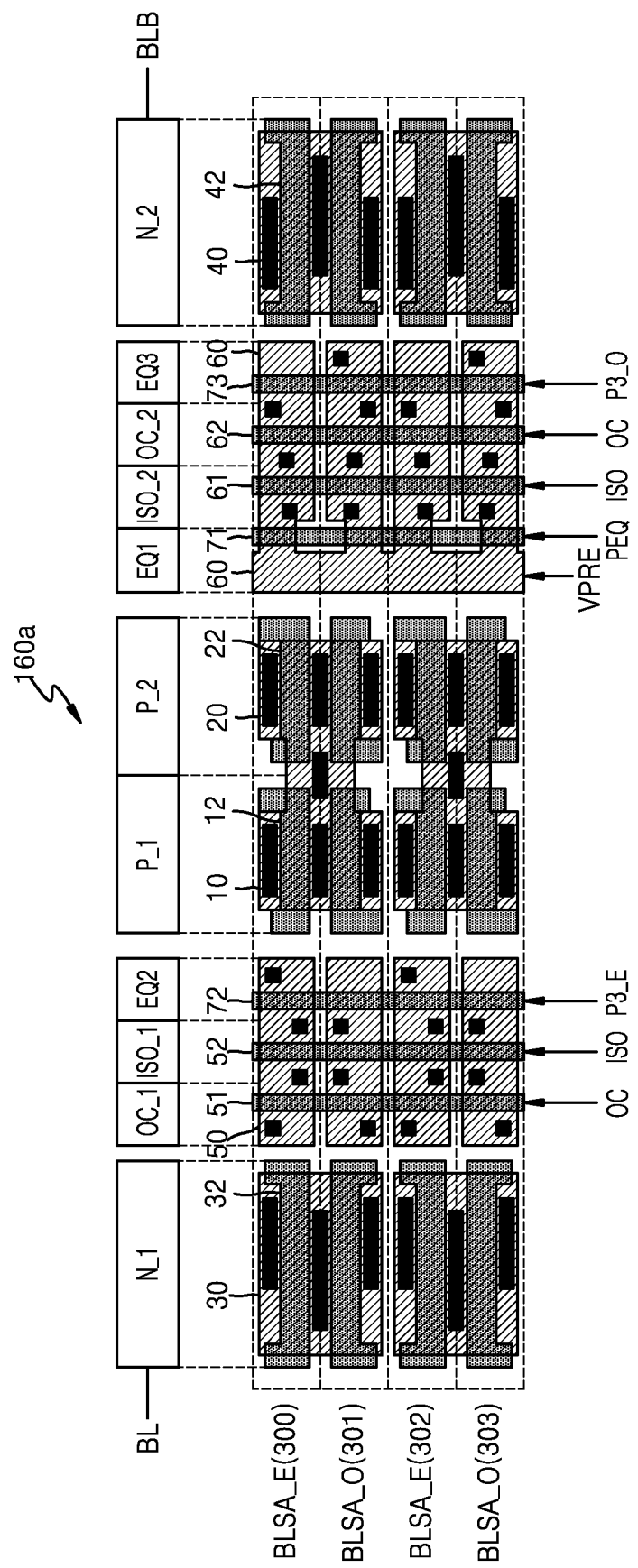
FIGS. 14A to 21B are diagrams for describing layouts of a sense amplifier and layout methods according to example embodiments of the inventive concept.

Referring to FIG. 14A, the even sense amplifier BLSA_E and the odd sense amplifier BLSA_O are arranged between the bit line BL and the complementary bit line BLB. The pairs of PMOS transistors, that is, first PMOS transistors P_1 and second PMOS transistors P_2 may be arranged in center regions of the even sense amplifier BLSA_E and the odd sense amplifier BLSA_O, first NMOS transistors N_1 of the even sense amplifier BLSA_E and the odd sense amplifier BLSA_O may be arranged close to the bit line BL, and second NMOS transistors N_2 may be arranged close to the complementary bit line BLB. In the present embodiment, a pair of NMOS transistors, that is, the first NMOS transistor N_1 and the second NMOS transistor N_2 may be arranged in edge regions of the sense amplifier 160a opposite to each other. In the present embodiment, a pair of PMOS transistors, that is, the first PMOS transistor P_1 and the second PMOS transistor P_2 may be arranged between a pair of NMOS transistors, that is, the first NMOS transistor N_1 and the second NMOS transistor N_2.

The first PMOS transistor P_1 may include an active pattern 10 and a gate pattern 12, and the second PMOS transistor P_2 may include an active pattern 20 and a gate pattern 22. The active pattern 10 becomes a source region and a drain region of the first PMOS transistor P_1, and the active pattern 20 becomes a source region and a drain region of the second PMOS transistor P_2. The gate pattern 12 is a conductive line connected to the sensing bit line SBL, and the gate pattern 22 is a conductive line connected to the complementary sensing bit line SBLB.

The first NMOS transistor N_1 may include an active pattern 30 and a gate pattern 32, and the second NMOS transistor N_2 may include an active pattern 40 and a gate pattern 42. The active pattern 30 becomes a source region and a drain region of the first NMOS transistor N_1, and the active pattern 40 becomes a source region and a drain region of the second NMOS transistor N_2. The gate pattern 32 is a conductive line connected to the bit line BL, and the gate pattern 42 is a conductive line connected to the complementary bit line BLB.

The first offset cancelation transistor OC_1, the first isolation transistor ISO_1, and the second equalizing transistor EQ2 may be arranged between the first NMOS transistor N_1 and the first PMOS transistor P_1. The first offset cancelation transistor OC_1 may be arranged adjacent to the first NMOS transistor N_1, and the second equalizing transistor EQ2 may be arranged adjacent to the first PMOS transistor P_1. The first isolation transistor ISO_1 may be arranged between the first offset cancelation transistor OC_1 and the second equalizing transistor EQ2.

The first offset cancelation transistor OC_1, the first isolation transistor ISO_1, and the second equalizing transistor EQ2 may share a common active pattern 50 and may include corresponding gate patterns 51, 52, and 72, respectively. The common active pattern 50 becomes a source region and a drain region of the first offset cancelation transistor OC_1, the first isolation transistor ISO_1, and the second equalizing transistor EQ2. The gate pattern 51 is a conductive line through which the offset cancelation signal OC is transmitted, the gate pattern 52 is a conductive line through which the isolation signal ISO is transmitted, and the gate pattern 72 is a conductive line through which the even equalizing signal P3_E is transmitted.

The first equalizing transistor EQ1, the second isolation transistor ISO_2, the second offset cancelation transistor OC_2, and the third equalizing transistor EQ3 may be arranged between the second PMOS transistor P_2 and the second NMOS transistor N_2. The first equalizing transistor EQ1 may be arranged adjacent to the second PMOS transistor P_2, and the third equalizing transistor EQ3 may be arranged adjacent to the second NMOS transistor N_2. The second isolation transistor ISO_2 and the second offset cancelation transistor OC_2 may be arranged between the first equalizing transistor EQ1 and the third equalizing transistor EQ3. The second isolation transistor ISO_2 may be arranged adjacent to the first equalizing transistor EQ1, and the second offset cancelation transistor OC_2 may be arranged adjacent to the third equalizing transistor EQ3.

The first equalizing transistor EQ1, the second isolation transistor ISO_2, the second offset cancelation transistor OC_2, and the third equalizing transistor EQ3 may share a common active pattern 60 and include corresponding gate patterns 71, 61, 62, and 73, respectively. The active pattern 60 becomes a source region and a drain region of the first equalizing transistor EQ1, the second isolation transistor ISO_2, the second offset cancelation transistor OC_2, and the third equalizing transistor EQ3. The gate pattern 71 is a conductive line through which the equalizing signal PEQ is transmitted, the gate pattern 61 is a conductive line through which the isolation signal ISO is transmitted, the gate pattern 62 is a conductive line through which the offset cancelation signal OC is transmitted, and the gate pattern 73 is a conductive line through which the odd equalizing signal P3_0 is transmitted.

Figure 14B:
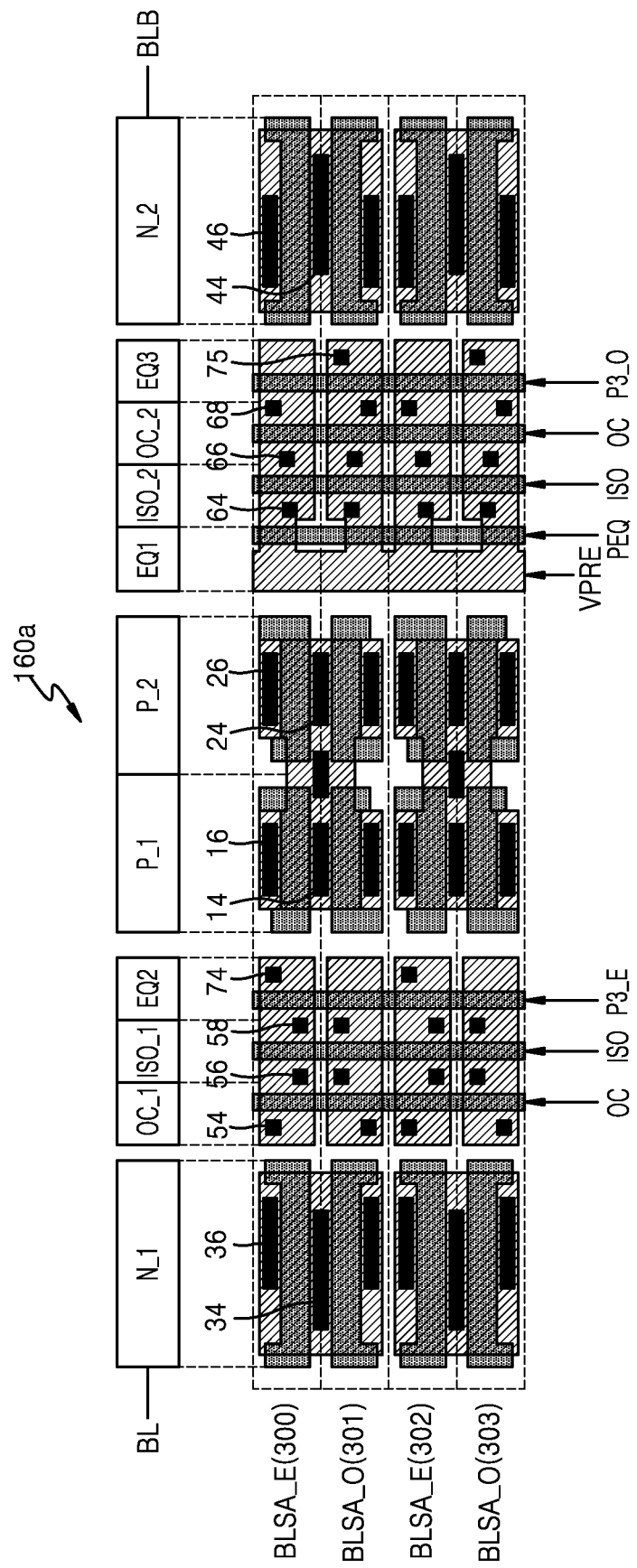

FIG. 14B is a diagram for describing contact patterns in the layout of the sense amplifier 160*a* of FIG. 14A. Referring to FIG. 14B, in the even sense amplifier BLSA_E and the odd sense amplifier BLSA_O, the first PMOS transistor P_1 may include, in the source region, a first contact pattern 14 connected to a conductive line for transmitting the first sensing drive signal LA therethrough and, in the drain region, a second contact pattern 16 connected to a conductive line of the complementary sensing bit line SBLB. The second PMOS transistor P_2 may include, in the source region, a first contact pattern 24 connected to a conductive line for transmitting the first sensing drive signal LA therethrough and, in the drain region, a second contact pattern 26 connected to a conductive line of the sensing bit line SBL. The first NMOS transistor N_1 may include, in the source region, a first contact pattern 34 connected to a conductive line for transmitting the second sensing drive signal LAB therethrough and, in the drain region, a second contact pattern 36 connected to a conductive line of the complementary sensing bit line SBLB. The second NMOS transistor N_2 may include, in the source region, a first contact pattern 44 connected to a conductive line for transmitting the second sensing drive signal LAB therethrough and, in the drain region, a second contact pattern 46 connected to a conductive line of the sensing bit line SBL.

In the even sense amplifier BLSA_E and the odd sense amplifier BLSA_O, the first offset cancelation transistor OC_1 may include, in the source region, a first contact pattern 54 connected to a conductive line of the complementary sensing bit line SBLB and, in the drain region, a second contact pattern 56 connected to a conductive line of the bit line BL. The first isolation transistor ISO_1 may include, in the source region, a first contact pattern 56 connected to the conductive line of the bit line BL and, in the drain region, a second contact pattern 58 connected to the conductive line of the sensing bit line SBL. The first equalizing transistor EQ1 may include, in the source region and the drain region of the first equalizing transistor EQ1 to which a conductive line of the pre-charge voltage VPRE is connected, first contact patterns 64 connected to the conductive line of the complementary sensing bit line SBLB. The second isolation transistor ISO_2 may include, in the source region, a first contact pattern 64 connected to the conductive line of the complementary sensing bit line SBLB and, in the drain region, a second contact pattern 66 connected to the conductive line of the complementary bit line BLB. The second offset cancelation transistor OC_2 may include, in the source region, a first contact pattern 66 connected to the conductive line of the complementary bit line BLB and a second contact pattern 68 connected to the conductive line of the sensing bit line SBL.

Both the even sense amplifier BLSA_E and the odd sense amplifier BLSA_O may include contact patterns 14, 16, 24, and 26 of the first PMOS transistor P_1 and the second PMOS transistor P_2, contact patterns 34, 36, 44, and 46 of the first NMOS transistor N_1 and the second NMOS transistor N_2, contact patterns 54, 56, and 58 of the first offset cancelation transistor OC_1 and the first isolation transistor ISO_1, and contact patterns 64, 66, and 68 of the first equalizing transistor EQ1, the second isolation transistor ISO_2, and the second offset cancelation transistor OC_2.

However, in the even sense amplifier BLSA_E and the odd sense amplifier BLSA_O, contact patterns of the second equalizing transistor EQ2 and the third equalizing transistor EQ3 may be arranged differently.

In the even sense amplifier BLSA_E, the second equalizing transistor EQ2 may include, in the source region, a first contact pattern 58 connected to the conductive line of the sensing bit line SBL and, in the drain region, a second contact pattern 74 connected to the bit line of the complementary sensing bit line SBLB. The third equalizing transistor EQ3 includes, in the source region, a first contact pattern 68 connected to the conductive line of the sensing bit line SBL and does not include a contact pattern in the drain region.

In the odd sense amplifier BLSA_O, the second equalizing transistor EQ2 includes, in the source region, the first contact pattern 58 connected to the conductive line of the sensing bit line SBL and does not include a contact pattern in the drain region. The third equalizing transistor EQ3 may include, in the source region, the first contact pattern 68 connected to the conductive line of the sensing bit line SBL and, in the drain region, a second contact pattern 75 connected to the conductive line of the complementary sensing bit line SBLB.

Hereinafter, layouts of FIGS. 15A to 17B will be described based on differences from the layouts of FIGS. 14A and 14B.

Figure 15A:
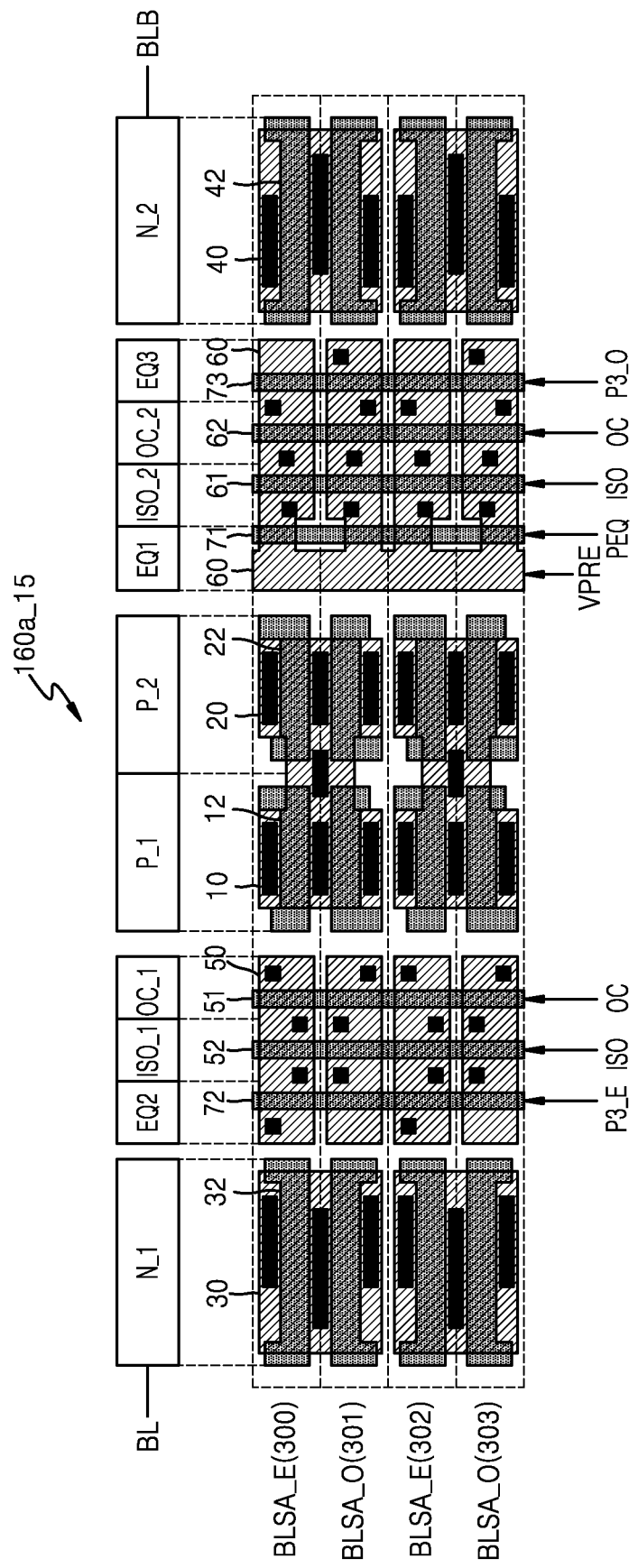
Figure 15B:
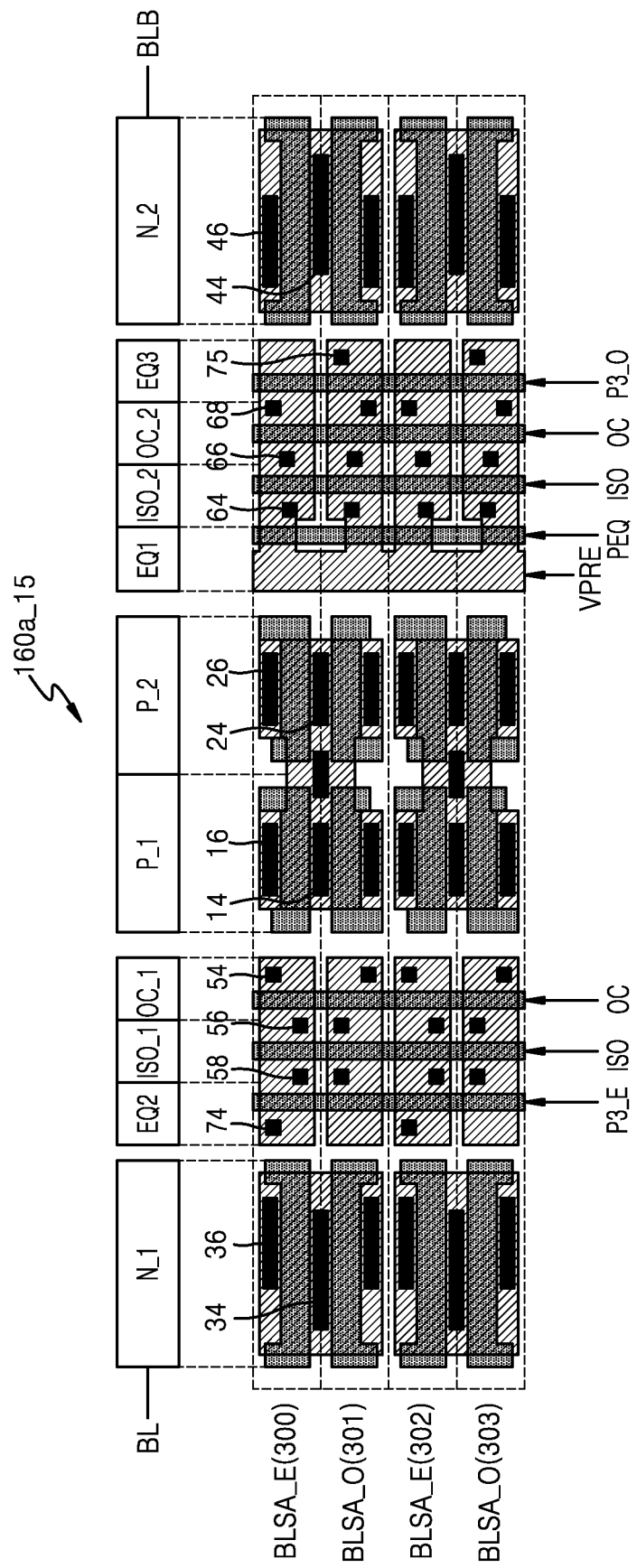

Referring to FIGS. 15A and 15B, as compared to the layouts of the sense amplifier 160*a* of FIGS. 14A and 14B, in a sense amplifier 160*a*_15, locations of the first offset cancelation transistor OC_1 and the second equalizing transistor EQ2 arranged between the first NMOS transistor N_1 and the first PMOS transistor P_1 are changed. The second equalizing transistor EQ2 may be arranged adjacent to the first NMOS transistor N_1, and the first offset cancelation transistor OC_1 may be arranged adjacent to the first PMOS transistor P_1.

Figure 16A:
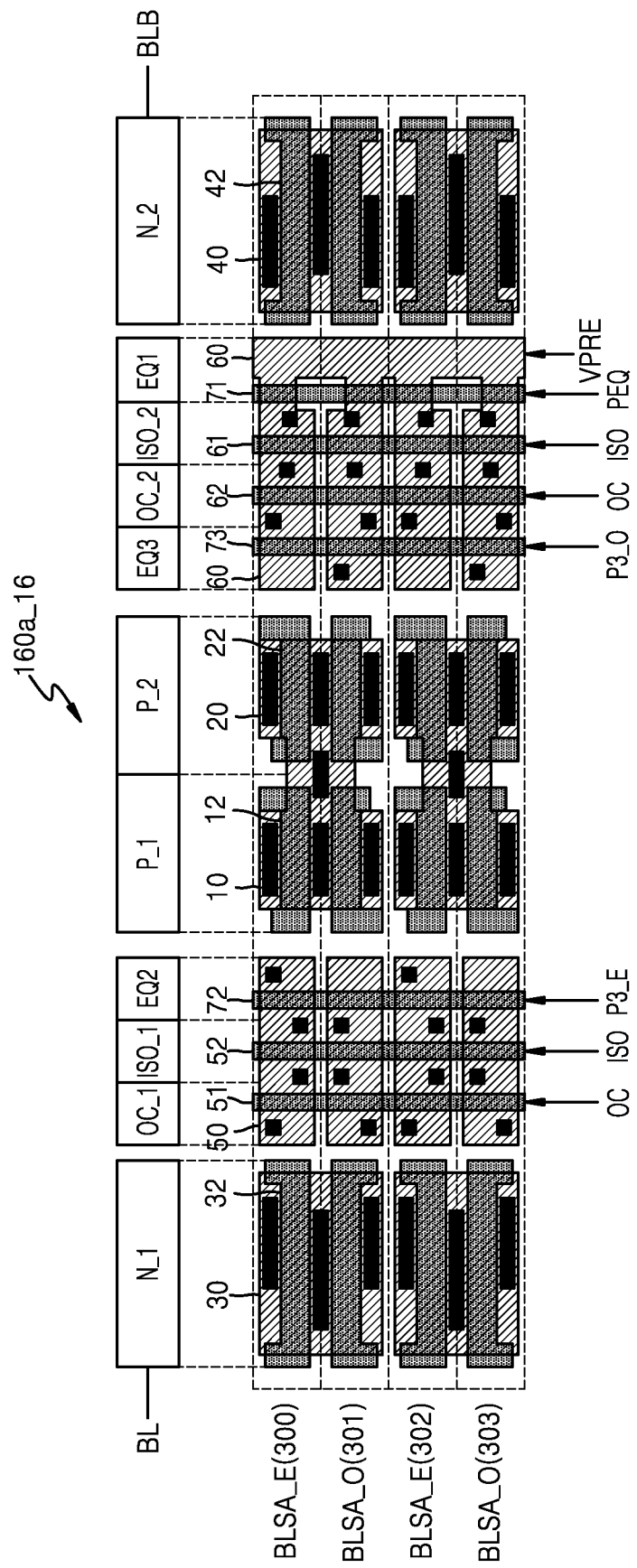
Figure 16B:
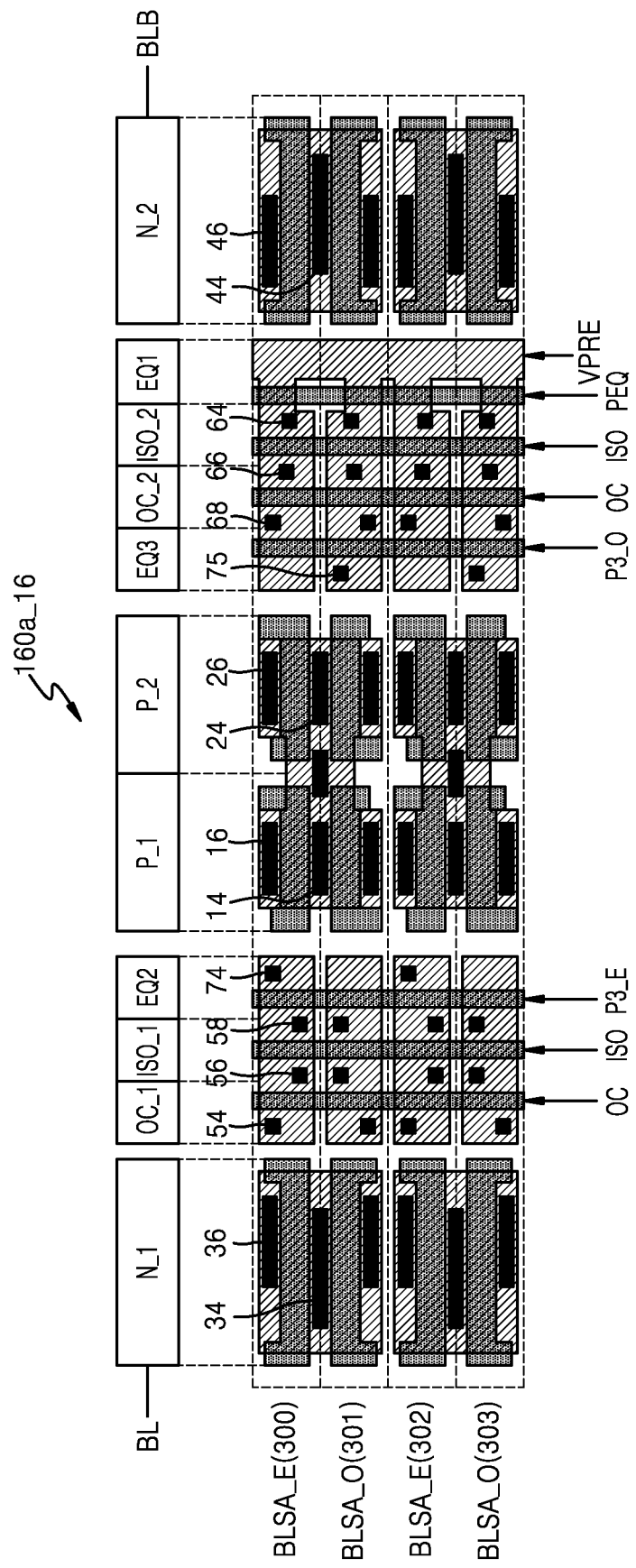

Referring to FIGS. 16A and 16B, as compared to the layouts of the sense amplifier 160a of FIGS. 14A and 14B, in a sense amplifier 160a_16, locations of the first equalizing transistor EQ1, the second isolation transistor ISO_2, the second offset cancelation transistor OC_2, and the third equalizing transistor EQ3 arranged between the second PMOS transistor P_2 and the second NMOS transistor N_2 are changed. The third equalizing transistor EQ3 may be arranged adjacent to the second PMOS transistor P_2, the first equalizing transistor EQ1 may be arranged adjacent to the second NMOS transistor N_2, the second offset cancelation transistor OC_2 may be arranged adjacent to the third equalizing transistor EQ3, and the second isolation transistor ISO_2 may be arranged adjacent to the first equalizing transistor EQ1.

Figure 17A:
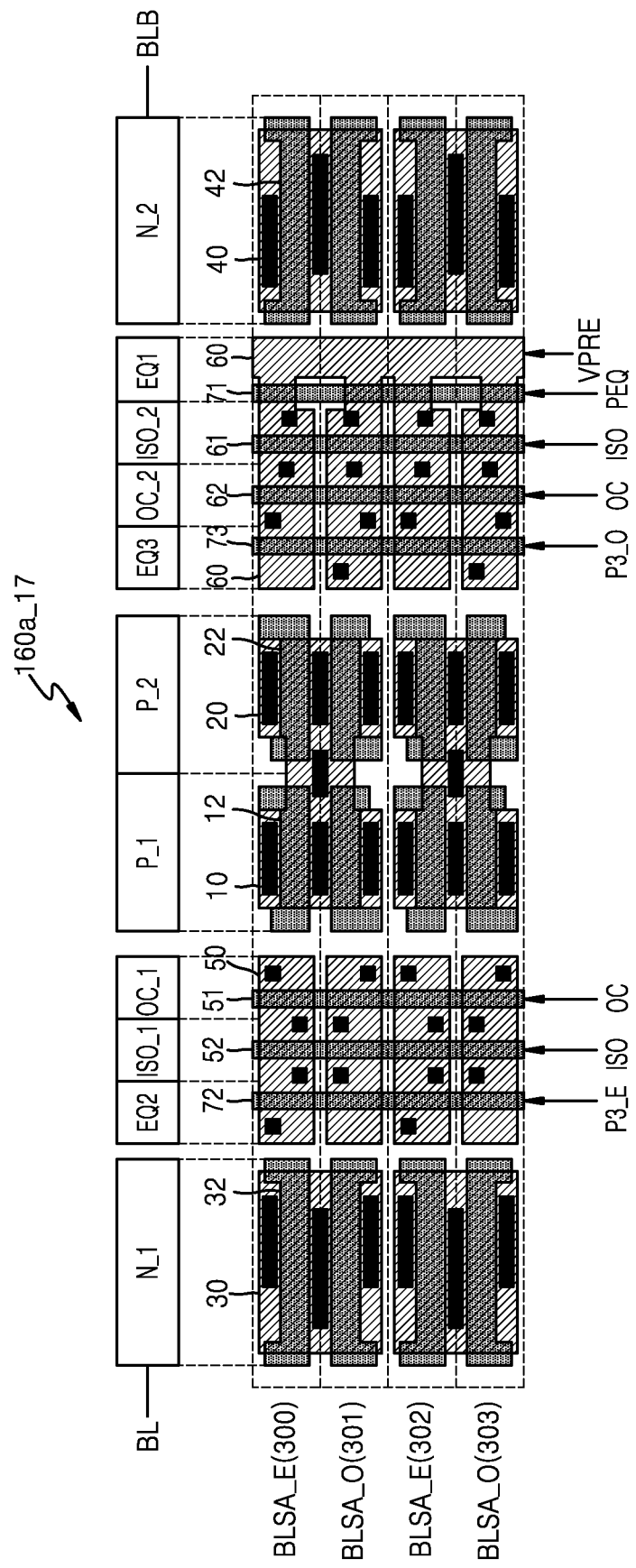
Figure 17B:
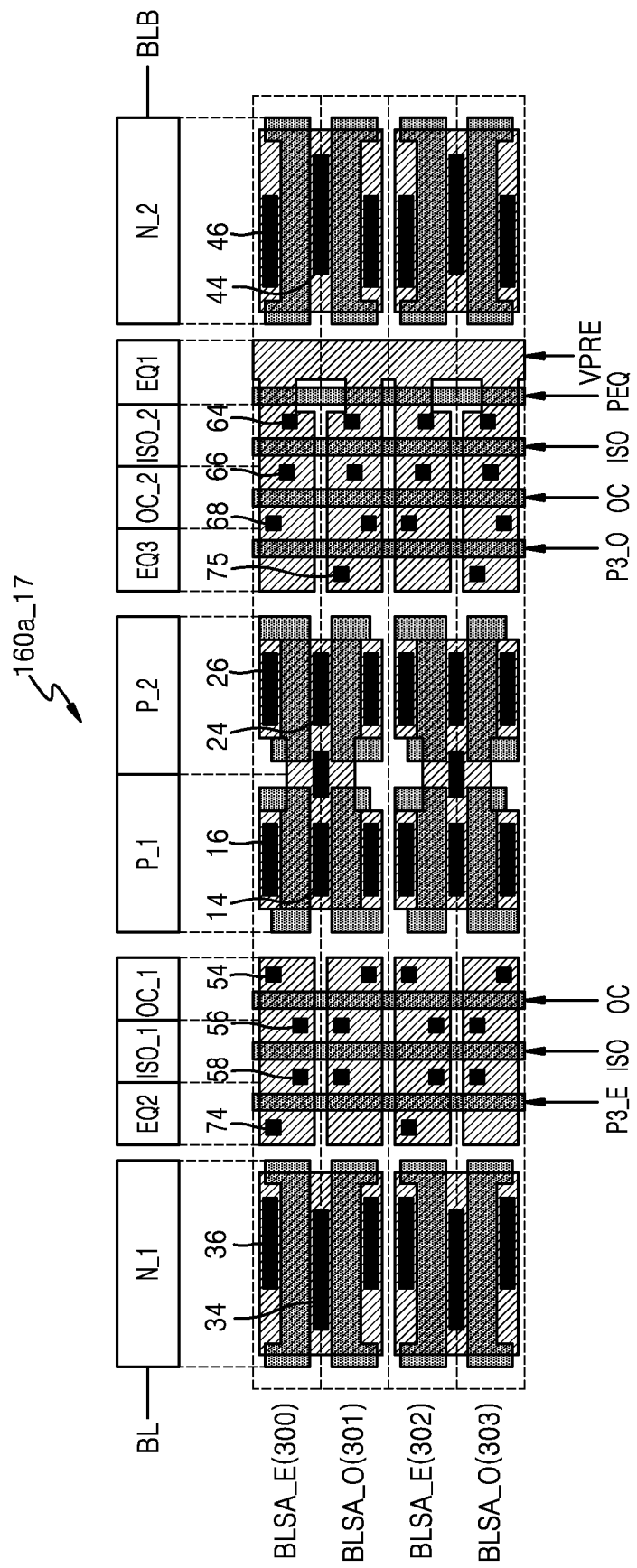

Referring to FIGS. 17A and 17B, as compared to the layouts of the sense amplifier 160a of FIGS. 14A and 14B, in a sense amplifier 160a_17, locations of the first offset cancelation transistor OC_1 and the second equalizing transistor EQ2 arranged between the first NMOS transistor N_1 and the first PMOS transistor P_1 are changed, and the locations of the first equalizing transistor EQ1, the second isolation transistor ISO_2, the second offset cancelation transistor OC_2, and the third equalizing transistor EQ3 arranged between the second PMOS transistor P_2 and the second NMOS transistor N_2 are changed.

The second equalizing transistor EQ2 may be arranged adjacent to the first NMOS transistor N_1, and the first offset cancelation transistor OC_1 may be arranged adjacent to the first PMOS transistor P_1. The third equalizing transistor EQ3 may be arranged adjacent to the second PMOS transistor P_2, the first equalizing transistor EQ1 may be arranged adjacent to the second NMOS transistor N_2, the second offset cancelation transistor OC_2 may be arranged adjacent to the third equalizing transistor EQ3, and the second isolation transistor ISO_2 may be arranged adjacent to the first equalizing transistor EQ1.

Figure 18A:
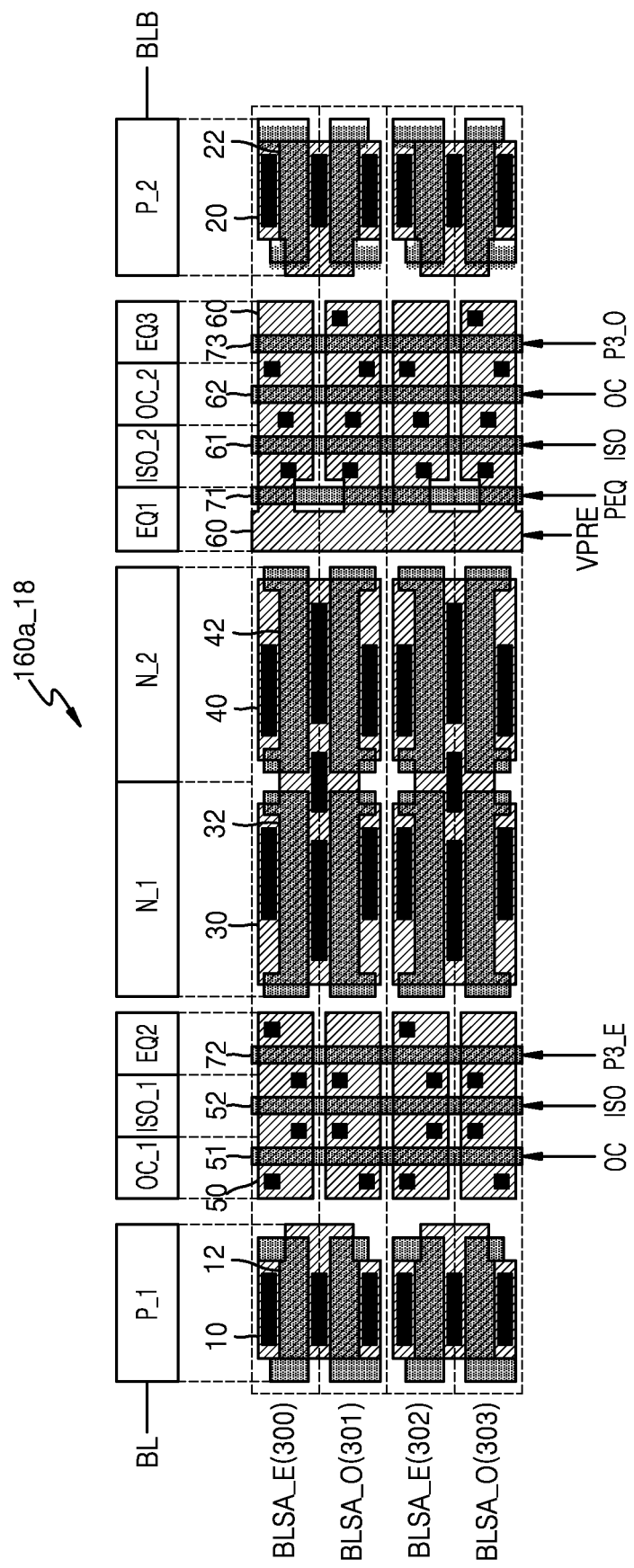
Figure 18B:
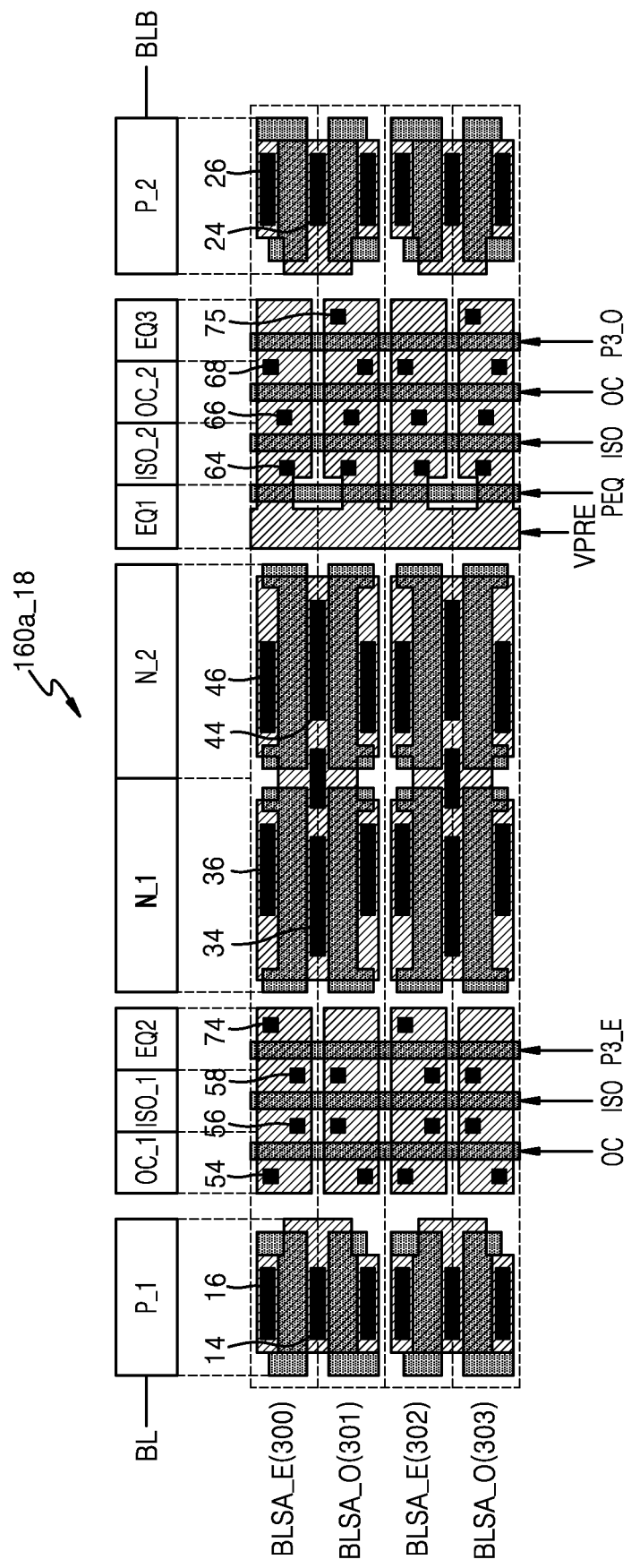

Referring to FIGS. 18A and 18B, as compared to the layouts of the sense amplifier 160a of FIGS. 14A and 14B, in a sense amplifier 160a_18, a pair of NMOS transistors, that is, the first NMOS transistor N_1 and the second NMOS transistor N_2 are arranged in the center regions of the even sense amplifier BLSA_E and the odd sense amplifier BLSA_O, the first PMOS transistors P_1 of the even sense amplifier BLSA_E and the odd sense amplifier BLSA_O are arranged adjacent to the bit line BL, and the second PMOS transistors P_2 may be arranged adjacent to the complementary bit line BLB. In the present embodiment, a pair of PMOS transistors, that is, the first PMOS transistor P_1 and the second PMOS transistor P_2 may be arranged in edge regions of the sense amplifier 160a_18 opposite to each other. In the present embodiment, a pair of NMOS transistors, that is, the first NMOS transistor N_1 and the second NMOS transistor N_2 may be arranged between a pair of PMOS transistors, that is, the first PMOS transistor P_1 and the second PMOS transistor P_2.

The first offset cancelation transistor OC_1, the first isolation transistor ISO_1, and the second equalizing transistor EQ2 may be arranged between the first PMOS transistor P_1 and the first NMOS transistor N_1. The first offset cancelation transistor OC_1 may be arranged adjacent to the first PMOS transistor P_1, the second equalizing transistor EQ2 may be arranged adjacent to the first NMOS transistor N_1, and the first isolation transistor ISO_1 may be arranged between the first offset cancelation transistor OC_1 and the second equalizing transistor EQ2.

The first equalizing transistor EQ1, the second isolation transistor ISO_2, the second offset cancelation transistor OC_2, and the third equalizing transistor EQ3 may be arranged between the second NMOS transistor N_2 and the second PMOS transistor P_2. The first equalizing transistor EQ1 may be arranged adjacent to the second NMOS transistor N_2, and the third equalizing transistor EQ3 may be arranged adjacent to the second PMOS transistor P_2. The second isolation transistor ISO_2 and the second offset cancelation transistor OC_2 may be arranged between the first equalizing transistor EQ1 and the third equalizing transistor EQ3. The second isolation transistor ISO_2 may be arranged adjacent to the first equalizing transistor EQ1, and the second offset cancelation transistor OC_2 may be arranged adjacent to the third equalizing transistor EQ3.

Hereinafter, layouts of FIGS. 19A to 21B will be described based on differences from the layouts of FIGS. 18A and 18B.

Figure 19A:
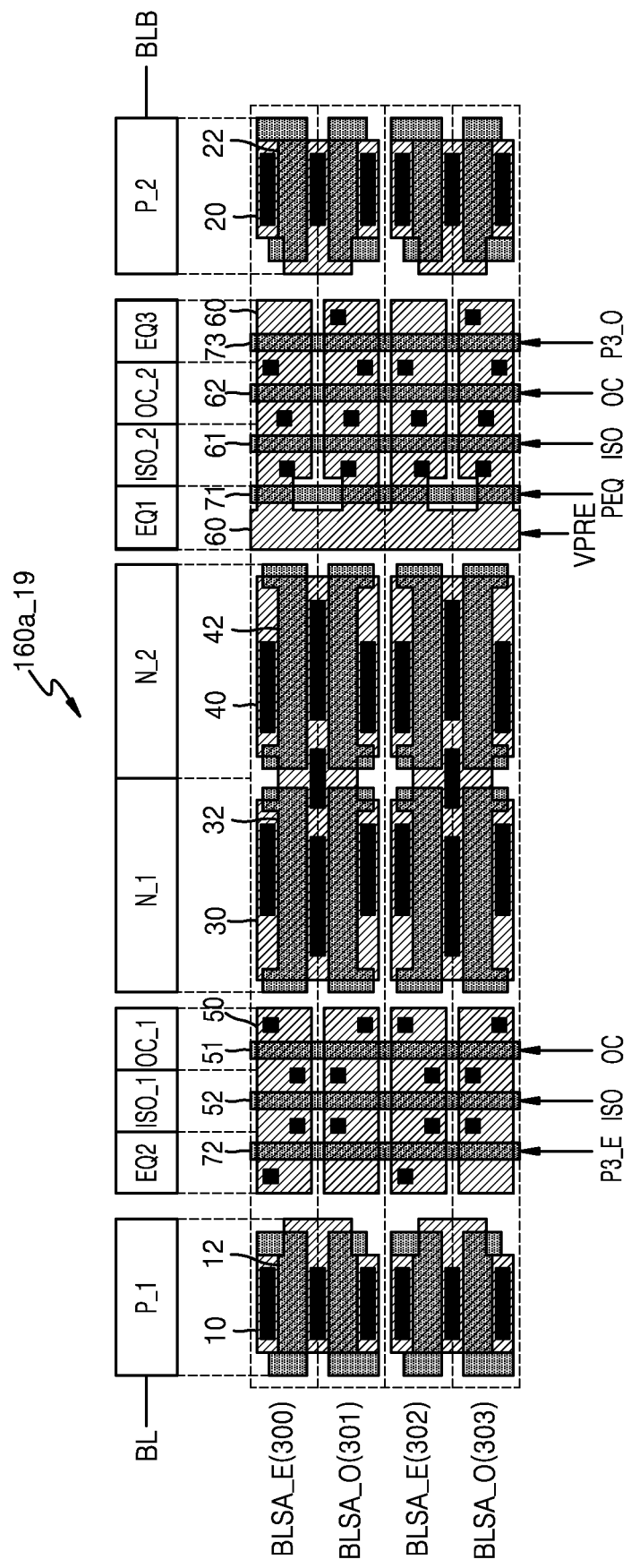
Figure 19B:
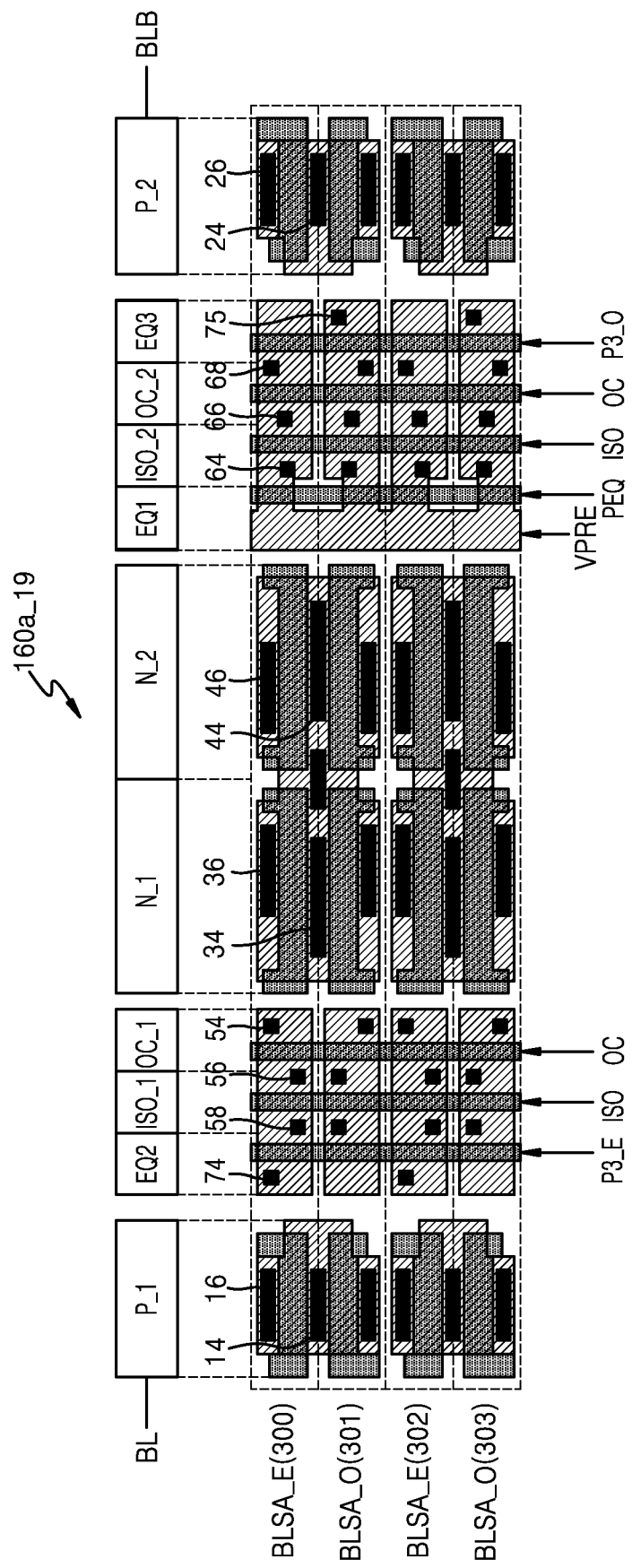

Referring to FIGS. 19A and 19B, as compared to the layouts of the sense amplifier 160a_18 of FIGS. 18A and 18B, in a sense amplifier 160a_19, locations of the first offset cancelation transistor OC_1 and the second equalizing transistor EQ2 arranged between the first PMOS transistor P_1 and the first NMOS transistor N_1 are changed. The second equalizing transistor EQ2 may be arranged adjacent to the first PMOS transistor P_1, and the first offset cancelation transistor OC_1 may be arranged adjacent to the first NMOS transistor N_1.

Figure 20A:
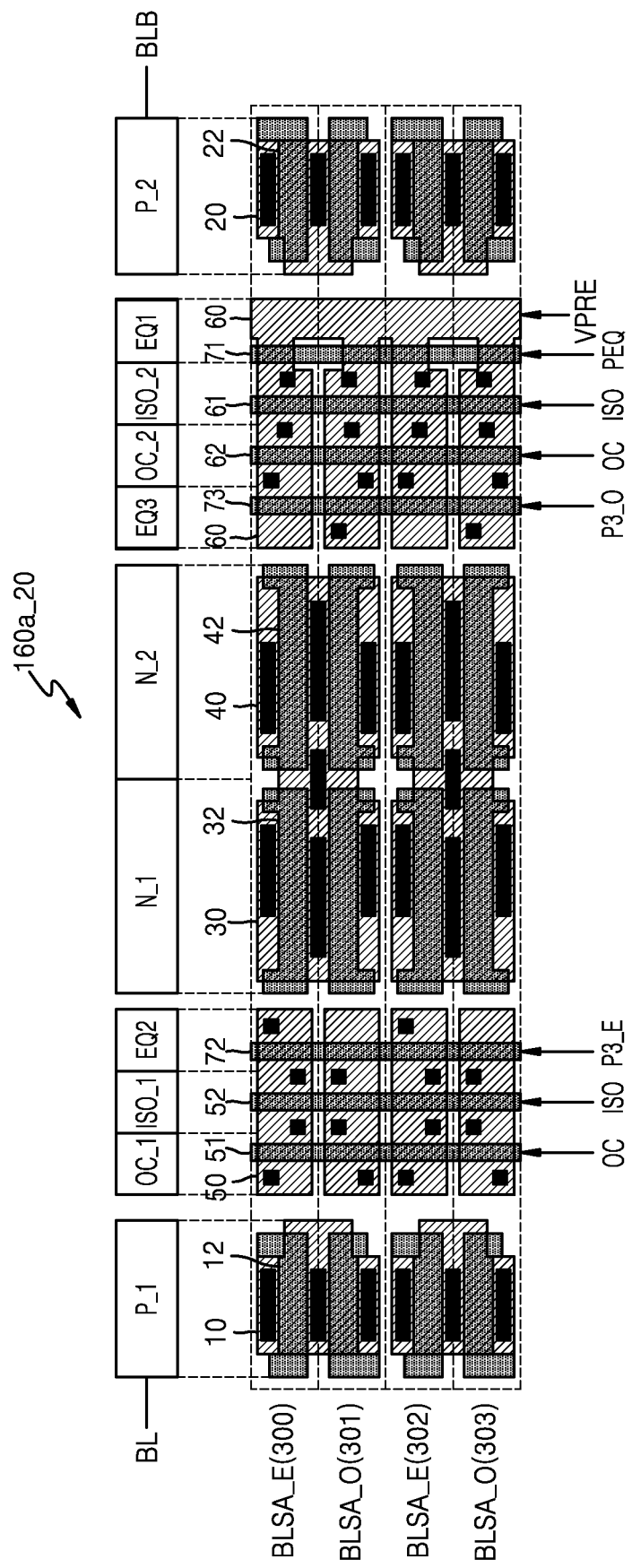
Figure 20B:
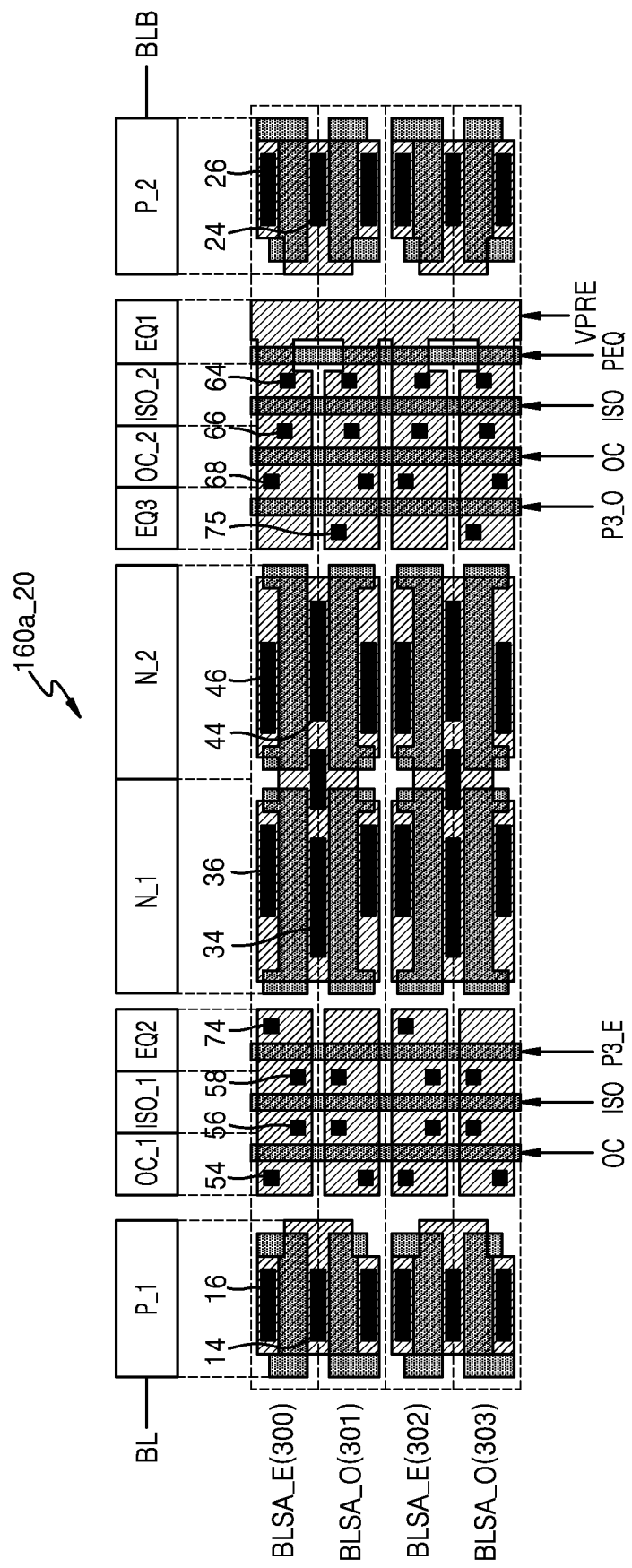

Referring to FIGS. 20A and 20B, as compared to the layouts of the sense amplifier 160a_18 of FIGS. 18A and 18B, in a sense amplifier 160a_20, locations of the first equalizing transistor EQ1, the second isolation transistor ISO_2, the second offset cancelation transistor OC_2, and the third equalizing transistor EQ3 arranged between the second NMOS transistor N_2 and the second PMOS transistor P_2 are changed. The third equalizing transistor EQ3 may be arranged adjacent to the second NMOS transistor N_2, the first equalizing transistor EQ1 may be arranged adjacent to the second PMOS transistor P_2, the second offset cancelation transistor OC_2 may be arranged adjacent to the third equalizing transistor EQ3, and the second isolation transistor ISO_2 may be arranged adjacent to the first equalizing transistor EQ1.

Figure 21A:
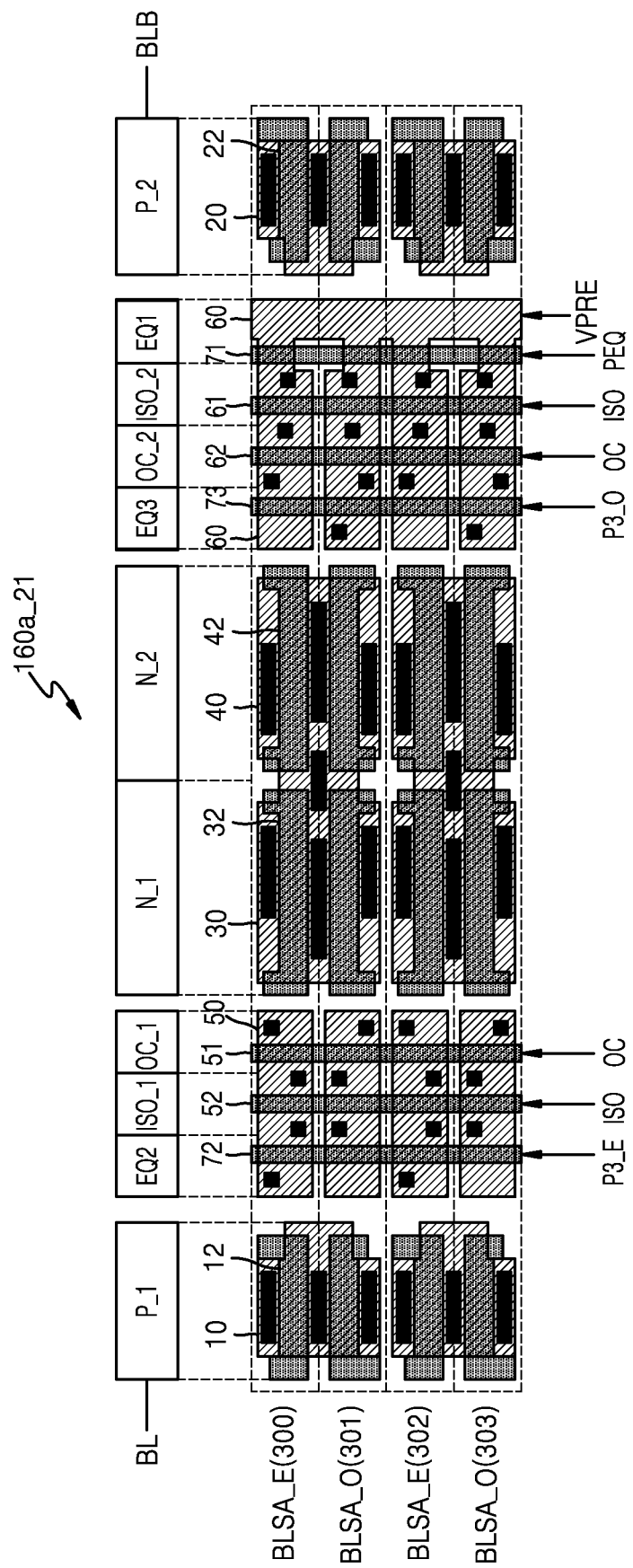
Figure 21B:
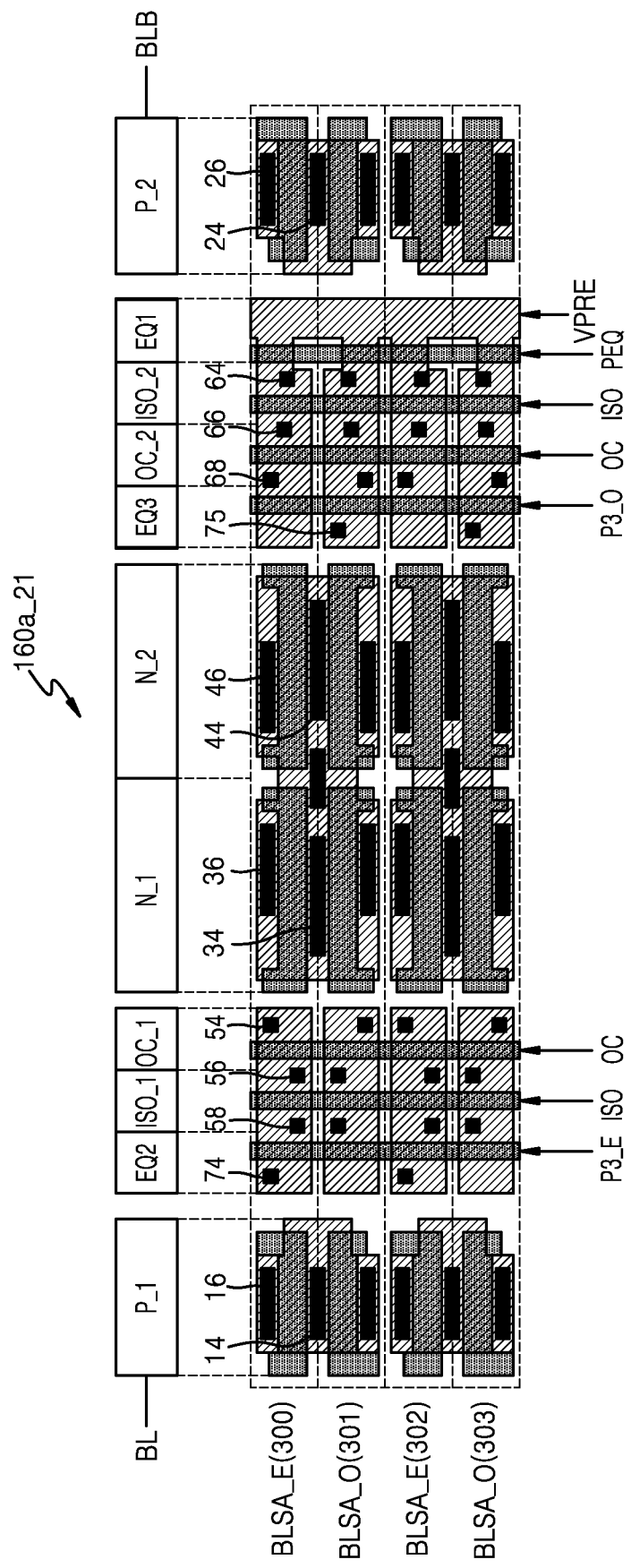

Referring to FIGS. 21A and 21B, as compared to the layouts of the sense amplifier 160a_18 of FIGS. 18A and 18B, in a sense amplifier 160a_21, locations of the first offset cancelation transistor OC_1 and the second equalizing transistor EQ2 arranged between the first PMOS transistor P_1 and the first NMOS transistor N_1 are changed, and the locations of the first equalizing transistor EQ1, the second isolation transistor ISO_2, the second offset cancelation transistor OC_2, and the third equalizing transistor EQ3 arranged between the second NMOS transistor N_2 and the second PMOS transistor P_2 are changed.

The second equalizing transistor EQ2 may be arranged adjacent to the first PMOS transistor P_1, and the first offset cancelation transistor OC_1 may be arranged adjacent to the first NMOS transistor N_1. The third equalizing transistor EQ3 may be arranged adjacent to the second NMOS transistor N_2, the first equalizing transistor EQ1 may be arranged adjacent to the second PMOS transistor P_2, the second offset cancelation transistor OC_2 may be arranged adjacent to the third equalizing transistor EQ3, and the second isolation transistor ISO_2 may be arranged adjacent to the first equalizing transistor EQ1.

Figure 22:
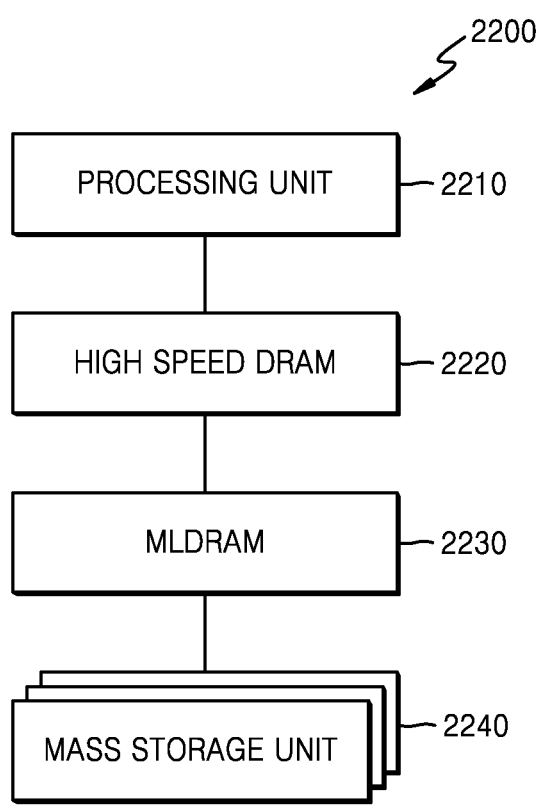
FIG. 22 is a block diagram showing an example in which a memory device including a sense amplifier according to embodiments of the inventive concept is applied to a system.

FIG. 22 is a block diagram showing an example in which a memory device including a sense amplifier according to embodiments of the inventive concept is applied to a system. Referring to FIG. 22, a system 2200 may include a processing unit 2210, a high-speed DRAM 2220, a multi-level DRAM 2230, and a large-capacity storage unit 2240. The system 2200 may be a general-purpose or special-purpose computer system like a mobile device, a personal computer, a server computer, a programmable household appliance, a main frame computer, etc.

Functional units described in the present embodiment may be classified as modules for implementation independence. For example, a module may be implemented as a custom VLSI circuit or a hardware circuit including off-the-shelf semiconductors like gate arrays, logic chips, transistors, or other discrete components. A module may be implemented as a programmable hardware device, e.g., a programmable gate array, a programmable gate logic, and a programmable gate device. Also, a module may also be implemented as software including executable codes, objects, procedures, or functions.

The processing unit 2210 may execute an operating system and a plurality of software systems and perform specific calculations or tasks. The processing unit 2210 may be a micro-processor or a central processing unit (CPU).

The high-speed DRAM 2220 is an operating memory of the system 2200 or a cache memory of the large-capacity storage unit 2240 and may store data for a short term or temporarily. The high-speed DRAM 2220 may be the same as or similar to the memory device 100 described in FIG. 1. For example, the high-speed DRAM 2220 may be a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3. SDRAM, a DDR4 SDRAM, etc.

The high-speed DRAM 2220 may include a memory cell storing a cell voltage and a sense amplifier for sensing a cell voltage as 1-bit data. The sense amplifier may include a sense amplifying circuit, which is connected between a bit line and a complementary bit line that are connected to memory cells and is configured to induce an offset voltage difference between the bit line and the complementary bit line, sample and sense a voltage change of the bit line according to first and second sensing drive signals, and adjust voltages of a sensing bit line and a complementary sensing bit line based on a sensed voltage change, and an equalizing circuit configured to equalize the sensing bit line and the complementary sensing bit line to a pre-charge voltage in response to an equalizing signal, an even equalizing signal, and an odd equalizing signal. The sense amplifier may include a first sense amplifier that samples a voltage change of a first bit line when the odd equalizing signal is disabled and a second sense amplifier that samples a voltage change of a second bit line when the even equalizing signal is disabled. The first sense amplifier and the second sense amplifier are alternately arranged, and the odd equalizing signal and the even equalizing signal may be disabled with a certain time difference.

The multi-level DRAM 2230 may be used to serve as a cache of the large-capacity storage unit 2240. The multi-level DRAM 2230 may be the same as or similar to the memory device 100 described in FIG. 1. The multi-level DRAM 2230 may include memory cell storing a cell voltage and a sense amplifier for sensing a cell voltage as an MSB and an LSB of 2-bit data. The sense amplifier may include a first sense amplifying circuit, which is connected between a bit line and a complementary bit line and is configured to sense a voltage change of the bit line according to first and second sensing drive signals, senses the LSB by sampling voltages of a first sensing bit line and a first complementary sensing bit line, and latches the LSB to the first sensing bit line, a second sense amplifying circuit, which is selectively connected between the first sensing bit line and the first complementary sensing bit line and is configured to sense a voltage change of a first sensing bit line pair (the first sensing bit line and the first complementary sensing bit line) according to third and fourth sensing drive signals, sense the MSB based on a detected voltage change, and latch the MSB to a second sensing bit line, and an equalizing circuit, which is configured to equalize the first sensing bit line and the first complementary sensing bit line to a pre-charge voltage in response to an equalizing signal, an even equalizing signal, and an odd equalizing signal. The sense amplifier may include a first sense amplifier that samples voltage changes of the first sensing bit line and the first complementary sensing bit line that are connected to a first bit line when the odd equalizing signal is disabled and a second sense amplifier that samples voltage changes of the first sensing bit line and the first complementary bit line that are connected to a second bit line when the even equalizing signal is disabled, The first sense amplifier and the second sense amplifier may be alternately arranged, and the odd equalizing signal and the even equalizing signal may be disabled with a certain time difference.

The large-capacity storage unit 2240 may be implemented as a solid state drive (SDD), a peripheral component interconnect express (PCIe) memory module, a non-volatile memory express (NVMe), etc. Optionally, one or more tiers of the large-capacity storage unit 2240 may include one or more network accessible devices and/or services, e.g., multiple clients, multiple servers, a server farm(s), a server cluster(s), an application server(s), or a message server(s) connected through a NVMe-over Fabricas (NVMe-oF) and/or a remote direct memory access (RDMA). The large-capacity storage unit 2240 refers to a storage medium to which the system 2200 intends to store user data for a long term. The large-capacity storage unit 2240 may store an application program, program data, etc.

While the inventive concept has been particularly shown and described with reference to embodiments thereof, it will be understood that various changes in form and details may be made therein without departing from the spirit and scope of the following claims.

What is claimed is:

1. A sense amplifier, comprising:
   a first sense amplifying circuit electrically coupled to a first bit line, which is electrically coupled to a first memory cell, said first sense amplifying circuit comprising a first pair of sense bit lines and a first equalization circuit configured to equilibrate a voltage on the first pair of sense bit lines in response to an active first equalization signal;
   a second sense amplifying circuit electrically coupled to a second bit line, which is electrically coupled to a second memory cell having a gate terminal electrically coupled by a word line to a gate terminal of the first memory cell, said second sense amplifying circuit comprising a second pair of sense bit lines and a second equalization circuit configured to equilibrate a voltage on the second pair of sense bit lines in response to an active second equalization signal; and a control circuit configured to drive the first equalization signal and the second equalization signal at an active level during an operation to precharge the first pair of sense bit lines and the second pair of sense bit lines, and further configured to: (i) switch the first equalization signal from the active level to an inactive level to thereby commence an operation to sense and amplify a voltage associated with the first bit line while maintaining the second equalization signal at the active level, and then (ii) switch the second equalization signal from the active level to the inactive level to thereby commence an operation to sense and amplify a voltage associated with the second bit line.

2. The sense amplifier of claim 1, wherein commencement of the operation to sense and amplify a voltage associated with the first bit line occurs in-sync with an active-to-inactive transition of the first equalization signal; wherein commencement of the operation to sense and amplify a voltage associated with the second bit line occurs in-sync with an active-to-inactive transition of the second equalization signal that follows, in time, the active-to-inactive transition of the first equalization signal.

3. The sense amplifier of claim 2, wherein at least a portion of a time interval when the second equalization signal is inactive overlaps at least a portion of a time interval when the first equalization signal is inactive.

4. The sense amplifier of claim 3, wherein the first and second bit lines are immediately adjacent bit lines within a memory cell array containing the first and second memory cells.

5. The sense amplifier of claim 1, wherein the first and second bit lines are immediately adjacent bit lines within a memory cell array containing the first and second memory cells; and wherein said control circuit is configured to commence precharging the first and second pairs of sense bit lines in-sync with switching the first and second equalization signals from inactive to active levels at the same time.

6. The sense amplifier of claim 1, wherein the first and second bit lines are immediately adjacent bit lines within a memory cell array containing the first and second memory cells; wherein said control circuit is configured to commence precharging the first and second pairs of sense bit lines during a first time interval in-sync with switching the first and second equalization signals from inactive to active levels at the same time; and wherein said control circuit is configured to terminate precharging the first and second pairs of sense bit lines at different points in time within the first time interval.

7. The sense amplifier of claim 6, wherein said control circuit is further configured to drive the first and second sense amplifying circuits with an equalizing signal, which is switched from an inactive level to an active level in-sync with commencement of the first time interval.

8. The sense amplifier of claim 7, wherein the first and second sense amplifying circuits comprise respective first and second isolation transistors; and wherein said control circuit is configured to electrically couple the first bit line to a first one of the first pair of sense bit lines and electrically couple the second bit line to a first one of the second pair of sense bit lines in-sync with deactivating an isolation signal.

9. A sense amplifier that senses a cell voltage stored in a memory cell as a most significant bit (MSB) and a least significant bit (LSB) of 2-bit data, the sense amplifier comprising:
a first sense amplifying circuit, which is connected between a bit line and a complementary bit line, and is configured to sense a voltage change of the bit line according to first and second sensing drive signals, sense the LSB by sampling voltages of a first sensing bit line and a first complementary sensing bit line, and latch the LSB to the first sensing bit line;
a second sense amplifying circuit, which is selectively connected between the first sensing bit line and the first complementary sensing bit line, and is configured to sense a voltage change of a first sensing bit line pair (the first sensing bit line and the first complementary sensing bit line) according to third and fourth sensing drive signals, sense the MSB based on a detected voltage change, and latch the MSB to a second sensing bit line; and
an equalizing circuit, which is configured to equalize the first sensing bit line and the first complementary sensing bit line to a pre-charge voltage in response to an equalizing signal, an even equalizing signal, and an odd equalizing signal,
wherein the sense amplifier comprises: a first sense amplifier that samples voltage changes of the first sensing bit line and the first complementary sensing bit line that are connected to a first bit line when the odd equalizing signal is disabled; and a second sense amplifier that samples voltage changes of the first sensing bit line and the first complementary bit line that are connected to a second bit line when the even equalizing signal is disabled,
the first sense amplifier and the second sense amplifier are alternately arranged, and
the odd equalizing signal and the even equalizing signal are disabled with a certain time difference.

10. The sense amplifier of claim 9, wherein the equalizing circuit connected to the first sense amplifier comprises:
a first equalizing transistor comprising a first end connected to a line of the pre-charge voltage, a second end connected to the first complementary sensing bit line, and a gate connected to the equalizing signal;
a second equalizing transistor comprising a first end connected to the first sensing bit line, a second end which is floating, and a gate connected to the even equalizing signal; and
a third equalizing transistor comprising a first end connected to the first sensing bit line, a second end connected to the first complementary sensing bit line, and a gate connected to the odd equalizing signal.

11. The sense amplifier of claim 9, wherein the equalizing circuit connected to the second sense amplifier comprises:
a first equalizing transistor comprising a first end connected to a line of the pre-charge voltage, a second end connected to the first complementary sensing bit line, and a gate connected to the equalizing signal;
a first equalizing transistor comprising a first end connected to the first sensing bit line, a second end connected to the first complementary sensing bit line, and a gate connected to the even equalizing signal; and
a third equalizing transistor comprising a first end connected to the first sensing bit line, a second end which is floating, and a gate connected to the odd equalizing signal.

12. The sense amplifier of claim 9, further comprising
a switching circuit configured to selectively connect bit lines of the first sensing bit line pair and bit lines of a second sensing bit line pair,
wherein the switching circuit comprises:
a first switch configured to selectively connect between the bit line to which the memory cell is connected and the first complementary sensing bit line;

a second switch configured to selectively connect between the complementary bit line and the first sensing bit line;

a third switch configured to selectively connect between the bit line and the first sensing bit line;

a fourth switch configured to selectively connect between the complementary bit line and the first complementary sensing bit line;

a fifth switch configured to selectively connect between the first complementary sensing bit line and a second complementary sensing bit line; and a sixth switch configured to selectively connect between the first sensing bit line and the second sensing bit line.

13. The sense amplifier of claim 12, wherein the first sense amplifying circuit comprises:

a first PMOS transistor connected between a line of a first sensing drive signal and the first complementary sensing bit line and comprising a gate connected to the first sensing bit line;

a second PMOS transistor connected between the line of the first sensing drive signal and the first sensing bit line and comprising a gate connected to the first complementary sensing bit line;

a first NMOS transistor connected between a line of a second sensing drive signal and the first complementary sensing bit line and comprising a gate connected to the bit line; and a second NMOS transistor connected between the line of the second sensing drive signal and the first sensing bit line and comprising a gate connected to the complementary bit line, and wherein the first sense amplifying circuit is turned on when a power voltage is applied to the first sensing drive signal and a ground voltage is applied to the second sensing drive signal and is turned off when the pre-charge voltage corresponding to half of a level of the power voltage is applied to the first and second sensing drive signals.

14. The sense amplifier of claim 13, wherein the switching circuit further comprises first power switches configured to selectively connect the first NMOS transistor and the second NMOS transistor to the line of the second sensing drive signal.

15. The sense amplifier of claim 13, wherein the second sense amplifying circuit comprises:

a third PMOS transistor connected between a line of a third sensing drive signal and the second complementary sensing bit line and comprising a gate connected to the second sensing bit line;

a fourth PMOS transistor connected between the line of the third sensing drive signal and the second sensing bit line and comprising a gate connected to the second complementary sensing bit line;

a third PMOS transistor connected between a line of a fourth sensing drive signal and the second complementary sensing bit line and comprising a gate connected to the second sensing bit line; and a fourth PMOS transistor connected between the line of the fourth sensing drive signal and the second sensing bit line and comprising a gate connected to the second complementary sensing bit line, and wherein the second sense amplifying circuit is turned on when a power voltage is applied to the third sensing drive signal and a ground voltage is applied to the fourth sensing drive signal, and is turned off when the pre-charge voltage is applied to the third and fourth sensing drive signals.

16. A memory device comprising:

a first sense amplifier, which is connected to a first bit line and is configured to sense a voltage of the first bit line and output the voltage to a first sensing bit line when an odd equalizing signal is disabled;

a second sense amplifier, which is connected to a second bit line arranged adjacent to the first bit line and is configured to sense a voltage of the second bit line and output the voltage to a second sensing bit line when an even equalizing signal is disabled;

a first equalizing circuit comprising a first transistor and a second transistor connected to the first sense amplifier, wherein the first transistor comprises a first active pattern and first gate pattern connected to a conductive line of the odd equalizing signal and comprises, in a source region of the first transistor of the first active pattern, a first contact pattern connected to a conductive line of the first sensing bit line and, in a drain region of the first transistor, a second contact pattern connected to a conductive line of a first complementary sensing bit line; and a second equalizing circuit comprising a third transistor and a fourth transistor which are connected to the second sense amplifier, wherein the fourth transistor comprises a second active pattern and a second gate pattern connected to a conductive line of the even equalizing signal and comprises, in a source region of the fourth transistor of the second active pattern, a third contact pattern connected to a conductive line of the second sensing bit line and, in a drain region of the fourth transistor, a fourth contact pattern connected to a conductive line of a second complementary sensing bit line.

17. The memory device of claim 16, wherein the second transistor of the first equalizing circuit shares the second active pattern, comprises, in a source region of the second transistor of the second active pattern, a contact pattern connected to the conductive line of the first sensing bit line, and comprises no contact pattern in a drain region of the second transistor.

18. The memory device of claim 16, wherein the third transistor of the second equalizing circuit shares the first active pattern, comprises, in a source region of the third transistor of the first active pattern, a contact pattern connected to the conductive line of the second sensing bit line, and comprises no contact pattern in a drain region of the third transistor.

19. The memory device of claim 16, wherein each of the first sense amplifier and the second sense amplifier comprises:

a first offset cancelation transistor configured to share the first active pattern and connect between the first bit line and the first complementary sensing bit line and between the second bit line and the second complementary sensing bit line in response to an offset cancelation signal;

a first isolation transistor configured to share the first active pattern and connect between the first bit line and the first sensing bit line and between the second bit line and the second sensing bit line in response to an isolation signal;

a second offset cancelation transistor configured to share the second active pattern and connect between the first complementary bit line and the first sensing bit line and between the second complementary bit line and the second sensing bit line in response to the offset cancelation signal; and a second isolation transistor configured to share the second active pattern and connect between the first complementary bit line and the first complementary sensing bit line and between the second complementary bit line and the second complementary sensing bit line in response to the isolation signal.

20. The memory device of claim 19, wherein the first equalizing circuit and the second equalizing circuit further comprise an equalizing transistor configured to share the second active pattern and connect between a line of a pre-charge voltage and the first complementary sensing bit line and the second complementary sensing bit line in response to an equalizing signal, respectively.

* * * * *